(12) United States Patent
Nara et al.

(10) Patent No.: US 6,388,747 B2
(45) Date of Patent: May 14, 2002

(54) INSPECTION METHOD, APPARATUS AND SYSTEM FOR CIRCUIT PATTERN

(75) Inventors: Yasuhiko Nara, Hitachinaka; Kazuhisa Machida, Kawasaki; Mari Nozoe, Hino; Hiroshi Morioka, Higashimurayama; Yasutsugu Usami, Hitachinaka; Takashi Hiroi, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/832,222

(22) Filed: Apr. 11, 2001

Related U.S. Application Data

(62) Division of application No. 09/450,856, filed on Nov. 29, 1999.

(30) Foreign Application Priority Data

| Nov. 30, 1998 | (JP) | 10-340292 |
| Nov. 30, 1998 | (JP) | 10-340293 |
| Nov. 30, 1998 | (JP) | 10-340294 |
| Nov. 30, 1998 | (JP) | 10-340295 |
| Nov. 30, 1998 | (JP) | 10-340296 |
| Nov. 30, 1998 | (JP) | 10-340297 |
| Dec. 24, 1998 | (JP) | 10-367710 |

(51) Int. Cl.$^7$ .................................................. G01B 11/00
(52) U.S. Cl. ...................................................... 356/394
(58) Field of Search ............................ 356/394, 237.1, 356/237.5; 250/561, 571, 548

(56) References Cited

U.S. PATENT DOCUMENTS

| 4,805,089 A | 2/1989 | Lane et al. ................. 364/188 |
| 4,843,538 A | 6/1989 | Lane et al. ................. 364/188 |
| 5,018,082 A | 5/1991 | Obata et al. ................ 364/521 |

(List continued on next page.)

FOREIGN PATENT DOCUMENTS

| JP | 61-290641 | 12/1986 |
| JP | 63-32604 | 2/1988 |
| JP | 64-84555 | 3/1989 |
| JP | 2-148272 | 6/1990 |
| JP | 3-167456 | 7/1991 |

(List continued on next page.)

OTHER PUBLICATIONS

"Monthly Semiconductor World" Aug. 1995, pp. 96–99.
"Journal of Vacuum Science Technology B", vol. 9, No. 6, 1991, pp. 3005–3009.
"Journal of Vacuum Science Technology B", vol. 10, No. 6, 1992, pp. 2804–2808.

*Primary Examiner*—Frank G. Font
*Assistant Examiner*—Michael P. Stafira
(74) *Attorney, Agent, or Firm*—Kenyon & Kenyon

(57) ABSTRACT

Inspection method, apparatus, and system for a circuit pattern, in which when various conditions which are necessary in case of inspecting a fine circuit pattern by using an image formed by irradiating white light, a laser beam, or a charged particle beam are set, its operating efficiency can be improved. An inspection target region of an inspection-subject substrate is displayed, and a designated map picture plane and an image of an optical microscope or an electron beam microscope of a designated region are displayed in parallel, thereby enabling a defect distribution and a defect image to be simultaneously seen. Item names of inspecting conditions and a picture plane to display, input, or instruct the contents of the inspecting conditions are integrated, those contents are overlapped to the picture plane and layer-displayed, and all of the item names are displayed in parallel in a tab format in the upper portion of the picture plane of the contents. When a desired item name is clicked, the picture plane is switched and the contents corresponding to the clicked item name are displayed.

2 Claims, 35 Drawing Sheets

U.S. PATENT DOCUMENTS

| | | | |
|---|---|---|---|
| 5,085,517 A | 2/1992 | Chadwick et al. | 356/394 |
| 5,502,306 A | 3/1996 | Meisburger et al. | 250/310 |
| 5,578,821 A | 11/1996 | Meisberger et al. | 350/310 |
| 5,801,965 A * | 9/1998 | Takagi et al. | 364/552 |
| 5,841,893 A | 11/1998 | Ishikawa et al. | 382/145 |
| 5,862,055 A | 1/1999 | Chen et al. | 364/468.28 |
| 5,963,314 A * | 10/1999 | Worster et al. | 356/237.2 |

FOREIGN PATENT DOCUMENTS

| | | |
|---|---|---|
| JP | 4-253352 | 9/1992 |
| JP | 5-258703 | 10/1993 |
| JP | 7-282764 | 10/1995 |
| JP | 10-189668 | 7/1998 |
| JP | 10-302702 | 11/1998 |
| JP | 10-302704 | 11/1998 |

* cited by examiner

FIG.15

| IRRADIATING CONDITIONS | |
|---|---|
| ELECTRON BEAM IRRADIATING CONDITIONS | |
| ACCELERATION VOLTAGE | ▽ V — 93 |
| BEAM CURRENT | ▽ nA |
| OBTAIN SIGNAL | |
| THE NUMBER OF SIGNAL ADDING TIMES | ▽ ▢ — 94 |
| PIXEL SIZE | ▽ μm |
| SET | CANCEL |

92

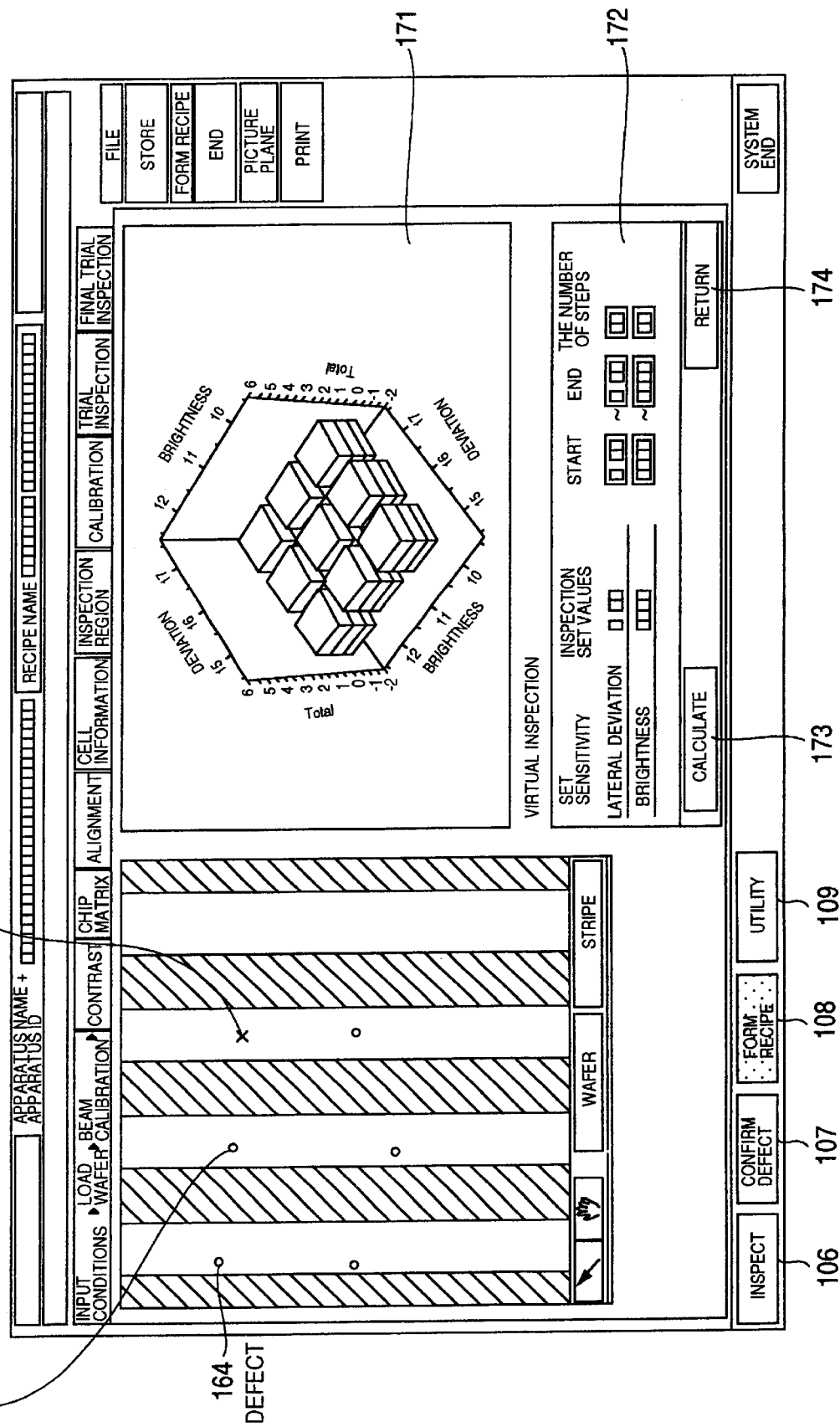

SCAN ALL
STRIPES

SCAN EVERY
OTHER STRIPE

SCAN EVERY
FOURTH STRIPE

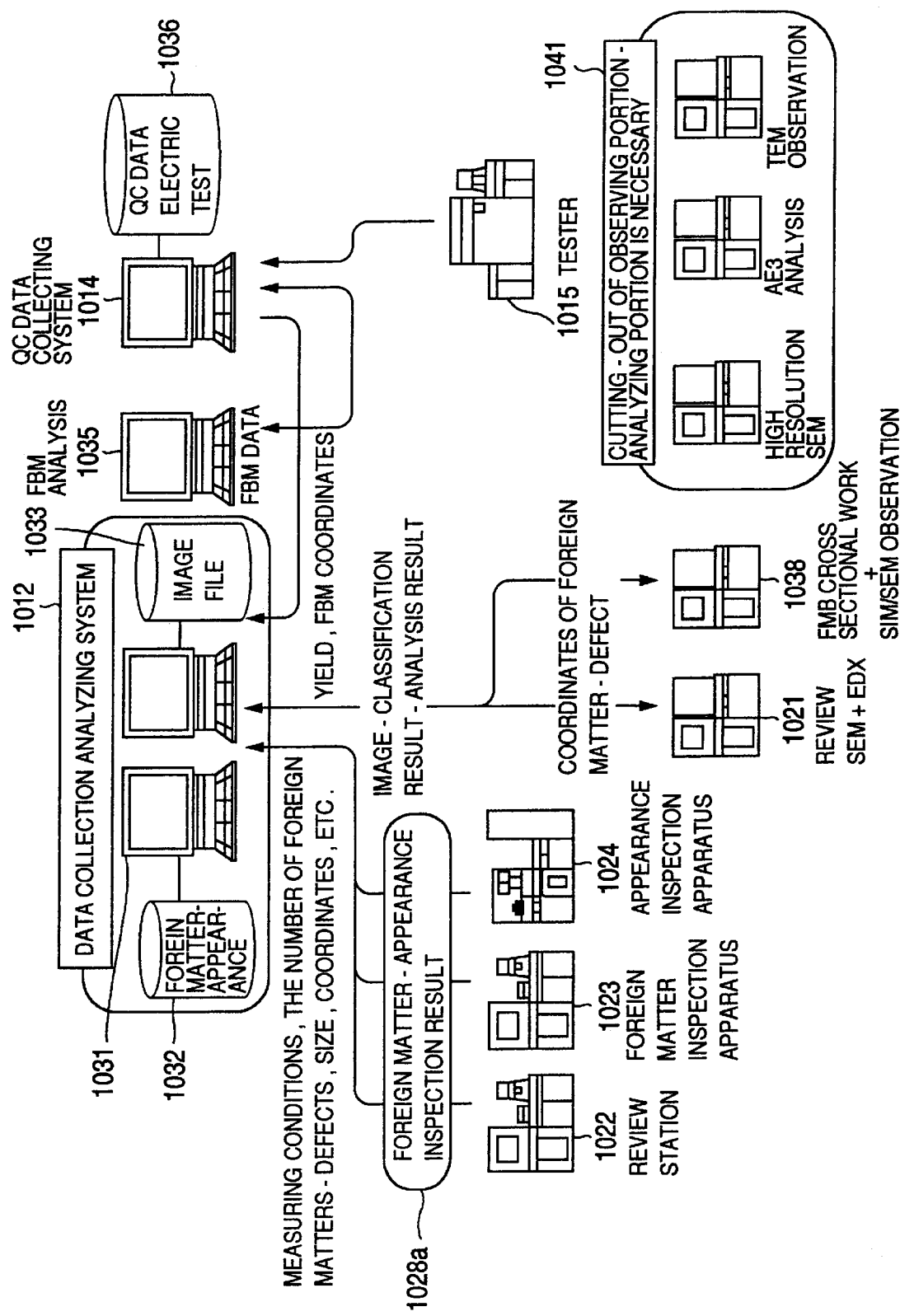

INSPECTION METHOD, APPARATUS AND SYSTEM FOR CIRCUIT PATTERN

This application is a division of U.S. patent application Ser. No. 09/450,856 filed Nov. 29, 1999 still pending, which is incorporated herein by reference in its entirety.

CROSS-REFERENCE TO RELATED APPLICATIONS

This application relates to:
(1) U.S. application Ser. No. 09/258,461, filed Feb. 26, 1999, titled "Convergent Charged Particle Beam Apparatus and Inspection Method Using Same",
(2) U.S. application Ser. No. 09/131,383, filed Aug. 7, 1997, titled "Method and Apparatus of an Inspection System Using an Electron Beam", and
(3) U.S. application Ser. No. 08/811,511, filed Mar. 4, 1997, titled "Method and Apparatus for Inspection Integrated Circuit Pattern".

The disclosures of the above applications are hereby incorporated by reference.

BACKGROUND OF THE INVENTION

The invention relates to inspection method, apparatus, and system for a fine circuit pattern of a semiconductor device, a photomask, a reticle, a liquid crystal, or the like.

An inspection of a semiconductor wafer will now be described as an example.

A semiconductor device is formed by repeating a step of transferring a circuit pattern formed on a photomask to a semiconductor wafer by a lithographing process and an etching process. A state of the process, the presence or absence of generation of a foreign matter (particles), and the like in the manufacturing step of the semiconductor device largely exercise an influence on a manufacturing yield of the semiconductor device. To detect them early or preparatorily, a method of inspecting the circuit pattern of the semiconductor wafer in the manufacturing step of the semiconductor device has conventionally been used.

As an apparatus for inspecting a defect existing in the circuit pattern of the semiconductor wafer, a defect inspection apparatus of a wafer with a pattern such that white light is irradiated to a semiconductor wafer and a plurality of circuit patterns of the same kind are compared by using an optical image has been put into practical use. The outline of the inspection method has been disclosed in "Monthly Semiconductor World", Vol. August issue, pp. 96–99, 1995. According to the inspection method using the optical image, as disclosed in JP-A-3-167456, there has been disclosed a system such that an optically irradiated region on a wafer substrate is formed as an image by a time delay integrating sensor and characteristics of the image are compared with design characteristics which have previously been inputted, thereby detecting a defect. On the other hand, since the detection of a defect by the optical image is becoming difficult in association with the reduction in size of a circuit pattern, complication of a shape, and variation of material, a method of inspecting a circuit pattern by using an electron beam image whose resolution is higher than that of the optical image has been proposed.

A scanning electron microscopy (hereinafter, abbreviated to SEM) has been known as an apparatus for irradiating an electron beam to a sample and observing it. To obtain a practical inspection time in case of inspecting a circuit pattern formed on a semiconductor wafer by an electron beam image, it is necessary to obtain an image at a speed that is much higher than that of the SEM. It is also necessary to simultaneously assure a resolution of the image obtained at a high speed and an S/N ratio of the image.

As an inspection apparatus for a circuit pattern using an electron beam, a method whereby an electron beam having an electron beam current that is 100 or more times (10 nA or more) as large as that of the ordinary SEM is irradiated to an electrically conductive substrate such as an X-ray mask or the like, any of secondary electrons, reflected electrons, and transmitted electrons which are generated are detected, and images formed from resultant signals are compared and inspected, thereby automatically detecting a defect has been disclosed in "Journal of Vacuum Science Technology B" (J. Vac. Sci. Tech. B), Vol. 9, No. 6, pp. 3005–3009, (1991), "J. Vac. Sci. Tech. B", Vol. 10, No. 6, pp. 2804–2808, (1992), JP-A-5-258703, and U.S. Pat. No. 5,502,306. According to such a method, the inspection of a fine circuit pattern is executed by the automatic wafer appearance inspection of an electron beam scanning system whose defect detecting performance is superior to that of the optical appearance inspection, and various kinds of defects occurring in a circuit pattern forming step can be detected.

In the above defect inspection, although the images of the adjacent similar circuit patterns are formed and compared to thereby automatically detect a defect, in the inspection, it is necessary to cope with wafers of various pattern layouts or patterns of various materials. To accurately compare the adjacent patterns, it is necessary to previously obtain a layout of the pattern, namely, a layout of a chip (or die) or shot on the wafer and register it as an inspecting condition of the wafer to be inspected (hereinafter, referred to as an inspection-subject wafer). To form an image suitable for inspection in various materials, it is necessary to set brightness of the image and a contrast of the pattern or a background to proper values and register them as inspecting conditions of the inspection-subject wafer. In the above conventional apparatus, however, there is no disclosure about a procedure for setting the inspecting conditions and an operating method, and it takes one to several hours to fully set the proper inspecting conditions with respect to a wafer whose operation is complicated and which newly becomes a target of inspection. In a semiconductor manufacturing line, since a pattern inspection is executed with regard to a plurality of products (namely, a plurality of circuit pattern layouts) and a plurality of steps (namely, a plurality of materials and a plurality of detailed circuit pattern shapes), it is necessary to set a large number of inspecting conditions, so that there is a problem that it takes an extremely long time for various operations in the inspection, particularly, for the inspecting condition setting operations.

To solve the above problem, as a technique such that a data process and parameter setting can be executed in parallel simultaneously with the inspecting operation, a method of transmitting and receiving signals between an operating portion and a mechanism portion for setting data processing parameters simultaneously with the inspection and a mechanism portion has been disclosed in JP-A-63-32604. According to such a method, however, although there is a disclosure about the signal transmission and reception, there is not a disclosure regarding the operability and a data structure for parameters with respect to a complicated inspection apparatus in which the number of input parameters is large.

In various inspections of the system for obtaining an image of a circuit pattern of a substrate and comparing it with an adjacent similar pattern, it is necessary that a layout of the circuit pattern formed on the wafer substrate, namely, a layout of a shot, a layout of a chip (or die) in it, and further, a layout of memory cells, peripheral circuits, logic circuits, test patterns, or the like in it are preliminarily set as inspecting conditions. It is, further, necessary to set conditions of the irradiation light, detecting conditions, image comparing conditions, defect discriminating conditions, and the like in accordance with a detailed shape and a material of the pattern of an inspection-subject wafer. Each time processing conditions of a semiconductor device are changed, it is also necessary to properly change those conditions.

There are the following problems in such a case. For example, when many parameters are sequentially inputted and set, although an operating picture plane is sequentially switched in accordance with the input, the operator cannot know the switching order and items which are switched. Therefore, even with respect to the items which do not need to be inputted, the picture plane is shifted to the next picture plane after they are once displayed on the picture plane and confirmed, so that an efficiency is low.

There are also problems such that when the data which has already been inputted is confirmed again or inputted, the present picture plane cannot be returned to the previous picture plane or, since the present input stage is obscure, the layer of the picture plane to be returned is unknown, so that the present picture plane cannot be returned to the previous picture plane unless many operations are performed, and the like.

In still another conventional apparatus, although a plurality of parameter input picture planes can be displayed on a workstation for operation by a window format, since a plurality of windows are overlapped and displayed even in such a system, the operator cannot see the information of the picture plane hidden behind the present picture plane, and it is difficult to perform the selecting operation on the picture plane.

Due to the above problems, since it is necessary to form such a large number of input items every kind and step as mentioned above, even if a speed of the inspection itself is high, an efficiency for preparation is low and it takes a long time. It is, therefore, difficult to apply the inspection to a new product and a new step at an early stage.

When the inspecting conditions are set, since they have to be set by using the inspection apparatus, the inspection time consequently becomes short and the throughput deteriorates.

Even if the inspecting speed is raised, if the subsequent confirmation by the eyes is performed by the same inspection apparatus, a time which can be taken for inspection decreases and, if the operator intends to visually confirm in an apparatus for confirmation by the eyes, it is troublesome to convey the substrate and a method of exchanging data between the apparatuses is complicated, so that there is a problem of deterioration of the throughput.

SUMMARY OF THE INVENTION

It is the first object of the invention to provide inspection method, apparatus, and system for a circuit pattern, in which in the case where a defect such as abnormality of a pattern which is generated in a fine circuit pattern, remainder or deposition of a foreign matter, or the like is inspected by using an image formed by irradiating white light, a laser beam, or a charged particle beam, when various conditions necessary for the inspection are set, its operating efficiency can be improved.

The second object of the invention is to provide inspection method, apparatus, and system for a circuit pattern having an operating picture plane display method or an operating picture plane layout for improving the operability at the time of setting of the inspecting conditions.

The third object of the invention is to provide inspection method, apparatus, and system for a circuit pattern, in which an inspection time can be reduced and a manufacturing yield can be improved owing to an early investigation of causes of a failure of a semiconductor device.

To accomplish the above objects, the present invention has the following constructions.

First, according to the invention, an inspection target region of an inspection-subject substrate is displayed and a map picture plane which is designated and an image of an optical microscope or an electron beam microscope of a designated region are displayed in parallel, thereby enabling a defect distribution and a defective image to be simultaneously seen.

Second, according to the invention, inspecting condition item names and a picture plane to display, input, or instruct the contents of the inspecting conditions are integrated, the contents are overlapped to the picture plane and layer-displayed, all item names are arranged and displayed in the upper region of the picture plane of the contents by a tab format, and when a desired item name is clicked, the picture plane is switched and the contents corresponding to the item name are displayed on the switched new picture plane.

Third, according to the invention, tabs showing the item names are sequentially arranged in order of operations, and the tab corresponding to the picture plane which is at present being operated is displayed by a color or a display style which is different from that of the other tabs. Thus, a procedure of the ordinary operations is displayed as a layout and the tab on the picture plane in which parameters are at present being inputted is displayed in a manner different from the tab on each of the other picture planes, thereby enabling the operator to recognize at which stage in the whole operation the present operation is.

Fourth, according to the invention, the apparatus has a monitor for sequentially or arbitrarily displaying: a recipe set picture plane to set inspecting conditions; a trial inspection picture plane for obtaining an image by irradiating the light, laser beam, or charged particle beam to a part of a region on the inspection-subject substrate on the basis of the recipe before the actual inspection and confirming the recipe; and an inspecting picture plane for executing the actual inspection of a predetermined region on the inspection-subject substrate and displaying a resultant image.

Fifth, according to the invention, the apparatus has a picture plane which can be set so as to irradiate the light, laser beam, or charged particle beam only to a necessary region without irradiating it to the whole surface of the inspection-subject substrate.

Sixth, according to the invention, an image from an external apparatus can be displayed on the monitor of the inspection apparatus for extracting a defect of the inspection-subject substrate.

Seventh, according to the invention, among the manufacturing steps of the circuit pattern of the inspection-subject substrate, the defect is classified on the basis of a defect increase ratio due to a defect extracting inspection in a halfway step, a yield ratio due to an electric conduction inspection after the final step, and a history of a processing apparatus of each manufacturing step.

Eighth, according to the invention, an inspection apparatus for extracting the defect of the inspection-subject substrate and an observing apparatus for observing the defect are connected, thereby allowing coordinates on the substrate to be made common or have a compatibility.

BRIEF DESCRIPTION OF THE DRAWINGS

FIG. 15 is a diagram of a part of the picture plane in the recipe forming mode;

FIG. 23 is a diagram showing a graph display image of a defect;

FIG. 37 is a constructional diagram of the inspection system.

DETAILED DESCRIPTION OF THE EMBODIMENTS

Embodiments of the invention will now be described hereinbelow with reference to the drawings.

The first embodiment of the invention will be first described hereinbelow with respect to an example of a circuit pattern inspection apparatus in which images obtained by irradiating a charged particle beam, particularly, an electron beam to adjacent circuit patterns on a semiconductor wafer are compared to thereby detect the presence or absence of a defect of the circuit pattern.

A "cell region" which will be used hereinbelow denotes one unit of a region serving as a target of an inspection and changes in accordance with an inspecting request of the user within a range from a case where it denotes each chip on the wafer to a case where it denotes a specific processing region in the chip. In the invention, an individual region as well as an inspection requesting region of the user is generally called a cell region.

Figure 2:
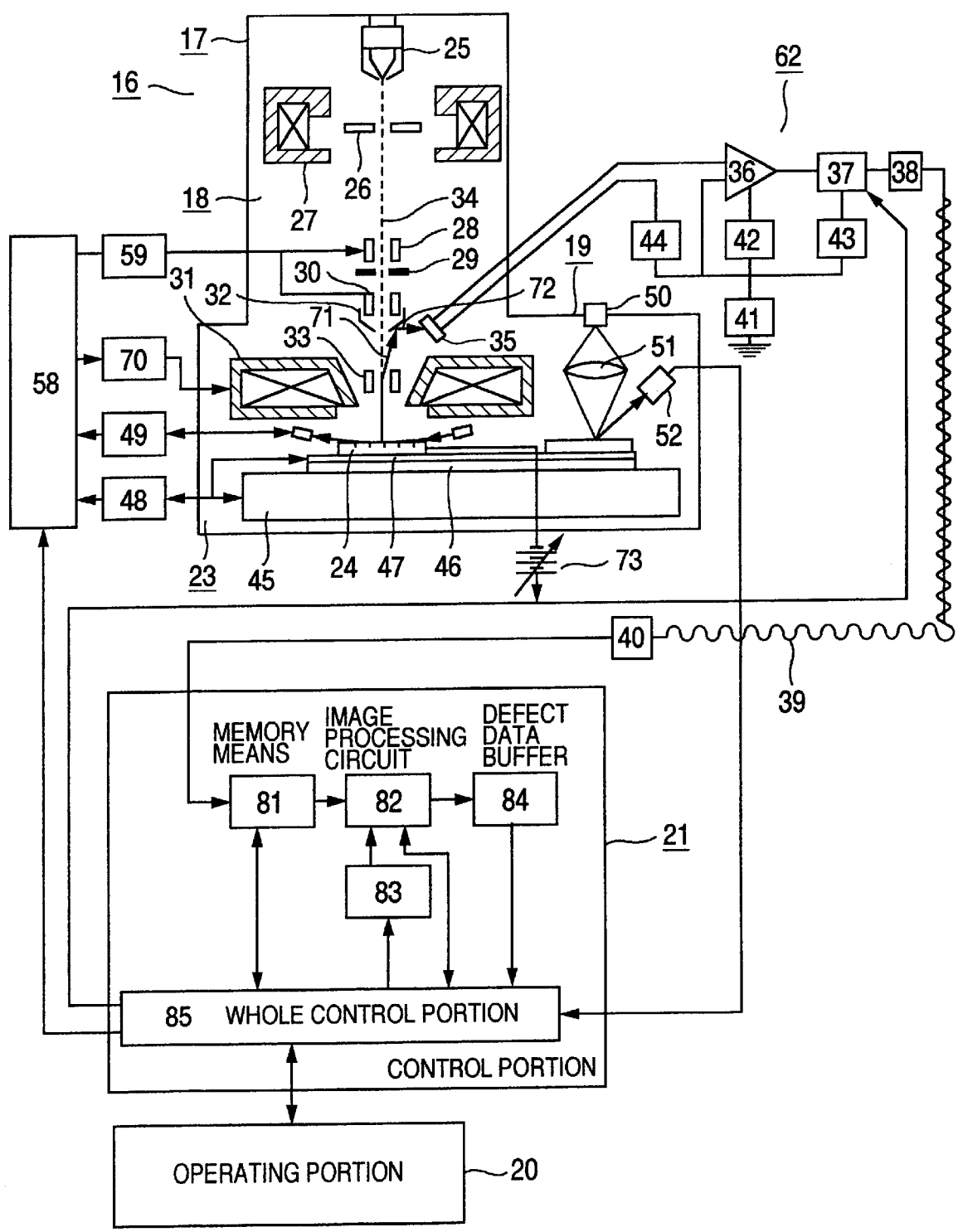
FIG. 2 is a vertical sectional view of a circuit pattern inspection apparatus.

A construction of the circuit pattern inspection apparatus in the embodiment is shown in FIG. 2. FIG. 2 is a vertical sectional view of the circuit pattern inspection apparatus, and a control portion and an operating portion are further added as functional block diagrams.

A circuit pattern inspection apparatus 16 has an inspection chamber 17 in which the internal air is vacuum evacuated and a spare chamber (not shown in the embodiment) to convey an inspection-subject substrate (substrate to be inspected) 24 as a sample into the inspection chamber 17. The spare chamber is constructed so that a vacuum evacuation can be performed independently of the inspection chamber 17. The circuit pattern inspection apparatus 16 comprises a control portion 21 and an operating portion 20 besides the inspection chamber 17 and the spare chamber.

The inspection chamber 17 is mainly constructed by an electronic optical system 18, a secondary electron detector 35, a sample chamber 23, and an optical microscope 19. The electronic optical system 18 comprises: an electron gun 25; an electron beam extracting electrode 26; a condenser lens 27; a blanking deflector 28; a scanning deflector 30; an aperture 29; an objective lens 31; a reflection plate 32; and an E-cross-B deflector (E B deflector) 33.

The sample chamber 23 comprises: a sample stage 45; an X stage 46 and a Y stage 47 serving as stages; a position monitor length measuring device 48; and a height measuring device 49 of the inspection-subject substrate. The optical microscope 19 is equipped at a position that is close to the electronic optical system 18 in the inspection chamber 17 but away from the system 18 by a distance such that it does not mutually exercise an influence. A distance between the electronic optical system 18 and optical microscope 19 has already been known. The X stage 46 or Y stage 47 reciprocates at the known distance between the electronic optical system 18 and optical microscope 19. The optical microscope 19 is constructed by a white light source 50, an optical lens 51, and a CCD camera 52. The white light source 50, CCD camera 52, and the like can be installed outside of the inspection chamber 17 which was vacuum evacuated.

An electron beam 34 is extracted from the electron gun 25 by applying a voltage to a space between the electron gun 25 and electron beam extracting electrode 26. The electron beam 34 is accelerated by applying a negative electric potential of a high voltage to the electron gun 25. Thus, the electron beam 34 progresses in the direction of the sample stage 45 so as to have an energy corresponding to the applied electric potential, is converged by the condenser lens 27, further finely converged by the objective lens 31, and is irradiated onto the inspection-subject substrate 24 put on the X stage 46 and Y stage 47 on the sample stage 45. The inspection-subject substrate 24 is a substrate having a fine circuit pattern such as semiconductor wafer, chip, liquid crystal, mask, or the like.

A signal generator 59 for generating a scanning signal and a blanking signal is connected to the blanking deflector 28. A lens power source 70 is connected to each of the condenser lens 27 and objective lens 31. A negative voltage can be applied to the inspection-subject substrate 24 by a high voltage power source 73. By adjusting the voltage of the high voltage power source 73, a primary electron beam is decelerated and an electron beam irradiation energy to the inspection-subject substrate 24 can be adjusted to an optimum value without changing the electric potential of the electron gun 25.

Secondary electrons 71 generated by irradiating the electron beam 34 onto the inspection-subject substrate 24 is accelerated by the negative voltage applied to the inspection-subject substrate 24. The E-cross-B deflector 33 is arranged above the inspection-subject substrate 24. The secondary electrons 71 accelerated by the deflector 33 are deflected in a predetermined direction. A description of the principle of the E-cross-B deflector 33 is omitted here because it has been disclosed in JP-A-60-47358 or JP-A-60-212953 (U.S. Pat. No. 4,658,136). A deflection amount of the secondary electrons 71 can be adjusted by intensities of an electric field and a magnetic field which are applied to the E-cross-B deflector 33. The electric field and the magnetic field can be varied in an interlocking relational manner with the negative voltage applied to the inspection-subject substrate 24.

The secondary electrons 71 deflected by the E-cross-B deflector 33 collide with the reflection plate 32 under a predetermined condition. When the secondary electrons 71 collide with the reflection plate 32, second secondary electrons 72 having an energy of a few eV to 50 eV are generated from the reflection plate 32.

A detecting portion of the secondary electrons is constructed in a manner such that the secondary electron detector 35 is arranged over the objective lens 31 in the vacuum evacuated inspection chamber 17 and that a preamplifier 36, an A/D converter 37, light converting means 38, light transmitting means 39, electric converting means 40, a high voltage power source 41, a preamplifier drive power source 42, an A/D converter drive power source 43, and a reverse bias power source 44 are arranged outside of the inspection chamber 17. The secondary electron detector 35, preamplifier 36, A/D converter 37, light converting means 38, preamplifier drive power source 42, and A/D converter drive power source 43 are floated to a positive electric potential by the high voltage power source 41.

The second secondary electrons 72 are led to the secondary electron detector 35 by a suction electric field which is generated because the secondary electron detector 35 is floated to the positive electric potential. The secondary electron detector 35 detects the second secondary electrons synchronously with the timing when the electron beam 34 scans the inspection-subject substrate 24. An output signal of the secondary electron detector 35 is amplified by the preamplifier 36 arranged outside of the inspection chamber 17 and converted to digital data by the A/D converter 37. After an analog signal detected by the secondary electron detector 35 was amplified by the preamplifier 36, the A/D converter 37 immediately converts it to a digital signal and transmits it to the operating portion 20 via the control portion 21. Since the detected analog signal is digitized and transmitted just after the detection, a signal of a higher speed and a higher S/N ratio (signal-to-noise ratio) than those of the conventional apparatus can be obtained.

The inspection-subject substrate 24 is put on the X stage 46 and Y stage 47. When an inspection is executed, either a two-dimensional scanning method or a one-dimensional scanning method is selected. That is, in the 2-dimensional scanning method, the X stage 46 and Y stage 47 are held at rest and the electron beam 34 is repetitively scanned in the X direction to thereby deflect them in the Y direction or it is repetitively scanned in the Y direction to thereby deflect them in the X direction. In the 1-dimensional scanning method, while the Y stage 47 is continuously moved at a predetermined speed in the Y direction, the electron beam 34 is repetitively scanned in the X direction, or while the X stage 46 is continuously moved at a predetermined speed in the X direction, the electron beam 34 is repetitively scanned in the Y direction. In case of inspecting a specific relatively small region, it can be more efficiently inspected by the former method. In case of inspecting a relatively wide region, it can be more efficiently inspected by the latter method. The electron beam 34 is deflected by the blanking deflector 28 and controlled so as not to pass through the aperture 29.

An operating command and operating conditions of each portion of the apparatus are inputted and outputted to/from the control portion 21. A plurality of conditions such as acceleration voltage at the time of generation of the electron beam, deflection width of the electron beam, deflecting speed, signal fetching timing of the secondary electron detecting apparatus, sample stage moving speed, and the like are previously selected and inputted into the control portion 21 in accordance with the object. A correction control circuit 58 monitors deviations of the positions and heights of the inspection-subject substrate 24 and electron beam 34 from detection signals of the position monitor length measuring device 48 and inspection-subject substrate height measuring device 49. The control portion 21 forms a correction signal from a result of the monitoring and sends the correction signal to the lens power source 70 and the scanning deflector 30 so that the electron beam 34 is always irradiated to the correct position.

The control portion 21 comprises: memory means 81 for storing the signal obtained by converting the analog signal from the secondary electron detector 35 into the digital signal; an image processing circuit 82 for digitally processing the digital signal stored in the memory means 81; an inspecting condition setting portion 83 to set processing parameters as inspecting conditions of the image processing circuit 82; a defect data buffer 84 to hold defect information as a processing result of the image processing circuit 82; and a whole control portion 85 to control the whole apparatus. The image processing circuit 82 stores images and compares the two images, thereby extracting a defect.

The electron beam 34 which was finely converged is irradiated onto the inspection-subject substrate 24, thereby generating the secondary electrons 71. The secondary electrons 71 or the second secondary electrons 72 are detected synchronously with the scan of the electron beam 34 and the movement of the X stage 46 and Y stage 47, so that an image of the inspection-subject substrate 24 is obtained. In the circuit pattern inspection apparatus of the embodiment, the inspection-subject substrate 24 is scanned only once by the electron beam 34 of a large current which is about 100 or more times as large as that of the ordinary SEM, for example, 100 nA, so that the image is formed. Thus, the high speed image fetching can be realized. For observation of a defect, the current of the electron beam 34, the acceleration voltage, and the number of scanning times can be changed.

A thermal field emission electron source of a diffusion supply type is used for the electron gun 25. By using the electron gun 25, the current of the electron beam that is more stable than that of conventional electron source such as tungsten filament electron source or cold field emission electron source can be assured. Thus, an image of the electron beam in which a brightness fluctuation is small is obtained and the current of the electron beam can be set to a large value. To set the electron beam current to a large value, a Schottky type electron source can be used for an electron gun. By using such an electron gun, the high speed inspection which can obtain an electron beam image of a high S/N ratio (signal-to-noise ratio) by the one scan can be realized.

In the embodiment, a length measuring device using a laser interference is used as a position monitor length measuring device 48. Thus, the positions of the X stage 46 and Y stage 47 can be monitored at real-time and obtained position information is transmitted to the control portion 21. On the basis of the information, the control portion 21 can accurately grasp the region or position where the electron beam 34 is irradiated. A positional deviation of the irradiating position of the electron beam 34 can be corrected as necessary by the correction control circuit 58 at real-time. When there are a plurality of inspection-subject substrates 24, regions to which the electron beam 34 was irradiated can be individually stored.

An optical measuring device, for example, a laser interference measuring device or a reflected light type measuring device for measuring a change in height by monitoring the position of the reflected light is used as a height measuring device 49 of the inspection-subject substrate. The height of inspection-subject substrate 24 put on the X stage 46 and Y stage 47 can be measured at real-time. In the embodiment, the reflected light type measuring device is used, the elongated white light which passed through a slit is irradiated onto the inspection-subject substrate 24 via a transparent window, a position of the reflected light is detected by a position detector, and a change amount of the height is calculated from a fluctuation of the position.

According to the present apparatus, a focal distance of the objective lens 31 to finely converge the electron beam 34 is dynamically corrected on the basis of measurement data of the height measuring device 49 of the inspection-subject substrate, and the electron beam 34 whose focal point is always matched to the inspection region can be irradiated. A warp and a height distortion of the inspection-subject substrate 24 are preliminarily measured before the irradiation of the electron beam and correcting conditions of every inspection region of the objective lens 31 are set on the basis of measurement data.

Figure 3:
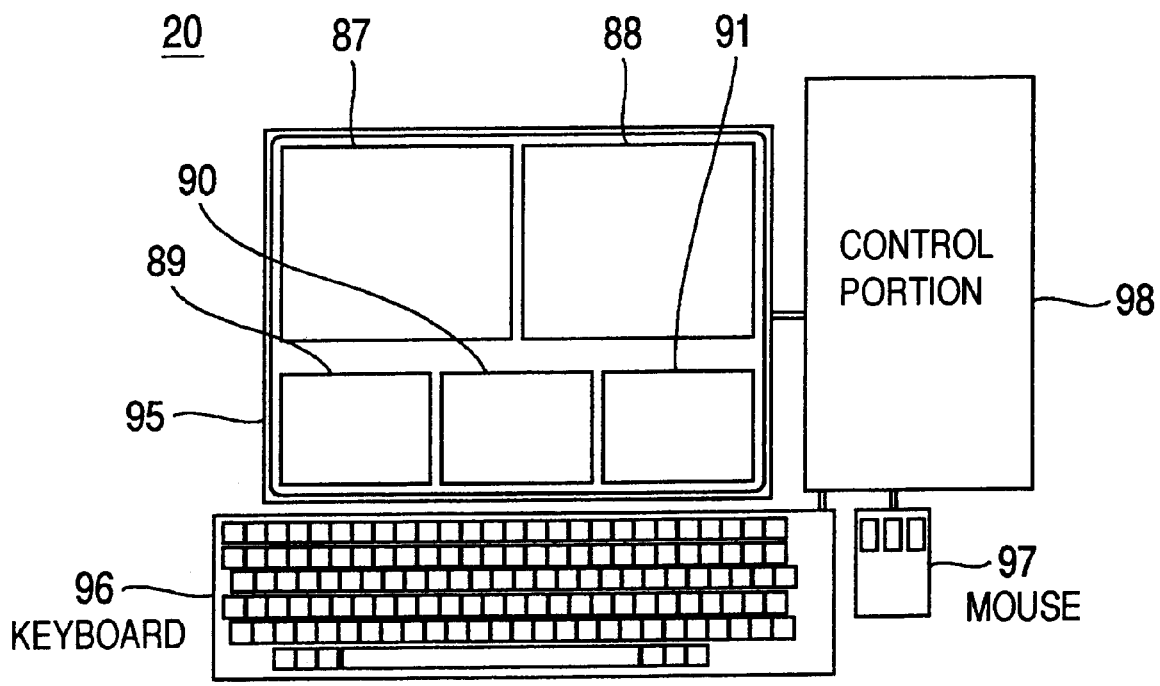
FIG. 3 is a constructional diagram of an interface.

FIG. 3 shows the operating portion 20 and is a constructional diagram of an interface with the user or operator. As shown in the diagram, the operating portion 20 comprises a monitor 95, a keyboard 96, a mouse 97, and a control portion 98. A map portion 87 to display chips or cells on the inspection-subject substrate 24 by a form of map, an image display portion 88 to display the electron beam image or the image information obtained by the optical microscope 19, an image obtaining instructing portion 89, an image processing instructing portion 90, and a processing condition setting portion 91 are displayed on the screen of the monitor 95. Any of an electron beam image obtained by the secondary electron detector 35, an optical image photographed by the CCD camera 52, a differential image obtained after it was comparison processed by the image processing circuit 82, and the like is arbitrarily selected and displayed in the image display portion 88.

The present position of the stage is displayed in the map portion 87. An optical microscope image of the optical microscope 19 is displayed on the image display portion 88. The operator clicks an arbitrary portion on the inspection-subject substrate 24 displayed in the map portion 87 by a mouse 97 or the like, so that a position to be inspected can be designated by moving the X stage 46 and Y stage 47. The execution of the inspection can be instructed by clicking a button displayed in the image obtaining instructing portion 89.

The operator sets inspecting conditions of the inspecting condition setting portion 83 by a button displayed in the processing condition setting portion 91. An image process in the image processing circuit 82 of the digital image stored in the memory means 81 is set by a button displayed in the image processing instructing portion 90. The image of the defect stored in the defect data buffer 84 is made correspond to the position designated by the map portion 87 and enlargedly displayed in the image display portion 88. The operator repetitively clicks the map portion 87 and can discriminate whether the defect to be detected has been detected and the surplus defects are not detected or not.

As a result of the discrimination, if the inspecting conditions are improper, the processing conditions are set again by the processing condition setting portion 91 and the inspection is executed by the image processing instructing portion 90. By repeating those operations, the inspecting conditions suitable for the inspection can be searched.

When the confirmation of the condition at one position is finished, the operator reduces and displays the map portion 87 as necessary, switches the image display portion 88 to the optical microscope image display in the optical microscope 19, selects again the condition setting position, and repeats the operations in a range from the image obtaining to the condition setting. The condition setting of the operator can be supported by those operations.

Figure 4:
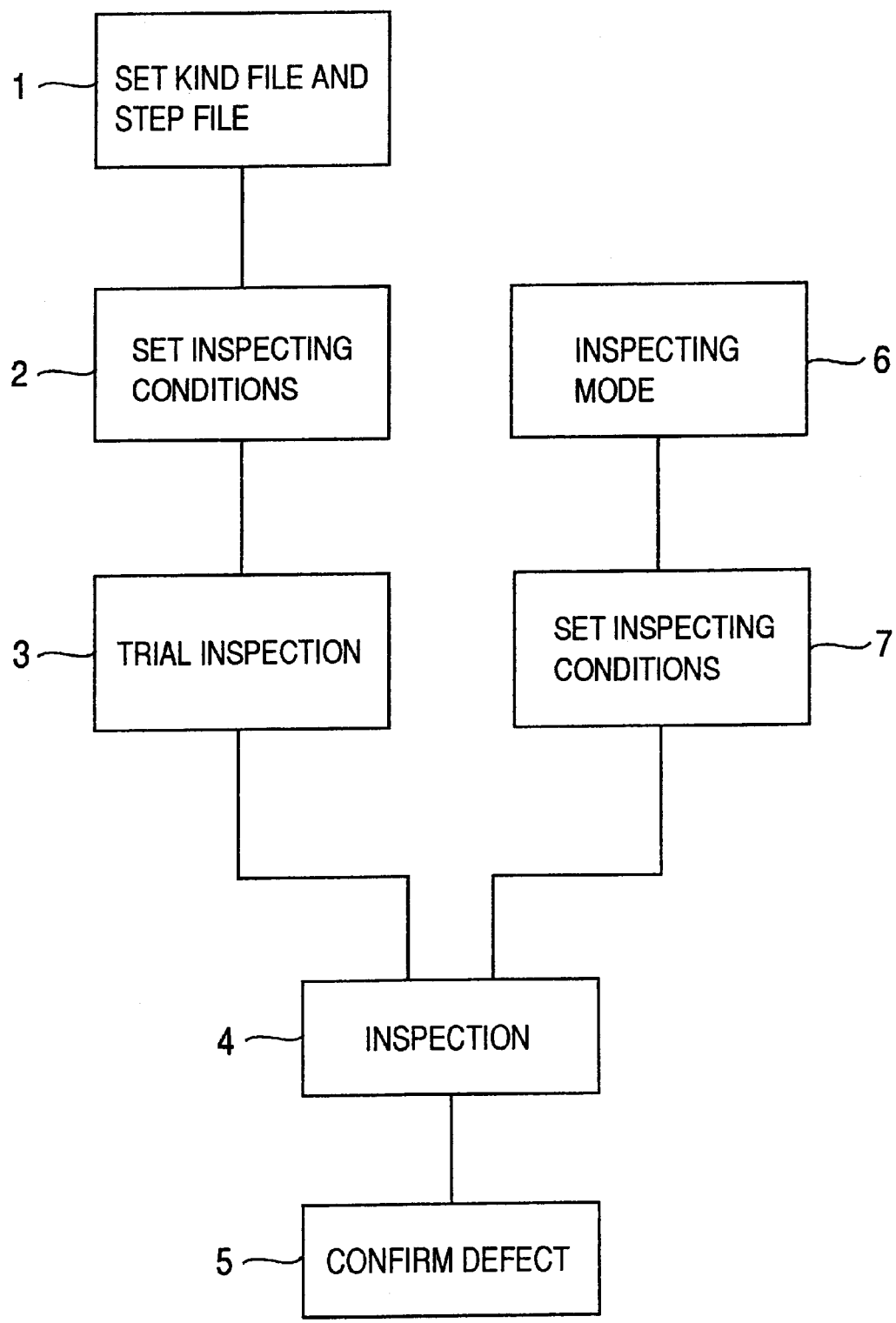
FIG. 4 is a flowchart showing a main inspecting procedure.

An inspecting procedure is classified into a recipe forming mode, an inspecting mode, and a defect confirming mode. FIG. 4 is a flowchart showing a main procedure of the inspection in the circuit pattern inspection apparatus shown in the first embodiment. Instructing buttons of those modes are always displayed on the screen of the monitor 95. The recipe forming mode includes steps 1 to 3. First, a kind file and a step file for inputting various data that is peculiar to a wafer and various data during the manufacturing process are set (step 1). Subsequently, inspecting conditions such as cell region setting, inspection region setting, and the like are set (step 2). A trial inspection such that an electron beam is irradiated to only a part of the wafer and the inspection is simulated in accordance with preset inspecting conditions and inspecting conditions are determined is executed (step 3). The actual inspection is executed in the inspecting mode (step 4). The defect extracted by the inspection is confirmed in the defect confirming mode (step 5).

If the inspecting conditions have already been set and there is no need to change them, the operator selects the inspecting mode without performing the above procedure (step 6), confirms the inspecting conditions or resets them as necessary (step 7), and executes the inspection.

In the circuit pattern inspection apparatus according to the invention, instructions in those steps are inputted from the picture plane. Although a series of operations is fundamentally performed in accordance with this procedure, the order of the steps can be exchanged or the steps can be omitted.

The inspection-subject substrates to which the inspection method or apparatus according to the invention is applied are mainly classified into two kinds. One is a wafer during the manufacturing step of a semiconductor device and the other is a mask, reticle, or the like which is used in the manufacturing of a semiconductor device. Among semiconductor device products, the invention can be mainly applied to various products such as product mainly comprising a memory circuit, logic circuit product, bipolar memory, logic product, BiCMOS product, microprocessor product, and the like. Among the masks and reticles, the invention can be applied to various masks and reticles such as phase-shift reticle, mask for X-ray exposure, reticle for excimer exposure, and the like.

Although a case where a wafer is used as an inspection-subject substrate will be explained as an example in the following embodiments, even in case of the mask and reticle, the subject matter of the present invention is not changed and a similar inspection can be performed merely by changing the details shown in the embodiment.

Figure 5:
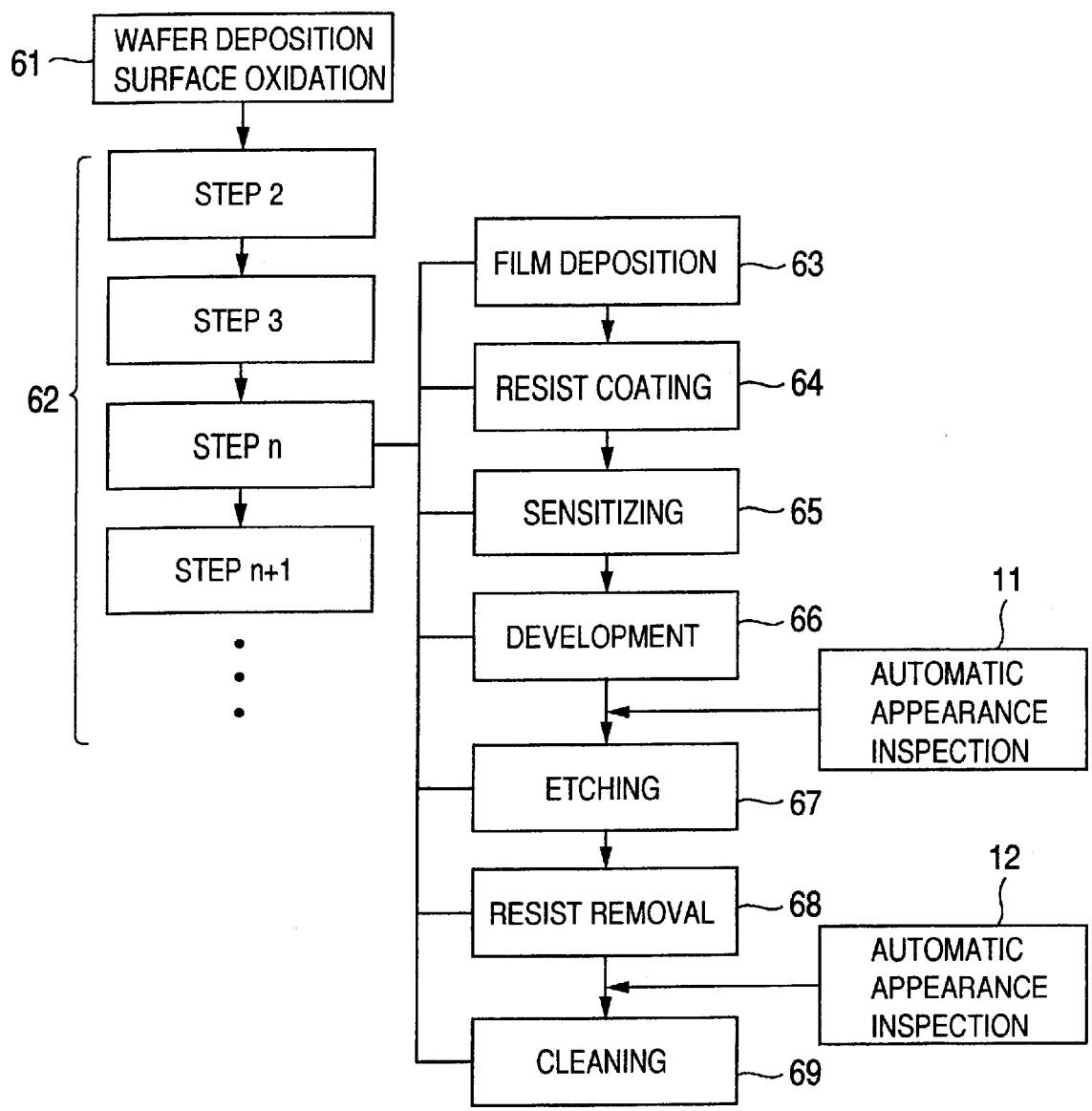
FIG. 5 is a flowchart showing a manufacturing process of a semiconductor device.

FIG. 5 is a flowchart showing the manufacturing process of a semiconductor device. As shown in the diagram, the process for the semiconductor device starts from a wafer deposition and surface oxidation step (step 61) and is constructed by a plurality of steps (step 62). A pattern forming step among those steps is further finely divided. The pattern forming step mainly comprises steps of: a film deposition (step 63); a photosensitive resist coating (step 64); sensitizing (step 65); a development (step 66); etching (step 67); a resist removal (step 68); and cleaning (step 69). Since the semiconductor device comprises multilayer film deposition steps, the same steps as those steps are repeated many times. If the manufacturing conditions are not optimized in the above steps, an inconvenience such that a circuit pattern of the semiconductor device which is formed on the wafer is not normally formed occurs. Therefore, it is necessary to provide automatic appearance inspecting steps (steps 11 and 12) after the step in which a state of the device cannot be confirmed later.

The circuit pattern inspection apparatus according to the invention has the procedure shown in FIG. 4, and the following contents are displayed on the screen of the monitor in order to execute the procedure, thereby making it easy to perform the operation of the operator and reducing the inspection time.

Figure 6:
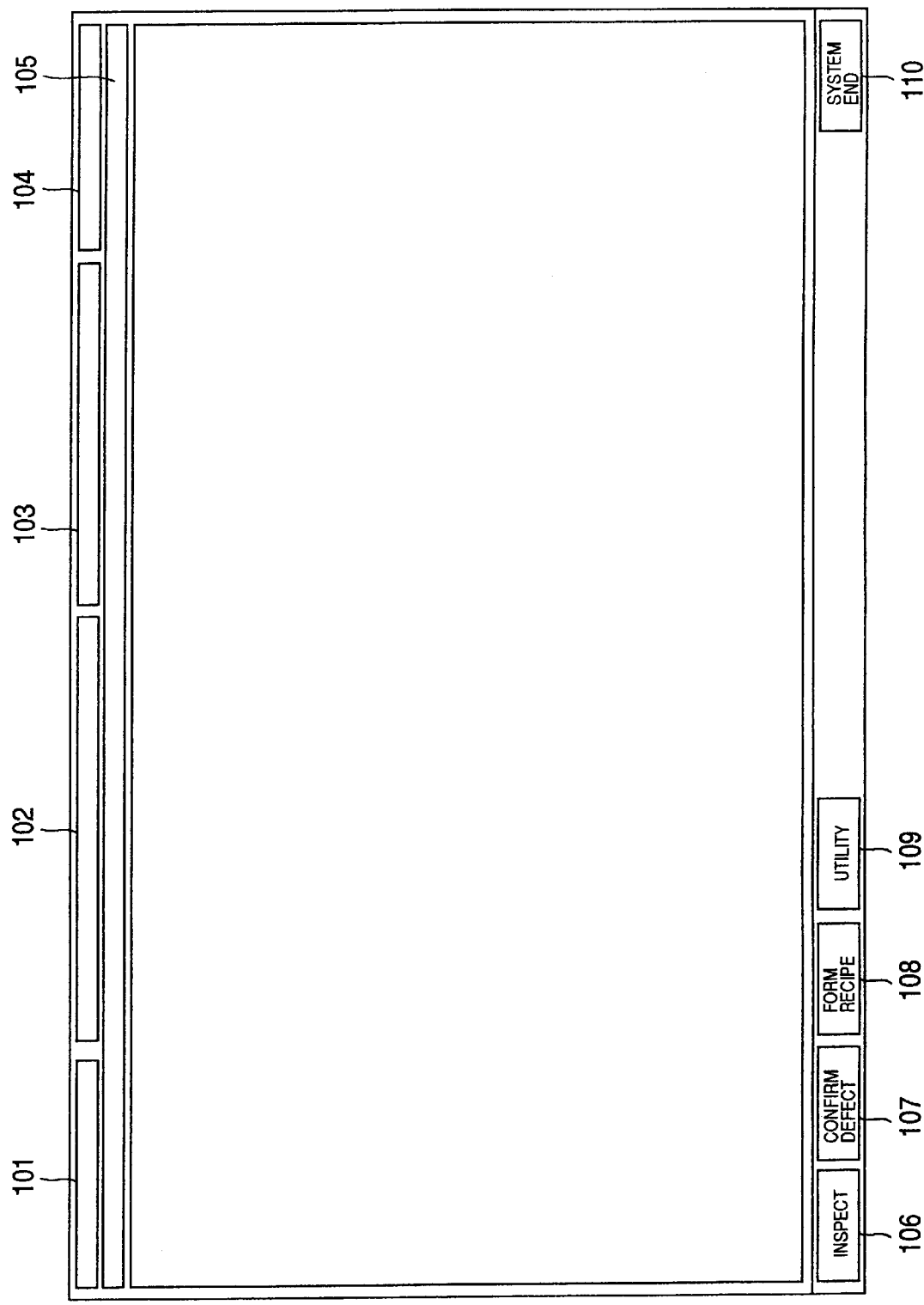
FIG. 6 is a layout diagram of an initial state of a picture plane.

The second embodiment of the invention will now be described hereinbelow. FIG. 6 is a layout diagram of an initial state of a picture plane which is displayed on the monitor 95 shown in FIG. 3. A time display region 101, an apparatus ID display region 102, an inspection target substrate name display region 103, an operator name display region 104, and a message region 105 for displaying various messages are arranged in the top portion of the picture plane. In the lower portion of the picture plane, there are arranged: an "inspect" button 106 to designate the inspecting mode for instructing the start of inspection; a "confirm defect" button 107 to designate the defect confirming mode for instructing the confirmation of a defect; a "form recipe" button 108 to designate the recipe forming mode for instructing the formation of a recipe to preset inspecting conditions; a "utility" button 109 to designate the utility mode for instructing calling of an auxiliary function; and a "system end" button 110 to instruct the end of system.

Since the inspection is executed on the basis of the contents of the recipe, the operator needs to form a recipe at first. If the contents of the recipes at the second and subsequent times are the same as those of the recipe at the first time, there is no need to newly form them.

Various parameters which are necessary to execute the inspection in the embodiment will be shown below.

Figure 7:
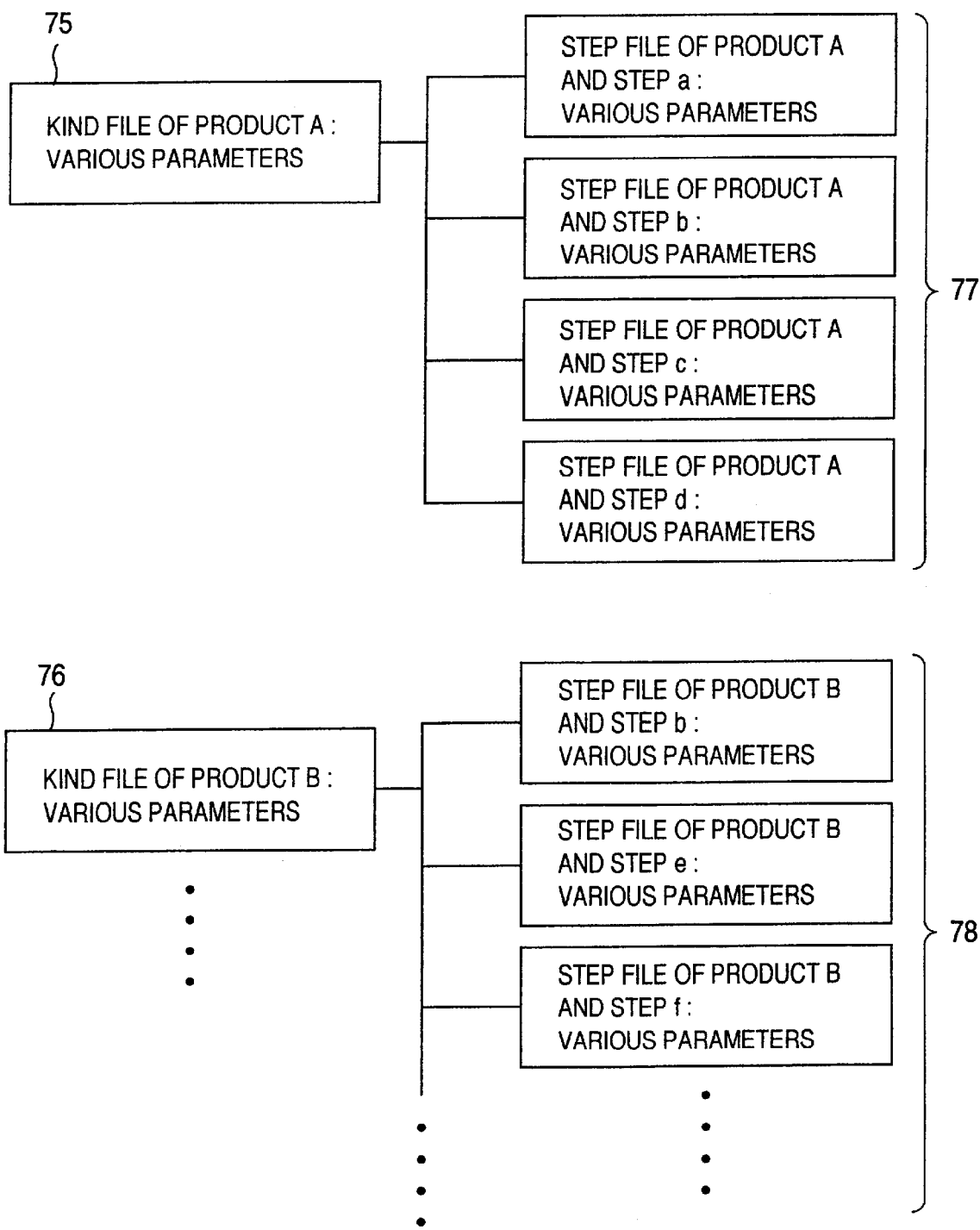
FIG. 7 is a constructional diagram showing a relation of layers of parameters.

FIG. 7 is a constructional diagram showing the relation of layers of the parameters. As parameters to execute the inspection, there are parameters which are peculiar to the wafer, parameters to decide the operating conditions of the apparatus, and the like. The parameters which are peculiar to the wafer are mainly classified into two kinds. One is parameters 75 and 76 called "kind files" and they are parameters which are not changed depending on the layer during the manufacturing process. The contents are, for example, a wafer size, a shape of orientation flat or notch, an exposure shot size of the semiconductor product, a chip size or die size, a layout of shots and chips, a shot and a chip as valid regions of the inspection region, the number of the chip serving as an origin, the number of memory cell regions, coordinates of each region, a size of a repetition unit of the memory cells, and the like.

The above contents are constructed as a table of "kind file". The other is parameters 77 and 78 called "step files" and they are parameters which need to be adjusted because materials of the surfaces and states of shapes are different depending on the layer during the manufacturing process steps. Those contents are, for example, electron beam irradiating conditions, various gains and offset values of a detecting system, gradation conversion values to adjust the brightness of an image of each sample, coordinates and an image of an alignment mark to execute an alignment, inspection region conditions such as chip in which the inspection is performed or region in the chip, sampling rate, or the like, a pixel size upon inspection, conditions of an image process to detect the defect, the number of allowable defects or a defect density to execute a discrimination about a state of the wafer, the number of failure-generated chips or a failure-generated chip ratio, and the like. The electron beam irradiating conditions are an irradiating energy when the electron beam is irradiated to the sample and the like. The conditions for the image processes to detect the defect are a selection of a fixed threshold value or a floating threshold value, a filter at the time of image input or processes, a deviation allowable value of the position matching, a variation allowable value of brightness at the time of image comparison, and the like. Those parameters have been registered as "step files".

Upon inspection, the operator designates the "kind file" and "step file" and calls them, so that he can call the inspecting conditions corresponding to a specific semiconductor product or a specific manufacturing step.

The "kind file" and "step file" are collectively called a "recipe". A series of operations for inputting and registering those various parameters is called "form recipe".

In the conventional inspection apparatus, the "kind file" obtained by forming a table from common information regarding a specific semiconductor device product and the "step file" obtained by forming a table from the information that is peculiar to individual inspecting step are not properly separated. Therefore, for instance, with respect to the specific semiconductor product, even if the inspecting conditions have already been set for the wafer in the other step, there is a problem such that when the inspecting conditions in another step are set, it is difficult to use the conditions which have already been formed in common. For example, it is necessary to input again the parameters which are common in the same kind, for example, the setting of a region of the chip matrix or memory cells or the like each time the inspecting step changes. In the invention, the "kind file" and "step file" are properly separated as mentioned above and a file structure such that a plurality of step files are provided at a level lower than that of the kind file with respect to one semiconductor product is set as shown in FIG. 7. Therefore, for example, when inspecting conditions of wafers whose steps differ in the same product are set, the conditions can be used in common with respect to the parameters such as a chip size and the like which are common in a specific product among the inspection files which have already been formed. A troublesomeness such that the same parameters are set and inputted many times can be made unnecessary. Further, since the operation on the picture plane becomes easy, a forming efficiency of the inspecting conditions can be raised.

Figure 8:
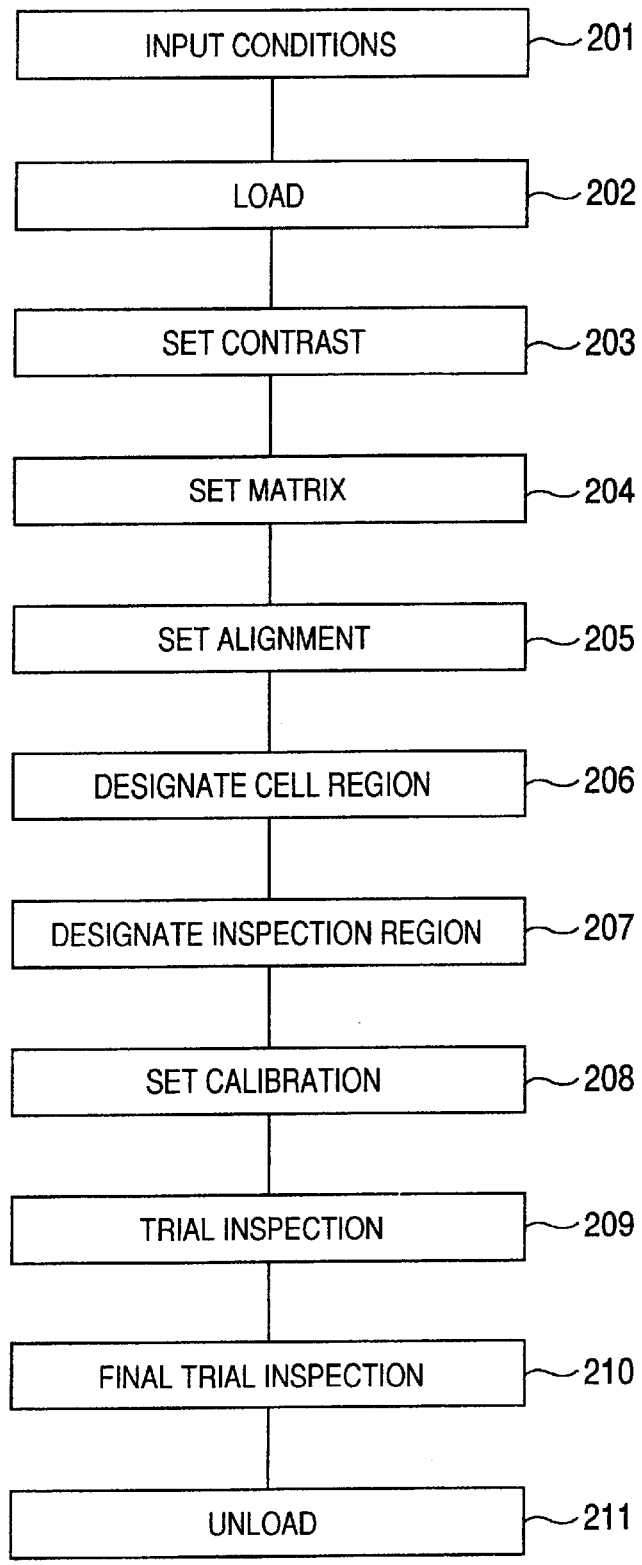
FIG. 8 is a flowchart of a recipe forming mode.

FIG. 8 is a flowchart in the recipe forming mode. The recipe forming mode can be designated by clicking the "form recipe" button 108 shown in FIG. 6 by the mouse or the like. In the recipe forming mode, important steps are the cell region setting, inspection region setting, trial inspection, and final trial inspection.

First, the operator inputs the parameters such as kind file, step file, and the like mentioned above and conditions which are necessary to execute the inspection from the picture plane (step 201) and loads the wafer as an inspection-subject substrate 24 (step 202). Subsequently, a contrast as a condition of the electronic optical system is set (step 203). A matrix for setting layout information of the wafer is set (step 204). An alignment to measure a layout of the wafer is set and an alignment to perform a trial of the alignment is set (step 205). A cell region setting to designate a memory cell region of the wafer is performed (step 206). An inspection region is set (step 207). A calibration setting to confirm a detected light quantity of the wafer and a trial of the calibration are performed (step 208). The setting of inspecting conditions and a trial inspection for trial are performed (step 209). A final trial inspection to finally confirm the set inspecting conditions is executed (step 210). After the above items were set, the wafer is unloaded (step 211) or the inspecting mode is executed. Although the above steps are fundamentally performed in order, they can be executed in arbitrary order.

Figure 9:
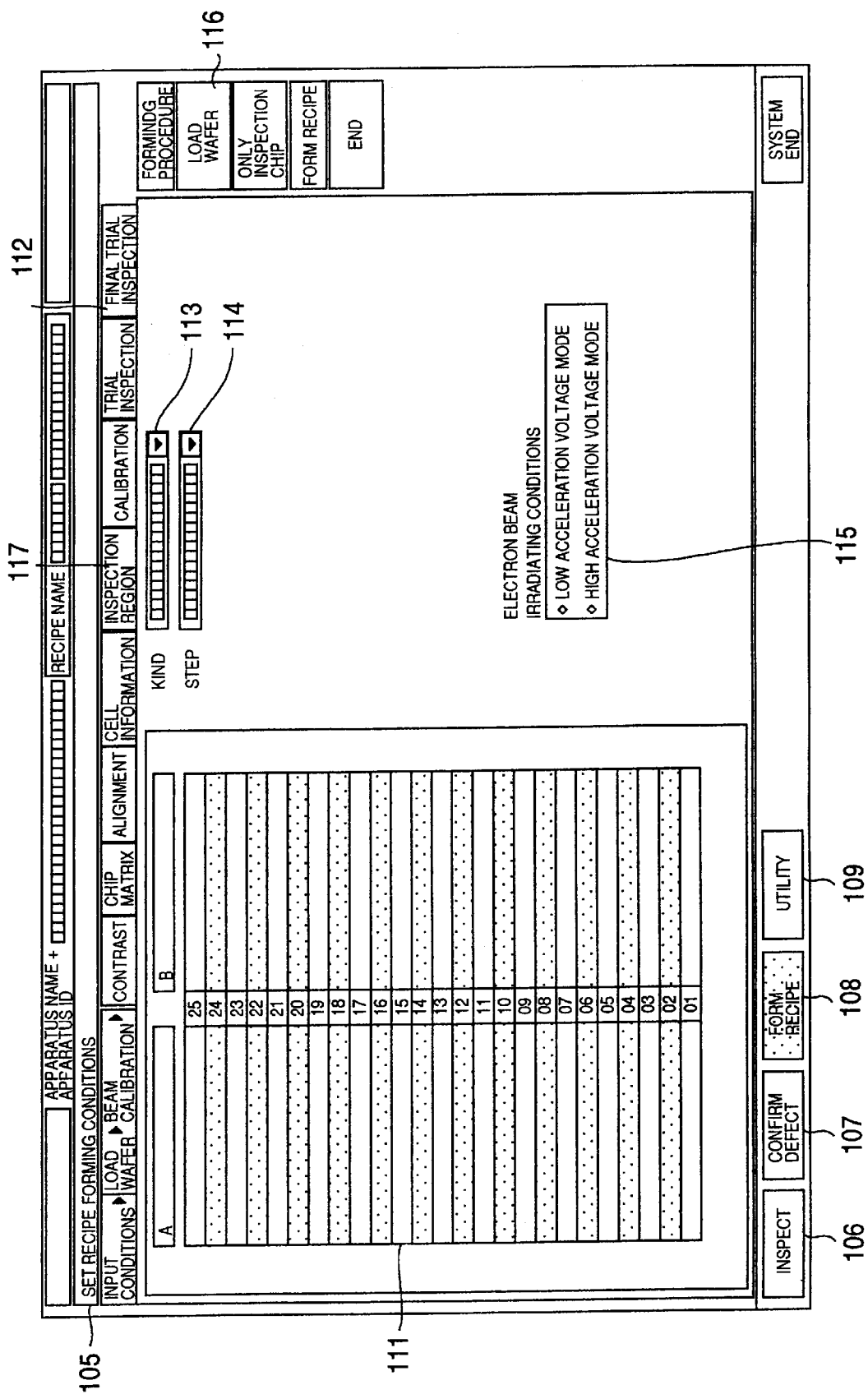
FIG. 9 is a diagram showing a recipe input picture plane.

FIG. 9 is a diagram showing a recipe input picture plane. When the "form recipe" button 108 shown in FIG. 6 is clicked by the mouse or the like, this picture plane is displayed. In FIG. 9, the message region 105 is arranged in the portion under the top portion and "guidance" or "message" to explain the operation or state is displayed. A message to promote the input of conditions is outputted to the message region 105. A cassette display region 111 to display the wafer loaded in the apparatus is displayed. A selection tab 112 to display and select the present set items, a kind file setting region 113, a step file setting region 114, an electron beam irradiating condition setting region 115 to set electron beam irradiating conditions, and a "load wafer" button 116 to instruct the loading of the wafer are arranged in the upper portion of the picture plane. As electron beam irradiating conditions, either a low acceleration voltage mode or a high acceleration voltage mode can be selected in the electron beam irradiating condition setting region 115. By clicking an "inspection region" tab 117, the screen can be shifted to the inspection region setting picture plane for trial inspection.

Figure 10:
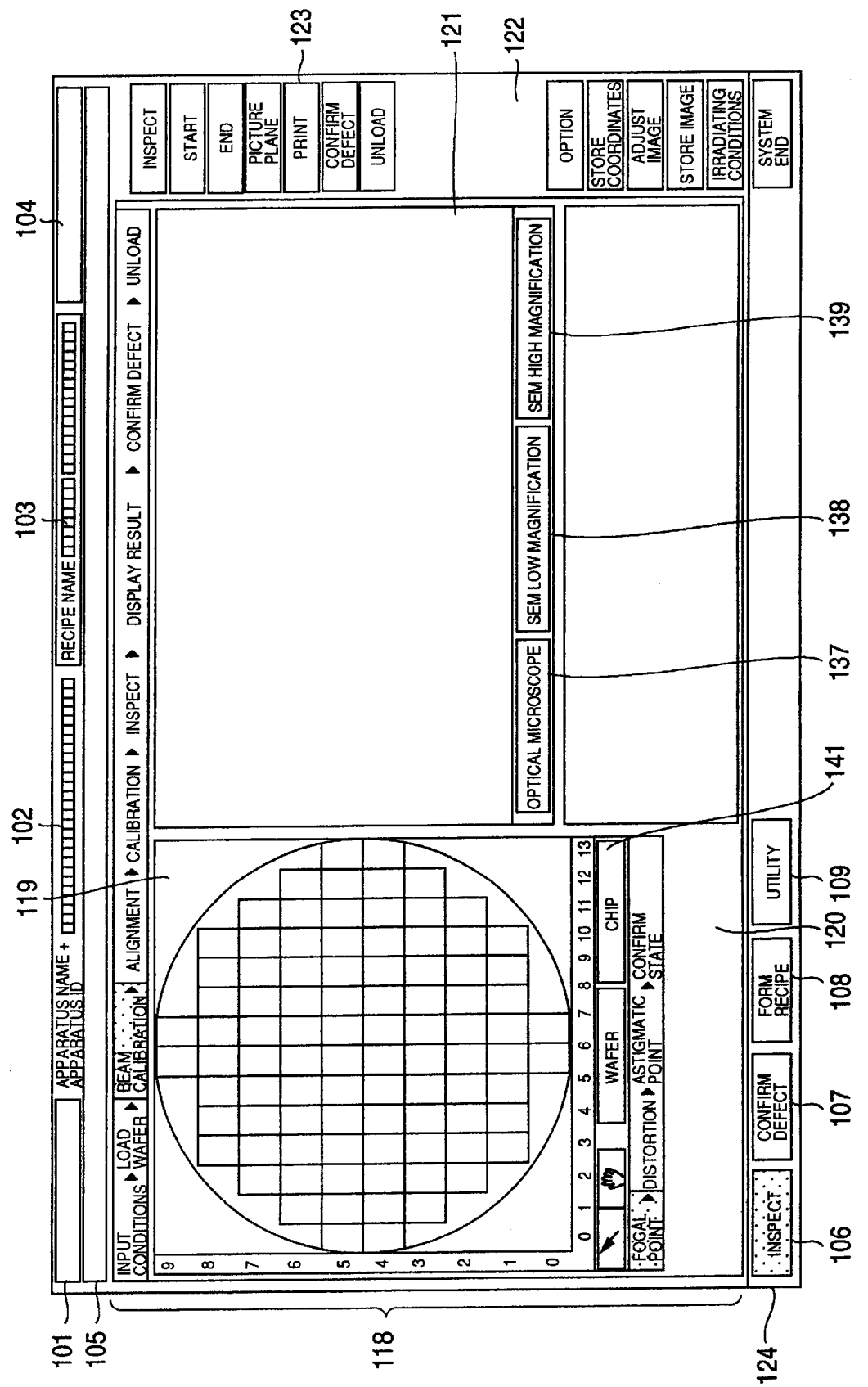
FIG. 10 is a layout diagram showing an example of a picture plane of the inspection apparatus.

FIG. 10 is a layout diagram showing an example of a picture plane of the inspection apparatus and shows a picture plane when the inspecting mode is executed. This picture plane is displayed by clicking the "inspect" button 106 in a region 124 by the mouse or the like. The picture plane is mainly divided into five regions. As mentioned above, the apparatus ID, the name of recipe, the message, and the like are displayed in the region of the top portion of the picture plane. A region 118 on the left center side of the picture plane is constructed by: an inspection region designating region 119 to designate a shelf number list of a cassette and the inspection region of the wafer; and an inspecting condition input region 120 for inputting an inspection target and inspecting conditions. The contents which are displayed are changed in accordance with the operation or progressing situation. The inspecting conditions, data as an inspection result, image, and graph are displayed in an inspection display region 121 on the right center side of the picture plane, and the contents which are displayed are changed in accordance with the operation or progressing situation. In case of the image, any of an optical microscope image, an SEM type low magnification image, and an SEM type high magnification image can be designated by clicking an "optical microscope" button 137, an "SEM low magnification" button 138, and an "SEM high magnification" button 139.

A region 122 is arranged on the right side of the picture plane and buttons for operation which are necessary in common for a plurality of picture planes are displayed. As such buttons, for example, there are a "start" button and an "end" button for inspection, a "print" button of the picture plane, an "execute" button to confirm the defect, an "unload" button of the wafer, a "store coordinates" button as an option, and the like. If the mode changes, the kinds of buttons which are displayed are also changed. When a desired button is clicked by the mouse or the like on the picture plane, the operation corresponding to the clicked button is executed. For example, when a "print" button 123 is clicked, a hard copy of the displayed picture plane is executed.

The region 124 is arranged in the lower portion of the picture plane and mode names indicative of the modes which are separately set in accordance with the operation contents as described in FIG. 6 are displayed. When the operator clicks the "inspect" button 106, the inspecting mode to execute the automatic inspection is set. When the "confirm defect" button 107 is clicked, the mode to confirm the defect is set. When the "form recipe" button 108 is clicked, the recipe forming mode for inputting the parameters of the kind file and step file mentioned above and executing the trial inspection is set. When the "utility" button 109 is clicked, the mode to execute the management of the parameters which are peculiar to the apparatus and the adjustment of each portion such as electronic optical system, mechanism system, detecting system, image processing system, or the like is set. Since the picture plane shown in FIG. 10 corresponds to the inspecting mode, the "inspect" button 106 is displayed in a color different from that of the other buttons, thereby allowing the operator to easily recognize that the inspecting mode is at present set.

In the region layout, the time display region 101, apparatus ID display region 102, inspection target wafer name display region 103, and operator name display region 104 in the top portion and the region 124 in the bottom portion are constructed by predetermined picture plane standards. According to the picture plane standards, it is standardized that the date is displayed at the left edge in the upper portion of the picture plane, the operator name is displayed at the right edge, and the mode name of the operation is displayed in the lower portion of the picture plane. The picture plane layout of the present apparatus also conforms with the standards.

In the regions 118 and 121, the region which is always displayed at a predetermined position and the region whose display contents are changed in accordance with the operation and progressing state are separately arranged in the picture plane. Thus, even if the display contents change in accordance with the operation and progressing state, the same contents are always displayed at the same position, so that the visibility of the picture plane is improved for the operator, the inputting operation and the progressing situation of the inspection can be easily recognized, and efficiencies of the recipe forming operation and the inspecting operation can be improved.

The setting of the kind file and step file in the recipe forming mode will now be described. As mentioned above, the kind file comprises the chip matrix and the cell region file. The step file comprises the electron beam irradiating conditions, calibrating conditions, alignment conditions, inspecting region, sensitivity conditions, and OK/NG discrimination file. Particularly, the cell region file is positioned as a kind file, the inspection region file is positioned as a step file at a level lower than that of the cell region file, and the cell region picture plane and the inspection region picture plane are separately displayed so that each parameter can be inputted. The cell region file comprises the number of cell regions, coordinates of the cell region, and a cell pitch file. The inspection region file comprises an inspection chip, coordinates of the inspection region in the chip, and a sampling file.

When a recipe comprising the kind and the lower step is formed, the contents which have been inputted so far are stored at an arbitrary position of the recipe condition input by two stages of the kind and step. When the recipe comprising the kind and the lower step is formed, whether the input of predetermined parameters has been completed or not is discriminated under the condition such that the completion of the input of the parameters regarding the kind or step has been confirmed. When the input is not completed, an alarm is generated.

Figure 11:
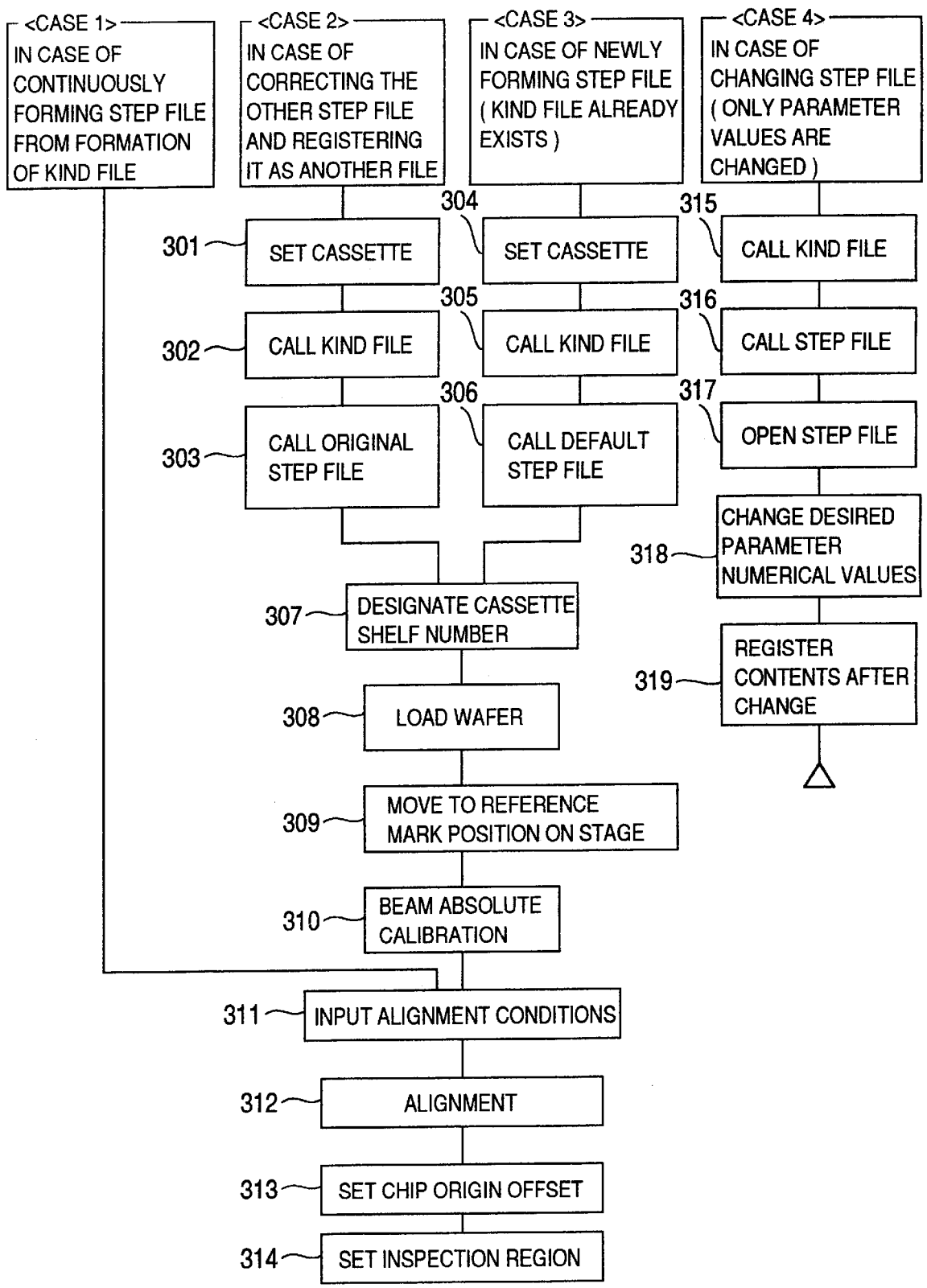
FIG. 11 is a flowchart showing a part of a step file forming flow.

FIG. 11 is a flowchart showing a part of the step file forming flow. In the diagram, Case 1 relates to a case of forming the step file subsequently to the formation of the kind file. Case 2 relates to a case of correcting another step file and registering it as another file. Case 3 relates to a case of newly forming a step file (the kind file already exists). Case 4 relates to a case of changing the step file (only the parameter values are changed).

In case 2, the cassette is set (step 301), the kind file is called (step 302), and the original step file is called (step 303). In case 3, the cassette is set (step 304), the kind file is called (step 305), and a default step file is called (step 306). In both cases, the cassette shelf number is designated (step 307) and the wafer is loaded (step 308). The stage is moved so that the beam irradiates a stage reference mark position (step 309). An absolute calibration of the beam is performed (step 310). The alignment conditions are inputted including the case of Case 1 (step 311). The alignment is subsequently performed (step 312). A chip origin offset is set (step 313). The inspection region is set (step 314).

In Case 4, the kind file is called (step 315), the step file is called (step 316), the step file is displayed on the picture plane (step 317), a desired parameter is changed (step 318), and its contents are registered (step 319).

Figure 12:
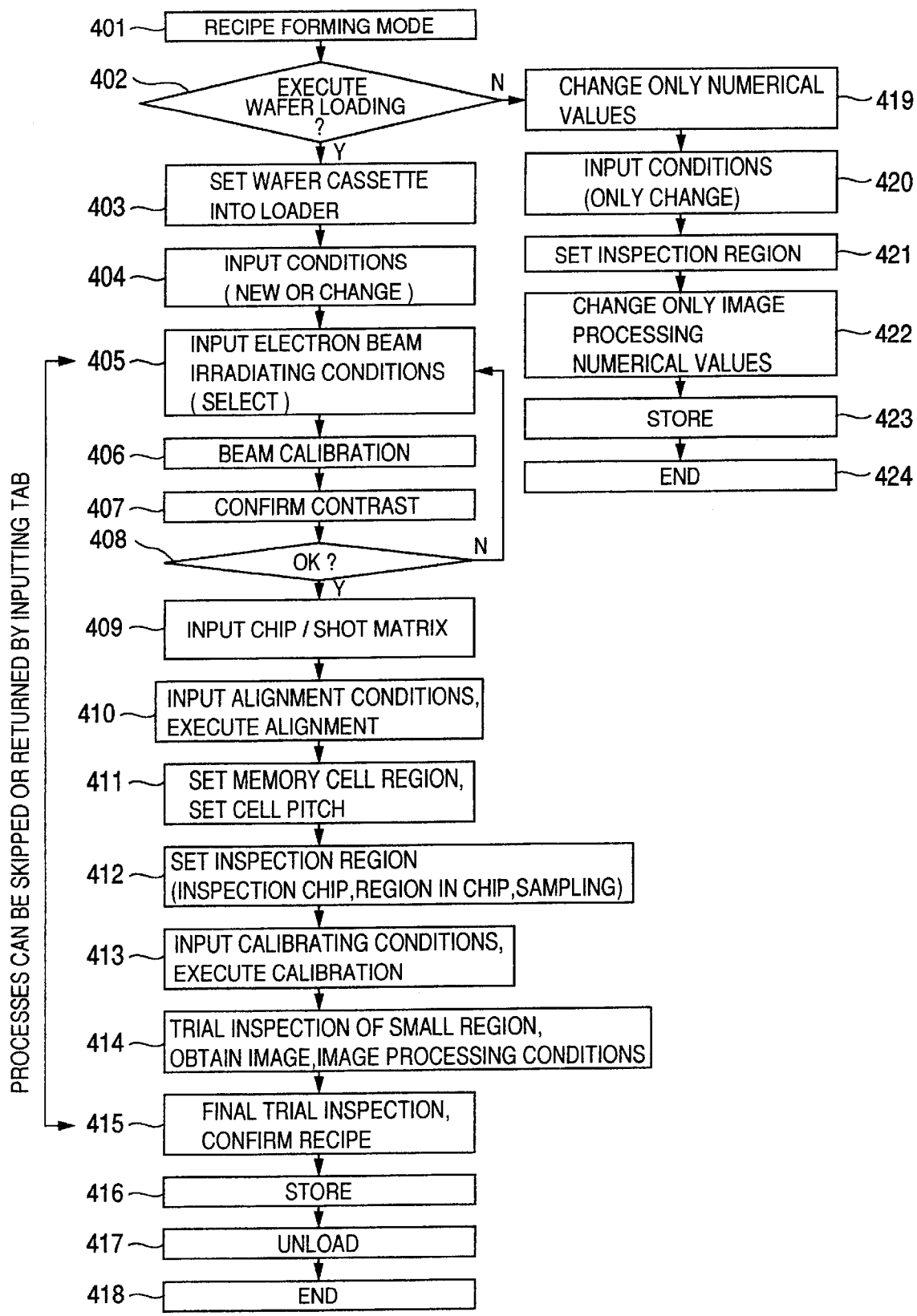
FIG. 12 is a flowchart showing a recipe forming procedure.

A flowchart showing the recipe forming procedure is shown in FIG. 12. First, on the picture plane shown in FIG. 6, the operator clicks the "form recipe" button 108 by the mouse or the like (step 401), so that the screen is switched to the picture plane of the recipe forming mode. On the first picture plane of the recipe forming mode, either a sequence for loading the inspection-subject wafer and forming a recipe or a sequence for merely changing the numerical value of a specific parameter condition with respect to the recipe which has already been formed, namely, for setting the numerical values without loading the wafer is selected (step 402). In the embodiment, a method of loading the wafer and forming a recipe will be described.

A wafer cassette on which the wafer is put is mounted on a loader of the inspection apparatus (step 403). A condition to form a recipe, namely, either a mode to newly form a kind file and a step file or a mode to change the file which has already been formed is designated (step 404). When "newly form" is selected, the kind file and step file inputted as defaults are called on the picture plane. When the change of the kind file or step file which has already been registered is designated, the kind file and step file which have already been registered are called. After completion of the designation, the wafer is loaded by clicking the "load wafer" button on the picture plane.

If the "load wafer" button is clicked in a state where the preset parameters of the kind file or step file which have to be certainly inputted are not inputted yet, a warning indicative of such a fact is displayed.

The wafer loading operation is started and, at the same time, the irradiating conditions of the electron beam are set (step 405). Each time the electron beam conditions are changed, a "beam calibration" (step 406) to adjust a focal point and an astigmatic point of the electron beam is necessary. For this purpose, in the inspection method and recipe forming method in the embodiment, the electron beam irradiating conditions are preliminarily designated (step 405) prior to performing the "beam calibration" (step 406).

When the electron beam irradiating conditions are inputted and the wafer loading operation is completed, a retarding voltage is applied to a sample stage and a sample so as to obtain the conditions designated by the electron beam irradiating conditions. In the "beam calibration" (step 406), the stage is automatically moved so that the position of a pattern for electron beam calibration adhered on the sample stage comes just under the electron beam irradiation optical system and the electron beam is irradiated to the calibrating pattern. When a magnification, a distortion, and the like are corrected on the calibrating pattern and the focal point and astigmatic point are adjusted by a knob, the processing routine advances to the next step.

Subsequently, the operator irradiates the electron beam to the designated position on the sample and adjusts the focal point and astigmatic point on the sample again after confirming an image contrast on the sample (step 407). In this instance, if the electron beam is continuously irradiated to the sample, a contamination is adhered onto the sample or the contrast of the sample fluctuates due to the charging. Therefore, the operations such that by irradiating the electron beam once at a predetermined time interval, an image is obtained, and it is displayed on the screen are repeated. If a contrast between the pattern portion and the background is not obtained on the displayed picture plane, the change of the electron beam irradiating conditions is designated (step 408). Thus, the electron beam irradiating conditions are changed (step 405). After the "beam calibration" (step 406) is executed again, the contrast can be similarly confirmed (step 407). The electron beam irradiating conditions and the focal point and astigmatic point conditions are stored as parameters in the step file.

When the electron beam conditions are determined and the contrast is confirmed and the conditions of the focal point and astigmatic point are adjusted on the sample, the shot of the wafer and the size and layout of the chips are inputted (step 409). When the shot size and the shot matrix are inputted and the layout of the chip in the shot is inputted, the presence or absence of the shot or chip in the portion around the wafer is designated. The shot and chip layout which are set here are stored as parameters in the kind file.

Alignment conditions are subsequently set (step 410).

After the alignment conditions are set and the alignment is executed, the cell region of the memory in the chip is set (step 411). The setting of the cell region is needed only with respect to the memory product or the product having memory cells in the chip. An arbitrary chip is selected and the position of each memory cell mat in the chip is searched on the optical microscope image and designated. The same position is displayed again on the electron beam image, thereby registering coordinates at a higher magnification and higher precision. When the designation of the position of the memory mat is completed, a repetition unit, namely, a pitch is inputted with respect to the repetitive pattern in the memory mat (step 411). As a repetitive pitch, a numerical value can be inputted or an image of the pattern is obtained and displayed on the screen at a high magnification, a repetition unit is inputted by a cursor or the like, and it can be automatically measured. The data and repetitive pitch of the memory cell region which are inputted as mentioned above are registered as parameters in the kind file.

The inspection region is subsequently designated (step 412). In the designation of the inspection region, two kinds, namely, the inspection chip and the inspection region in the chip can be designated. On the default conditions, all chips and all regions which were set as valid regions on the wafer are inspected. However, if the user wants to reduce the inspection time, if there is no need to inspect all chips, or if the user wants to inspect only a specific region in the chip, they can be arbitrarily designated every number of scanning lines of the electron beam or every size of chip, or the chip can be designated. Further, an inspection sampling rate can be designated for the designated region. The details of the setting of the sampling rate will be described hereinlater. The inspection region data inputted as mentioned above is stored as parameters in the step file.

When the designation of the inspection region (step 412) is completed, the processing routine advances to the calibration setting to adjust the brightness of the image upon inspection (step 413). In the calibration, the image is obtained and a gain adjustment and a brightness correction are performed on the basis of a brightness distribution in accordance with a signal amount. An arbitrary chip is first selected from the picture plane and coordinates to obtain the image to perform the calibration in the selected chip are designated and registered. The automatic calibration is actually executed and a result is confirmed. The contents inputted here, namely, the coordinates values to execute the calibration, the gain of brightness, and the offset value are registered as parameters in the step file.

When the setting of the calibrating conditions and the calibration (step 413) are completed, a trial inspection to actually obtain an image under the various conditions which have been set so far is executed and image processing conditions to detect a defect are set (step 414). When the image is obtained, the kind of filter to be subjected to a detection signal is selected. For example, a plurality of filters such as filter to suppress noises, filter to emphasize a difference of brightness, and the like have been registered and a desired filter is selected among them. An image of a small region in one chip is actually obtained under the same conditions as those in the inspection. In this case, a position to obtain the image can be arbitrarily designated. The small region denotes, for example, a region of an image having a width of 100 m as a scan width of the electron beam and a length as long as one chip. When the image is obtained, a threshold value to discriminate the defect is inputted, the image at the position where it was determined to be the defect in the obtained image is displayed, whether the defect has actually been detected or not and whether there is an erroneous detection or not are discriminated, and thereafter, the threshold value is adjusted to a proper value.

The operations such that the threshold value is inputted, the image processes are executed, the defect detection and a situation of the erroneous detection are confirmed, and the threshold value is inputted again are repeated, thereby deciding the optimum inspecting conditions. Such a series of operations is called a small region trial inspection. There is also a case where the threshold value is determined by a combination of threshold values of a plurality of items. The parameters of the threshold value, filters, and the like which are set here are stored as parameters in the step file.

Although various parameters necessary for inspection can be set by inputting the above various values, in the actual semiconductor wafer, a variation of processes in the wafer surface occurs and a variation of processes among the wafers or among the manufacturing lots occurs. Therefore, if the image processing conditions are merely set in the small region trial inspection (step 414), it is insufficient and it is necessary to decide the threshold value in the defect discrimination by finally considering variation amounts.

For this purpose, after completion of the setting of the threshold value, an arbitrary region on the whole surface of the inspection-subject wafer is further set and the inspection is executed under the conditions set so far (step 415) and a defect detection level and an erroneous detection level are confirmed. After that, if there are finally proper conditions, the various parameters inputted so far are registered into the kind file and step file. This processing step is called a final trial inspection.

When the inputting operations in the various steps so far are completed, a result is stored by designating the kind file name and step file name (step 416). The wafer is unloaded (step 417) and the series of setting operations of the recipe formation is finished (step 418).

The above processes relate to a flow in the recipe forming mode. In the above flow, as for the processes among the condition setting items in a range from the selection of the electron beam irradiating conditions (step 405) to the final trial inspection (step 415), by selecting a desired one of the tabs displaying the item names in the picture plane, each process can be freely advanced or returned to an arbitrary processing item.

In the recipe formation, the number of items to obtain the image or the like by using the actual semiconductor product wafer itself and decide the parameters from the image is large. However, as mentioned above, there is a case where only the numerical value is changed in dependence on the item. For example, there is no need to designate the inspection-subject wafer in case of changing the inspection region or inspection chip. An example of the relation between the contents of the setting and change of the conditions which are presumed in the recipe formation and the processing items which are necessary in the recipe forming mode in this instance will now be described hereinbelow. In case of newly forming the condition files with respect to both the kind file and the step file, the conditions are inputted with regard to all of the items mentioned above.

In case of forming a recipe with respect to the wafer which is the same kind as the wafer whose recipes have already been formed but whose product steps are different, although the data of the existing kind file can be applied as it is with respect to the chip layout and the memory cell region, the conditions which are optimum for the material and the surface shape of the inspection-subject wafer are set with regard to the other electron beam irradiating conditions, alignment conditions, calibrating conditions, inspection region, filters and threshold value of the image processes, and the like.

In case of changing the alignment mark in the wafer of the product and steps whose recipes have already been formed, it is sufficient to merely change a part of the file such as coordinates of the alignment mark, image to be stored, offset from the origin, and the like.

Therefore, the existing file conditions can be used in common as they are as for the electron beam irradiating conditions, chip layout, calibrating conditions, inspection region, and the like. Further, in case of merely changing the setting of the inspection region, there is no need to load the wafer but only the inspection region is changed and the other inspecting conditions can be used in common. Therefore, there is no need to pass through the unnecessary picture plane.

In the conventional inspection apparatus, when the recipe is formed, changed, or corrected, the wafer has to be certainly loaded into the inspection apparatus. In the embodiment, in case of changing only the numerical values, in order to enable the numerical values to be changed without loading the wafer, as shown in the flowchart of FIG. 12, the presence or absence of the loading of the wafer is selected at the first stage of the recipe formation (step 402) and "only change of numerical values" is designated (step 419). Thus, the kind file and step file which are necessary for inspection can be called and only the numerical values can be changed with respect to the specific parameters which can be coped with by only the change of the numerical values without loading the wafer. When there is a change of the conditions, they are changed (step 420) and the inspection region is designated (step 421). When there is a change of the numerical values of the image processes, they are changed (step 422) and, thereafter, those values are stored (step 423). The processing routine is finished (step 424). By separating the recipe forming sequence for the items in which it is necessary to load the wafer and for the items in which the loading of the wafer is unnecessary as mentioned above, the recipe can be formed and changed without loading the inspection-subject wafer with regard to the items in which the wafer loading is unnecessary.

Figure 13:
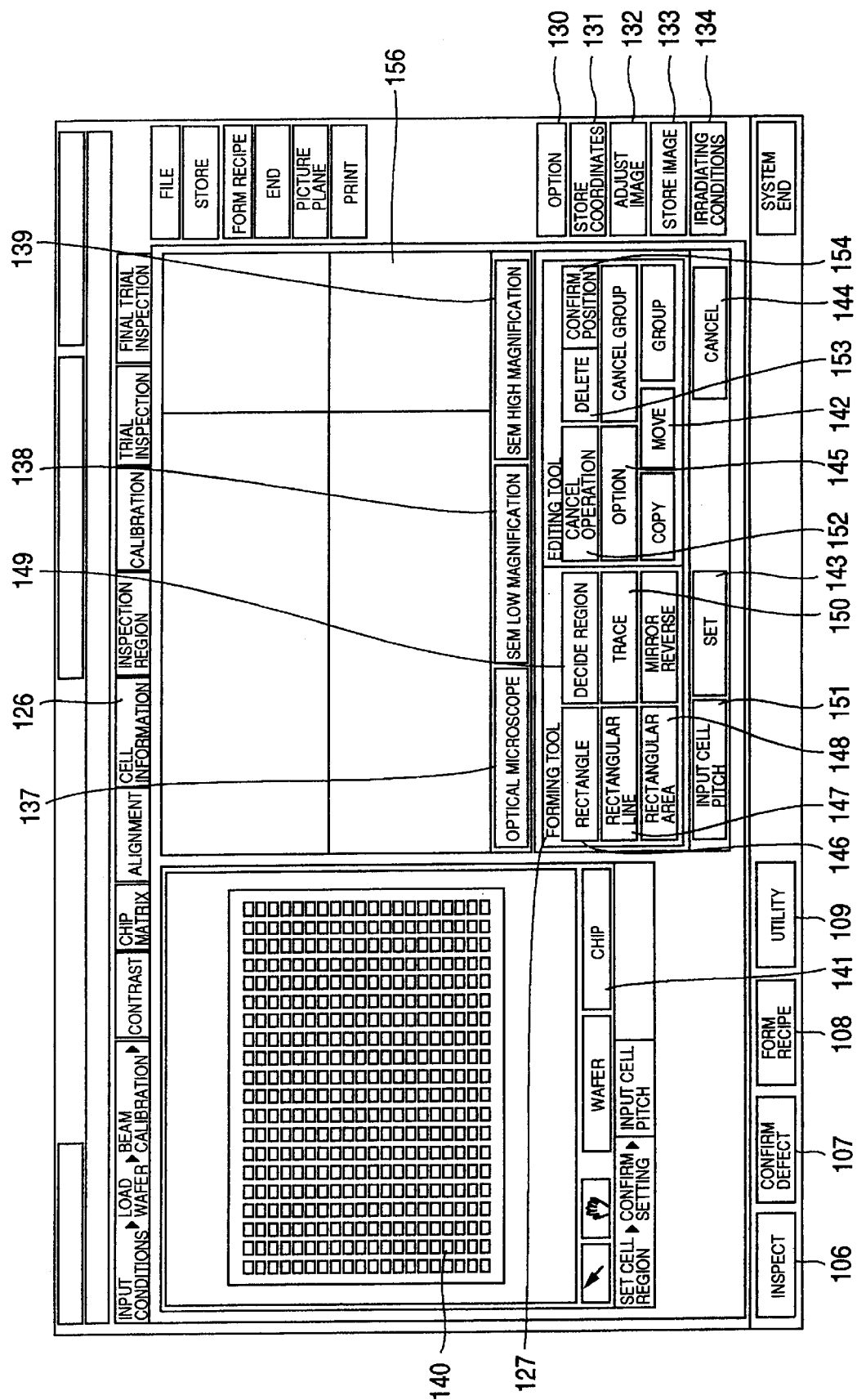
FIG. 13 is a diagram showing a picture plane in the recipe forming mode.

An example of a picture plane in the recipe forming mode of the inspection apparatus of the embodiment will now be described. FIG. 13 is a diagram of a picture plane in the recipe forming mode. In the example of the picture plane, as shown in the region of the selection tab 112 in FIG. 9, all of the series of parameter input contents mentioned above is always displayed in one picture plane in order of the recipe formation. When an arbitrary tab is selected, the corresponding picture plane is displayed together with a color change. That is, the tabs are classified into: a "chip matrix" tab for inputting the chip size and layout; an "alignment" tab for executing the setting of various conditions in the alignment and executing the alignment; a "calibration" tab for designating the pattern for brightness adjustment and executing the brightness adjustment; a "cell information" tab for setting the memory cell region; an "inspection region" tab for setting the inspection region; a "trial inspection" tab for obtaining the image of the small region and deciding the defect detection threshold value; and a "final trial inspection" tab for confirming validity of the threshold value including a variation in the wafer surface. The item names are displayed in a tab format by shifting the item names so that the whole item name region can be seen.

As for the picture plane regarding the tab which is being executed or the tab which is being inputted, a display showing a state where the tab is being executed or it has been selected is performed.

In the example shown in FIG. 13, a "cell information" tab 126 is selected and the picture plane which is at present being inputted is displayed. The tab portion at this time is displayed by changing its background color to a color different from that of the other item names.

Since the tab of the portion in which the input information was changed is displayed in a further different color or different way of indication, the history of the changed portion can be grasped. Therefore, the item which is at present being inputted and the changed item can be displayed at an arbitrary timing, thereby enabling the whole flow to be easily grasped.

The item names of the tabs are displayed in the upper portion of the region 118 in FIG. 10 and arranged separately from the input region in the picture plane, the wafer map, and the work area where the obtained image or the like is displayed, so that the portion of the item names of the tabs can be easily seen and selected.

Although the case where the background color of the picture plane in which the tab indicative of the inspecting operation is being progressed or inputted is made different from that of the other tabs has been described, the invention is not limited to such an example. It is sufficient that a discriminating sense different from that of the other tabs can be expressed. It is possible to use a method whereby a periphery of the tab which is being progressed or inputted is thickly displayed or shadowed or the background is expressed by a hatched region, a dot pattern, or the like.

The items of "load wafer", "electron beam irradiating conditions", and "contrast" among the item names in the tab display region in the diagram are displayed in a format different from the tab formats of the other items such as "chip matrix" and the like. That is, they are merely displayed as indicators showing that tab is at present being progressed. This means that it is impossible to return to those items during the recipe forming operation.

In FIG. 13, a forming tool and editing tool region 127, a "set" button 143, and a "cancel" button 144 are displayed in the lower right portion on the picture plane. When the "set" button 143 is clicked, the input parameters on the picture plane are temporarily registered and the screen is automatically shifted to the next picture plane. Therefore, if predetermined parameters in each picture plane are inputted in order every picture plane to be shifted, a series of recipes can be formed. Since all of the tab portions are displayed, by designating an arbitrary tab, the screen can be freely returned to the picture plane which has already been inputted.

The information which the operator wants to confirm can be displayed any time by an instruction of an option region 130 displayed at the right edge of the picture plane in FIG. 13. In the example of the diagram, by clicking a "store coordinates" button 131, a box (not shown) to input the coordinates of the stored image is displayed and the stored image can be displayed. The option region 130 is displayed in accordance with the state of the displayed picture plane in a manner such that when it can be used, it is displayed by black characters and when it cannot be used, it is displayed in gray.

In the conventional inspection apparatus, the recipe forming sequence is fixed and when the input is once completed, the screen cannot be returned to the picture plane which has already been inputted. Therefore, with respect to the already inputted portion, it is impossible to change the inputting order, skip the input items, or confirm again the numerical values of the input items or the like, it is necessary to once finish the recipe formation and restart it. Since all of the items on the picture plane to which the screen is shifted by the sequence are not displayed, it is difficult to grasp the position or progress of the present item in the whole flow.

In another example of the conventional apparatus, the input items are finely divided and there is a tree structure having a submenu with respect to one item and a sub submenu with respect to the further detailed item, and the whole picture plane is switched. If the processing routine once enters the submenu, therefore, unless the screen is returned one by one to the original picture plane, it is impossible to shift to the next item. If the submenu is displayed, since the main menu is not displayed, it is difficult to recognize the progress and positioning of the item which is at present being inputted.

Figure 14:
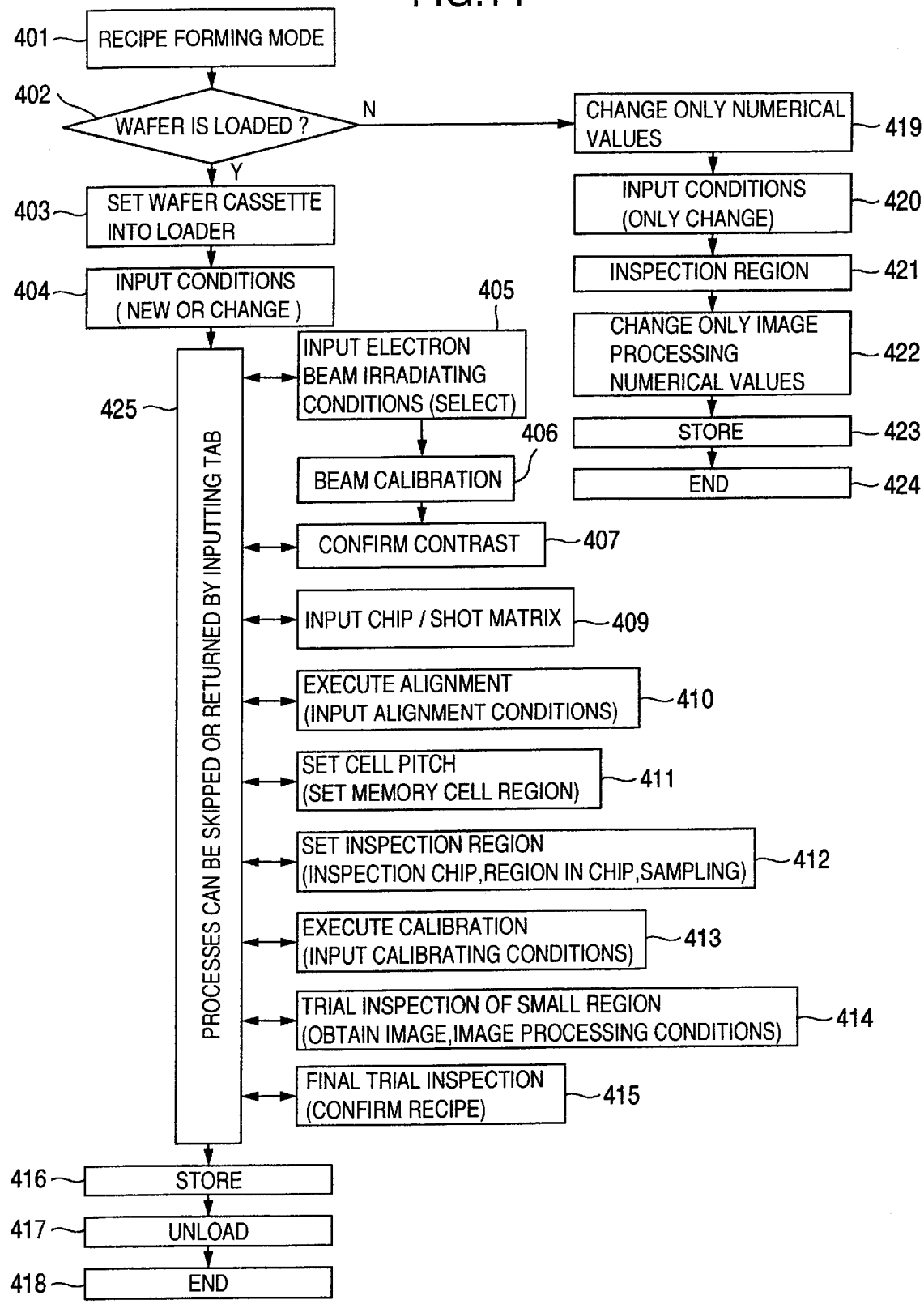
FIG. 14 is a flowchart showing the recipe forming procedure.

FIG. 14 is a flowchart showing a recipe forming procedure in case of the inspection apparatus of the embodiment and shows the details of picture plane layers in the embodiment. In the embodiment, as mentioned above, the present input item and the whole flow are displayed in the tab format as shown in FIG. 9 so that they can be always discriminated. As shown in the flowchart of FIG. 14, the processes of the items (steps 405 to 415) can be skipped or returned by inputting a tab as parallel layers with respect to the tab display portion (step 425). Therefore, for example, with respect to one item such as cell region setting (step 411) which needs to be inputted, the picture plane construction such that the input is completed in one picture plane, namely, it can be inputted without switching to the conventional submenu picture plane is used.

In the inspection, it is necessary to set the cell region as an inspection target region. The third embodiment of the invention will now be described hereinbelow.

FIG. 13 mentioned above shows a map picture plane in a map which is used to set the cell information. Any of an optical microscope image, an SEM type low magnification image, and an SEM type high magnification image can be designated by clicking any of the "optical microscope" button 137, "SEM low magnification" button 138, and "SEM high magnification" button 139. On the picture plane of the cell information, the cell region arranged in a map-in-chip 140 displayed on the left side in FIG. 13 is set while designating it on the image. Further, a cell pitch in the cell region is inputted.

An "adjust image" button 132, a "store image" button 133, and an "irradiating conditions" button 134 in the option region 130 in FIG. 13 are displayed when the actual picture plane is displayed in an image display portion 156.

FIG. 15 is a diagram showing a part of the picture plane in the recipe forming mode. When the "irradiating conditions" button 134 in the option region 130 in FIG. 13 is clicked, an irradiating condition display region 92 shown in FIG. 15 is displayed. An acceleration voltage and a beam current can be designated in an electron beam irradiating condition input region 93. The number of signal adding times and a pixel size can be designated in a signal obtaining input region 94. The number of signal adding times denotes the number of times in case of scanning the wafer by the electron beam. The pixel size denotes a size of pixel of an image which is formed from the signal obtained by the secondary electron detector 35 shown in FIG. 2, namely, a length of one side. A pixel smaller than a beam diameter of the electron beam can be selected. Therefore, even if a width of circuit pattern differs on one chip, the size of pixel can be designated in accordance with the width of the circuit pattern, so that a high efficiency of the inspection time can be realized.

To display the setting picture plane of the cell region shown in FIG. 13, a chip to set the cell region is selected by clicking the mouse or the like from the picture plane displayed on the wafer map displayed on the inspection region designating region 119 shown in FIG. 10. Subsequently, by clicking a "chip" button 141, the screen is switched to the picture plane of the map in the selected chip shown in FIG. 13. Or, the screen can be also switched to the picture plane of the map in the chip by double-clicking the chip as a setting target.

The set cell region is displayed in the map-in-chip 140 shown in FIG. 13. To move the wafer, for example, it can be moved by using a keyboard or a joy-stick or by clicking a "move" button 142 in the forming tool and editing tool region 127. A desired chip on the map-in-chip 140 can be moved to the relevant position by clicking the mouse.

The cell region can be set by clicking a desired button in the forming tool and editing tool region 127. If the user wants to see the image by the optical microscope concerning the cell region set on the map-in-chip 140, the "optical microscope" button 137 and "set" button 143 are clicked. Thus, the image by the optical microscope is displayed in the image display portion 156. Similarly, an SEM image of a low magnification is displayed by clicking the "SEM low magnification" button 138 and an SEM image of a high magnification is displayed by clicking the "SEM high magnification" button 139.

In case of deleting all of the contents set on the cell information picture plane shown in FIG. 13, the "cancel"

button 144 is clicked, so that the screen is returned to an initial state of the cell information picture plane.

Figure 16:
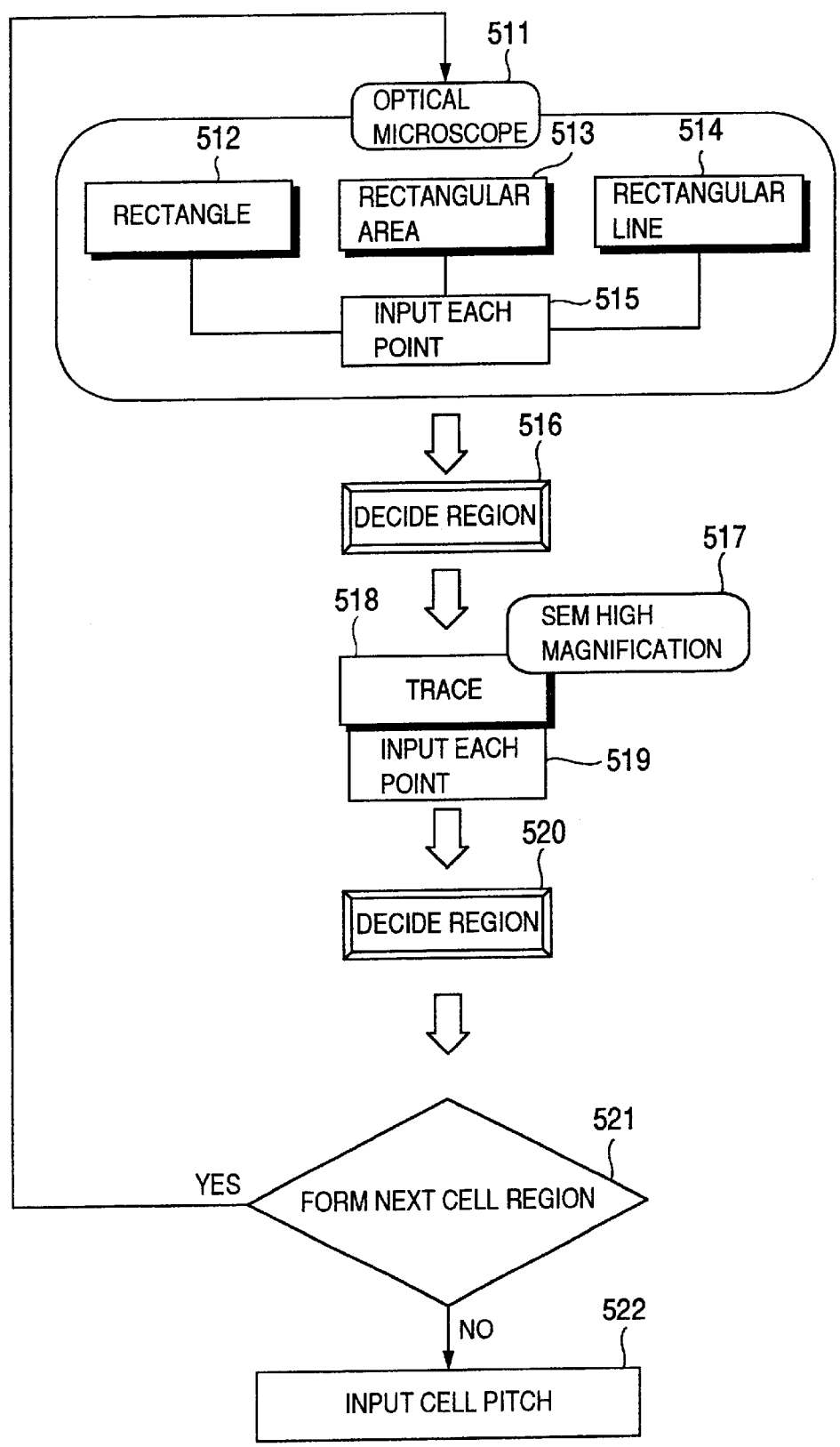
FIG. 16 is a flowchart showing a recipe forming procedure.

FIG. 16 is a flowchart showing a method of designating the cell region by using a desired button in the forming tool and editing tool region 127 in FIG. 13. In FIG. 16, points to set the region are inputted (step 515) by clicking any of a "rectangle" button 146 (step 512), a "rectangular area" button 148 (step 513), and a "rectangular line" button 147 (step 514) shown in FIG. 13 as tool buttons which are used in the "optical microscope" image (step 511). Subsequently, a region (or figure) of the inputted points is decided (step 516) by clicking a "decide region" button 149.

By clicking a "trace" button 150 and clicking the "SEM high magnification" button 139, the image which is specified by the points of the decided region is inputted again (step 517). The image is traced (step 518) by clicking the "trace" button 150. Thus, each point is inputted (step 519). The region (or figure) of the inputted points is determined (step 520) by clicking the "decide region" button 149.

Whether the next cell region is formed or not is subsequently discriminated (step 521). If it is formed (YES), the processing routine is executed again from the step of inputting each point. When the processing routine advances to a step next to the step of forming the region (NO), an "input cell pitch" button 151 is clicked and a cell pitch is inputted (step 522).

Figure 17:
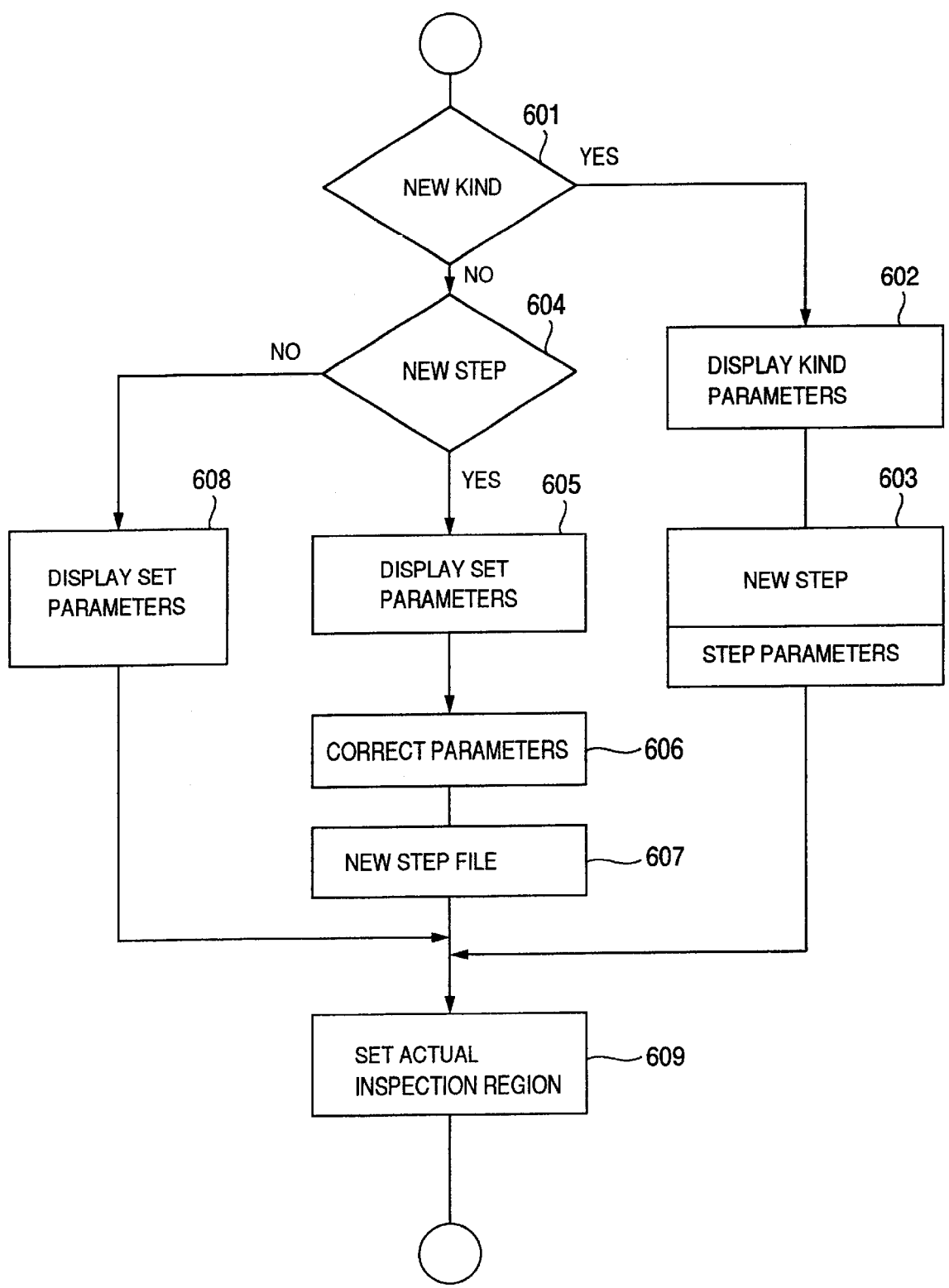
FIG. 17 is a flowchart showing a recipe forming procedure.

FIG. 17 is a flowchart showing a method of adding the kind file and step file in the case where there are a new kind and a new step.

The circuit pattern inspection apparatus in the embodiment has means for grouping the files comprising the chip matrix, cell region, electron beam irradiating conditions, calibrating conditions, alignment conditions, inspection region, sensitivity conditions, and OK/NG discriminating file. The circuit pattern inspection apparatus is determined so as to construct the kind file by the chip matrix and the cell region file and construct the step files by the remaining files. Parameters about each file are set as a structure having the step files at a level lower than that of the kind file. The cell region file comprises the number of cell regions, cell region coordinates, and cell pitch file.

In FIG. 17, whether a new inspecting request relates to a new kind or not is discriminated (step 601). If it is the new kind (YES), the kind parameter is displayed (step 602) and a file of the new step is formed (step 603). If it is not the new kind (NO), whether the step is a new step or not is discriminated (step 604). If it is the new step (YES), the set parameters are displayed (step 605) and the parameters are changed, namely, corrected (step 606), thereby forming a new step file (step 607). If it is not the new step (NO), the set parameters are displayed (step 608).

The actual inspection region is set (step 609) on the basis of the parameters set as mentioned above.

The new step file can be formed by displaying the set parameters and correcting them, namely, by a mere correction without newly forming a step.

Figure 18:
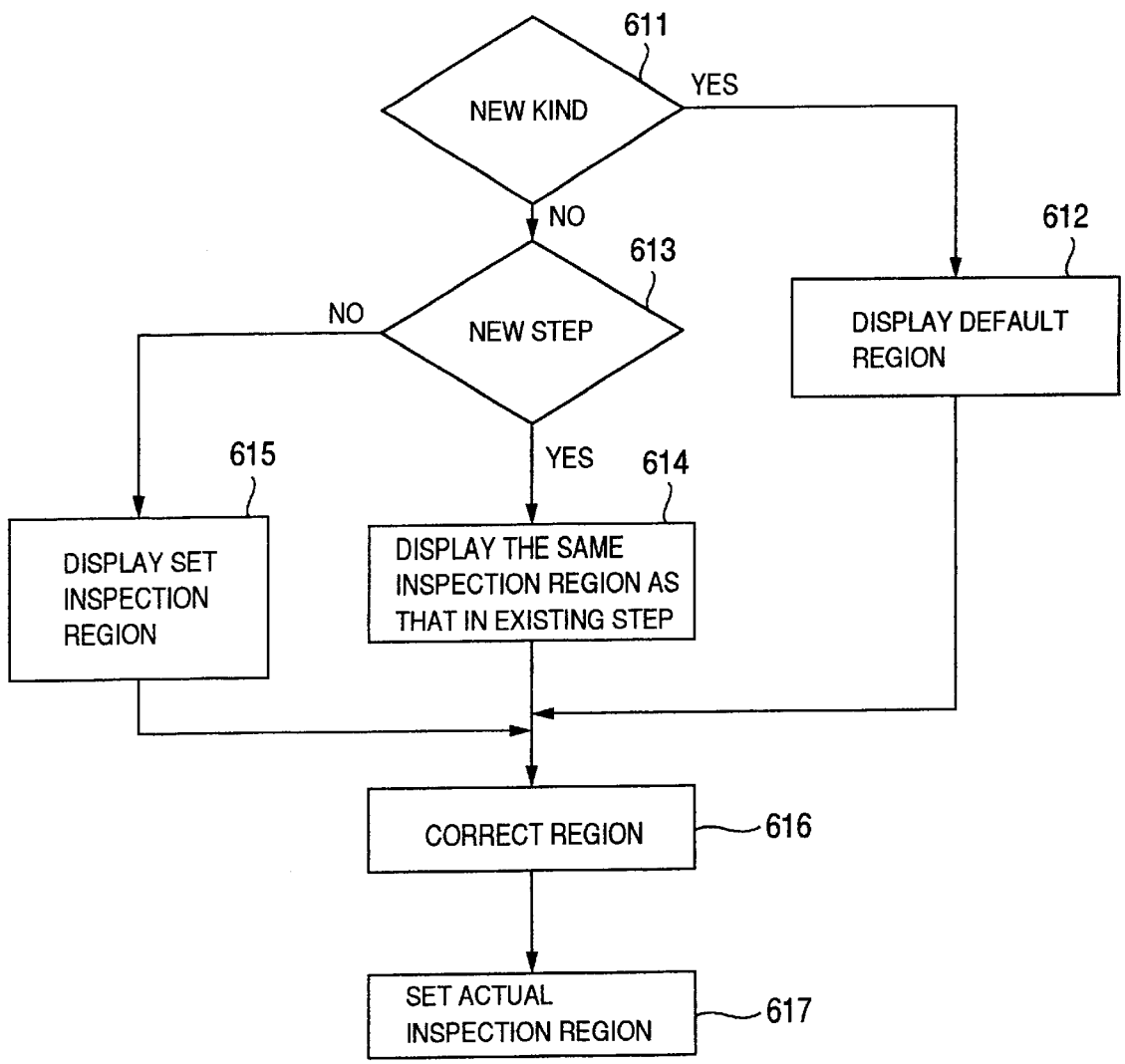
FIG. 18 is a flowchart showing a displaying and setting procedure of an inspection region.

FIG. 18 is a flowchart showing a procedure for displaying and setting the inspection region.

In FIG. 18, whether the new inspecting request relates to a new kind or not is discriminated (step 611). If it is the new kind (YES), a default region is displayed (step 612). If it is not the new kind (NO), whether the step is a new step or not is discriminated (step 613). If it is the new step (YES), the same inspection region as that in the existing step is displayed (step 614). If it is not the new step (NO), the set inspection region is displayed (step 615). The displayed region is corrected (step 616) and the actual inspection region is set (step 617).

In the region correction in step 616, for a preset inspection region, a new inspection region can be set by changing it.

A method of using the forming tool shown in FIG. 13 will now be described.

The forming tool shown in the forming tool and editing tool region 127 in FIG. 13 mentioned above intends to form information of the cell region by tracing the cell region from the "optical microscope" image, namely, the image of the optical microscope by using the mouse or the like. In the forming tool, the actual coordinates are calculated on the basis of the coordinates designated on the image and the present position of the wafer. The "rectangle" button 146, "rectangular line" button 147, and "rectangular area" button 148 are used to set the cell region by inputting the points from a superimposed picture plane. A method of setting the cell region by those button operations will now be described hereinbelow.

Figure 19:
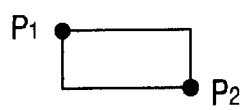
FIG. 19 is a conceptual diagram showing a setting method of a cell region.
Figure 20:
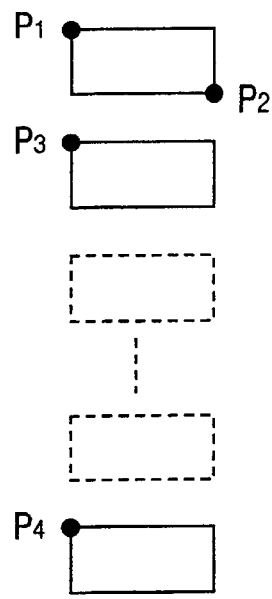
FIG. 20 is a conceptual diagram showing a setting method of a cell region.
Figure 21:
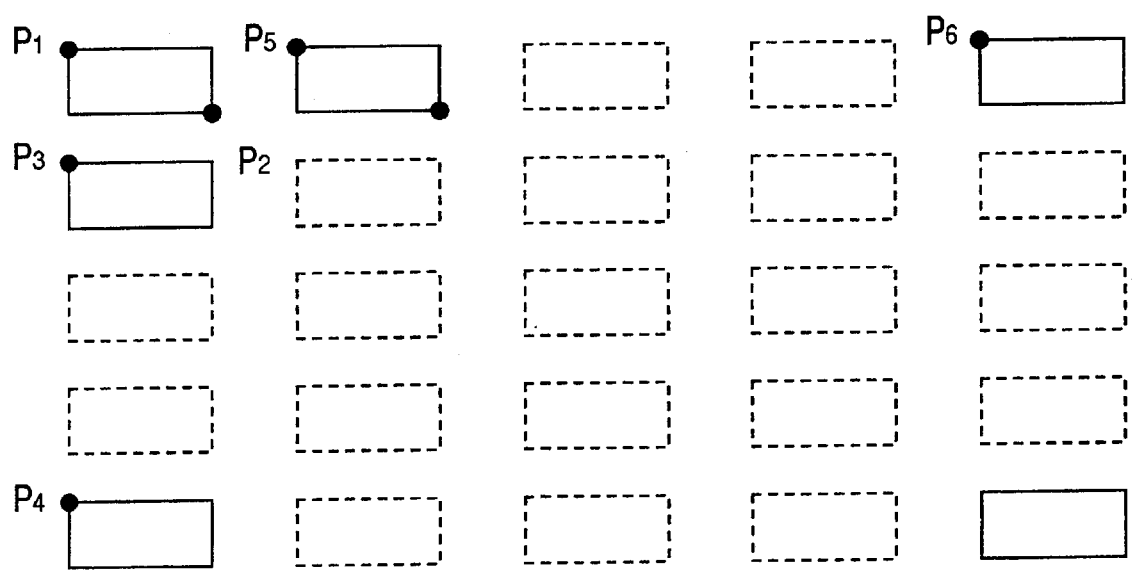
FIG. 21 is a conceptual diagram showing a setting method of a cell region.

FIGS. 19 to 21 are conceptual diagrams showing the method of setting the cell region.

(a) Rectangle

In case of a rectangle, two diagonal points of a rectangle showing the cell region are inputted as shown in FIG. 19. The cell region can be decided by inputting an upper left point P1 and a lower right point P2.

(b) Rectangular Line

As for a rectangular line, as shown in FIG. 20, after two diagonal points of the rectangle showing the cell region are inputted, the other two points are inputted and a plurality of cell regions of the same size as that of the rectangle can be set. A rectangular line region can be decided by inputting the upper left point P1 of the first region, inputting the lower right point P2 of the first region, inputting an upper left point P3 of the next region, and inputting an upper left point P4 of the last region.

(c) Rectangular Area

As for a rectangular area, as shown in FIG. 21, after two diagonal points of the rectangle showing the cell region are inputted, by inputting the other four points and setting rows and columns, a plurality of cell regions of the same size as that of the rectangle can be set. A rectangular area region can be decided by inputting the upper left point P1 of the first region, inputting the lower right point P2 of the first region, inputting an upper left point P3 of the region of the next row, inputting an upper left point P4 of the region of the last row, inputting an upper left point P5 of the region of the next column, and inputting an upper left point P6 of the region of the last column.

(d) Decide Region

The formed figure is decided by clicking the "decide region" button 149 shown in FIG. 13 mentioned above. Before decision, the inputted coordinates can be returned to the original coordinates each time a "cancel operation" button 152 is clicked once.

(e) Trace

"Trace" is a function to form data of high precision by inputting again the cell region data inputted on the "optical microscope" image by clicking the "SEM high magnification" button 139. When the "trace" button 150 shown in FIG. 13 is clicked, the image is automatically switched to the SEM image and a target point is moved to the first input coordinate point of the data which was inputted by the "optical microscope" image and whose region was decided before. The coordinates are inputted again in accordance with a guidance. When the re-input of all coordinate points is completed, the "decide region" button 149 is clicked. So long as a timing before the "decide region" button 149 is pressed, by clicking the "cancel operation" button 152, the coordinates can be returned backward to the trace coordinates by the number of times as many as the number of clicking times.

(f) Cancel Operation

At a timing before the figure is decided by the "decide region" button 149, the inputted coordinates can be returned to the trace coordinates by the number of times as many as the number of clicking times by clicking the "cancel operation" button 152.

(g) Delete

The mode is switched to the object selection in the display state of the map-in-chip. By selecting a figure in the map by the mouse (the color of the frame of the figure changes to red) and clicking a "delete" button 153, the figure can be deleted.

(h) Option

An "option" button 145 is a future button for expansion.

(i) Input Cell Pitch

Prior to inputting the cell pitch, a chip of the wafer is moved to the position to input the cell pitch on the "optical microscope" image. Subsequently, the "input cell pitch" button 151 is clicked. So long as the "optical microscope" image, it is automatically switched to the "SEM high magnification" image. The position of the cell is inputted from the image.

(j) Confirm Position

By clicking a "confirm position" button 154, corner portions of the designated cell region are displayed on the image of the image display portion 156 by marks such as circles or the like, so that the designated range of the cell region can be confirmed on the actual picture plane. If it is deviated on the actual picture plane, the deviation can be corrected by clicking the "move" button 142 and designating a target region.

(k) Set

In case of deciding the contents set on the cell information picture plane, the screen is switched to the inspection region by clicking the "set" button 143.

(l) Cancel

In case of cancelling all of the contents set on the cell information picture plane, the "cancel" button 144 is clicked. The screen is returned to the initial state of the cell information picture plane.

(m) Other Setting Means of Cell Region

A function which can perform the setting by the copy or trace-back can be provided in addition to the movement and deletion described above. It is also possible to provide a function which can perform the setting of the grouping of the cell regions or the movement, deletion, or copy of the grouped cell regions. As a function of the forming tool, it is possible to provide a function to symmetrically set the rows, column, or cell regions as combinations of them by a mirror reverse. The specific setting means of the cell region are summarized as follows.

(A) Setting of rectangle, rectangular line, rectangular area, and mirror reverse
(B) Setting by copy, deletion, movement, and the trace-back using the tracing function
(C) Setting of copy, deletion, and movement by the grouping function of the cell regions It is possible to arbitrarily select one or two or more set items which are displayed in (A), (B), and (C) and form the cell regions with respect to them. Any of (A), (B), and (C) can be selected. Further, although the inside of the rectangular area or the like is the inspection region in the above example, contrarily, the outside of the rectangular area or the like can be used as an inspection region. Such a method can be realized by displaying a check box (not shown) for asking whether the inspection region is the inside or outside when the "decide region" button 149 is clicked.

The contents of the cell regions can be independently set and stored every plural cell regions. Therefore, by calling the stored set contents of the cell regions when the cell region is set, the inspection by the same cell region set contents as those used before can be easily performed. Since there is no need to newly form the cell region set contents every time, the inspection time can be reduced.

Such a setting of the cell region can be performed by not only the "SEM" image but also the "optical microscope" image. The invention can be also obviously applied to not only the circuit pattern inspection apparatus according to the embodiments but also a wafer inspection apparatus using a laser beam.

Procedures for the trial inspection and the final trial inspection will now be described hereinbelow as a fourth embodiment of the invention.

After the input of the recipe conditions described in FIGS. 8 and 9, when the "load wafer" button 116 in FIG. 9 is selected, if the kind and step information has already been set, the kind and step information is read as conditions of default. In case of new information, initial values set in the system are read as conditions of default. The wafer is loaded in accordance with the kind and step information. After completion of the loading, various settings for the trial inspection and various settings for the final trial inspection to finally confirm the set inspecting conditions are performed.

Figure 22:
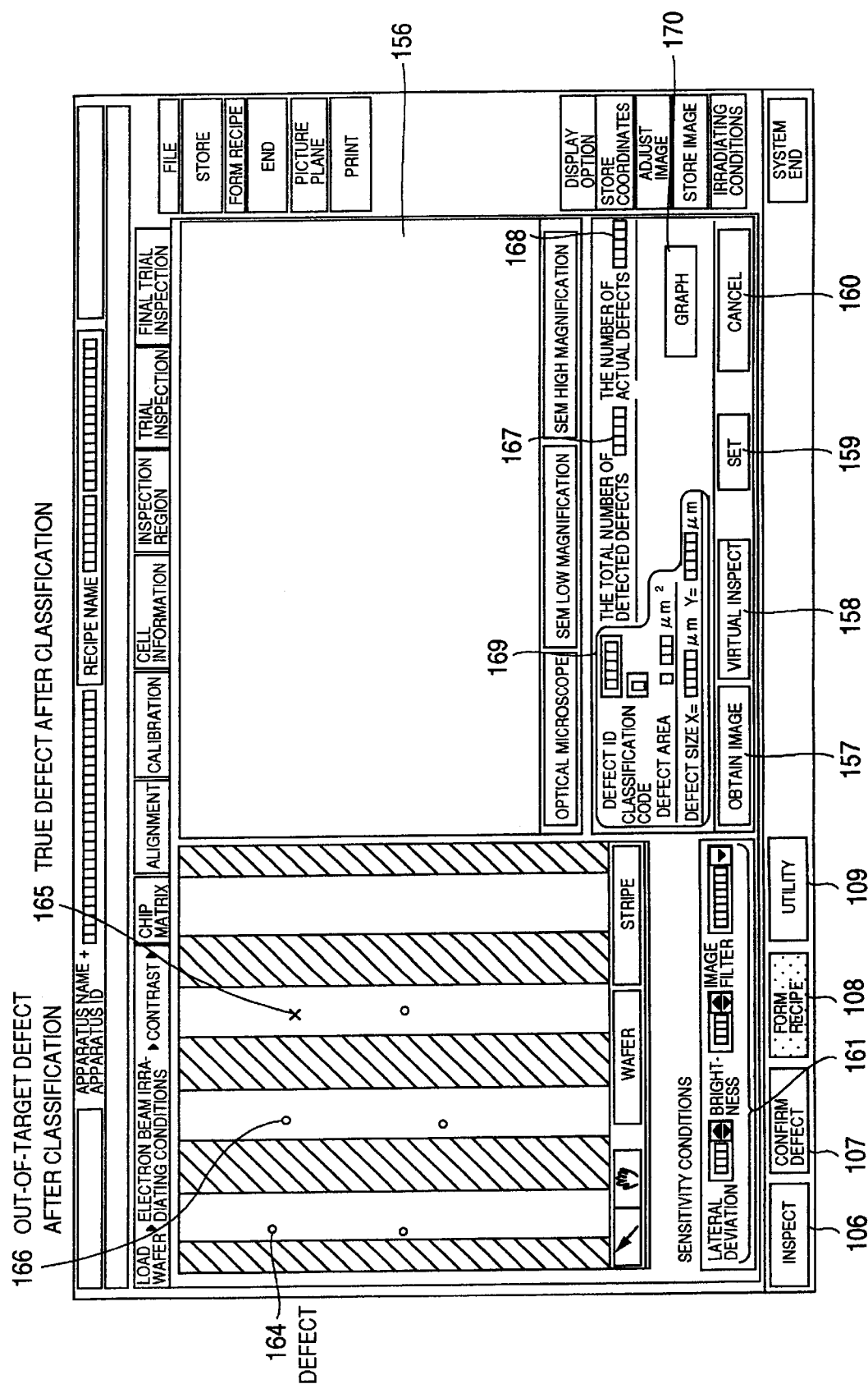
FIG. 22 is a diagram showing a trial inspection picture plane.

FIG. 22 is a diagram of the trial inspection picture plane. By clicking the "inspection region" tab 117 in the selection tab 112 shown in FIG. 9 which was validated after completion of the wafer loading, the center portion on the left side of the picture plane shown in FIG. 22 is changed to the picture plane for wafer map display. When the position of the stage is changed by clicking a point on the wafer map, the stage is moved and the chip image of the optical microscope is moved. By clicking a "obtain image" button 157, the image of the trial inspection of the chip at the position after the change is obtained. In the trial inspection, the image of only one stripe of the electron beam width is obtained instead of the whole region of the chip.

Although a stripe-shaped map is displayed in the left half of the picture plane, it is illustrated on the drawing for the purpose of simplicity of explanation in a manner such that in the region of one chip, one stripe region which is elongated in the Y direction from which the image was obtained is shown in white and the other stripe regions are shown as hatched portions. Extracted defects 164 are displayed in the picture plane.

In the picture plane, there are displayed: a total detected defect number display region 167 for displaying the total number of detected defects; an actual defect number display region 168 for displaying the number of actual defects; and information such as defect ID, classification code, defect area, defect size, and the like of each defect. A defect information display region 169 in which the classification code can be inputted and a "graph" button 170 to call a graph display option are also arranged in this picture plane.

The positions of the extracted defects are displayed by, for example, small circle points as shown in the defect 164 in FIG. 22. By clicking this point, the image of the defect is displayed in the image display portion 156 on the right side of the picture plane and various information of the defect is displayed in the defect information display region 169. By inputting the classification code in the defect information display region 169, as shown in the diagram, a plurality of defects 164 on the stripe map are classified into true defects 165 after the classification as shown by X points or out-of-target defects 166 after the classification as shown by square points. The number of actual defects in the actual defect number display region 168 is changed to the total number of true defects 165 after the classification. The total number of detected defects in the total detected defect number display region 167 is changed to the value obtained by subtracting the number of out-of-target defects 166 after the classification from the number of detected defects.

The true defects 165 after the classification which were once set and the out-of-target defects 166 after the classification are stored. At the time of the subsequent inspection, the classification code of the true defects 165 after the classification of the present time is preliminarily allocated to the defects existing in a range of a predetermined distance from the present true defects 165 after the present classification.

The click of the defects 164 on the stripe map and the input of the classification code as mentioned above are repeated. A distribution of the defects on the stripe map, the number of classified defects displayed in the total detected defect number display region 167, and the number of true defects displayed in the actual defect number display region 168 are referred to. As mentioned above, the operator can discriminate whether the defect to be inherently detected has been detected or the surplus defects are not detected.

When it is determined that the inspecting conditions are improper as a result of the discrimination, the inspecting conditions are set again in a "sensitivity conditions" setting region 161. The inspection is executed again by clicking a "virtual inspection" button 158. By repeating those operations, the inspecting conditions suitable for inspection are searched. When the confirmation of the conditions at one position is finished, the picture plane is displayed in a map showing the whole wafer as necessary. The image display region is switched to the "optical microscope" image display in the optical microscope, a condition setting position is selected again, and the operations in a range from the image obtaining step to the condition setting step are repeated.

When those conditions are determined to a certain extent, an image shown in FIG. 23 is displayed by clicking the "graph" button 170 shown in FIG. 22. FIG. 23 is a diagram of a graph display image of defects. A 3D graph 171 is displayed on the right side of the picture plane. In the 3D graph, an X axis indicates a lateral deviation, a Y axis shows brightness, and a Z axis represents a difference between the number of true defects after the classification or the total number of defects and the number of out-of-target defects after the classification. Values of the lateral deviation and the brightness are set in the "sensitivity conditions" setting region 161 in FIG. 22. An inspecting condition setting range for drawing a graph and a graph range setting step are displayed in a "virtual inspection" region 172 in FIG. 23. A "calculate" button 173 to instruct the drawing of the graph and a "return" button 174 to return from the graph option are arranged.

First, in FIG. 22, when sensitivity conditions are set in the "sensitivity conditions" setting region 161, the set values are displayed as initial values in the "virtual inspection" region 172 in FIG. 23. An initial value "1" is displayed as the number of steps. The operator rewrites the set values in the "virtual inspection" region 172 and clicks the "calculate" button 173. By this click, the image processing conditions are sequentially changed in the set range in the set step and the following processes are executed. That is, the stored digital images are processed under the set conditions and the defects are extracted and stored into a defect buffer. Subsequently, the contents in the defect buffer are read out. When a distance (comparison difference) between each defect and the defect which has already been classified is equal to or less than a predetermined value, the classification which has already been allocated to the classified defect is allocated to each defect. After the classification is allocated, a difference between the number of true defects or the total number of defects and the number of out-of-target defects after the classification is obtained and set to defect number data of the present inspecting condition. After completion of the processes, the 3D graph 171 is displayed.

Although the display picture plane of the 3D graph of the number of defects is shown in FIG. 23, a range where the number of true defects is the maximum value and the difference between the total number of defects and the number of out-of-target defects after the classification is equal to the number of true defects and a center of the range can be obtained and displayed together as an inspection possible inspecting condition and a differential inspecting condition. By this display, the inspecting conditions can be more visually instructed.

Figure 25:
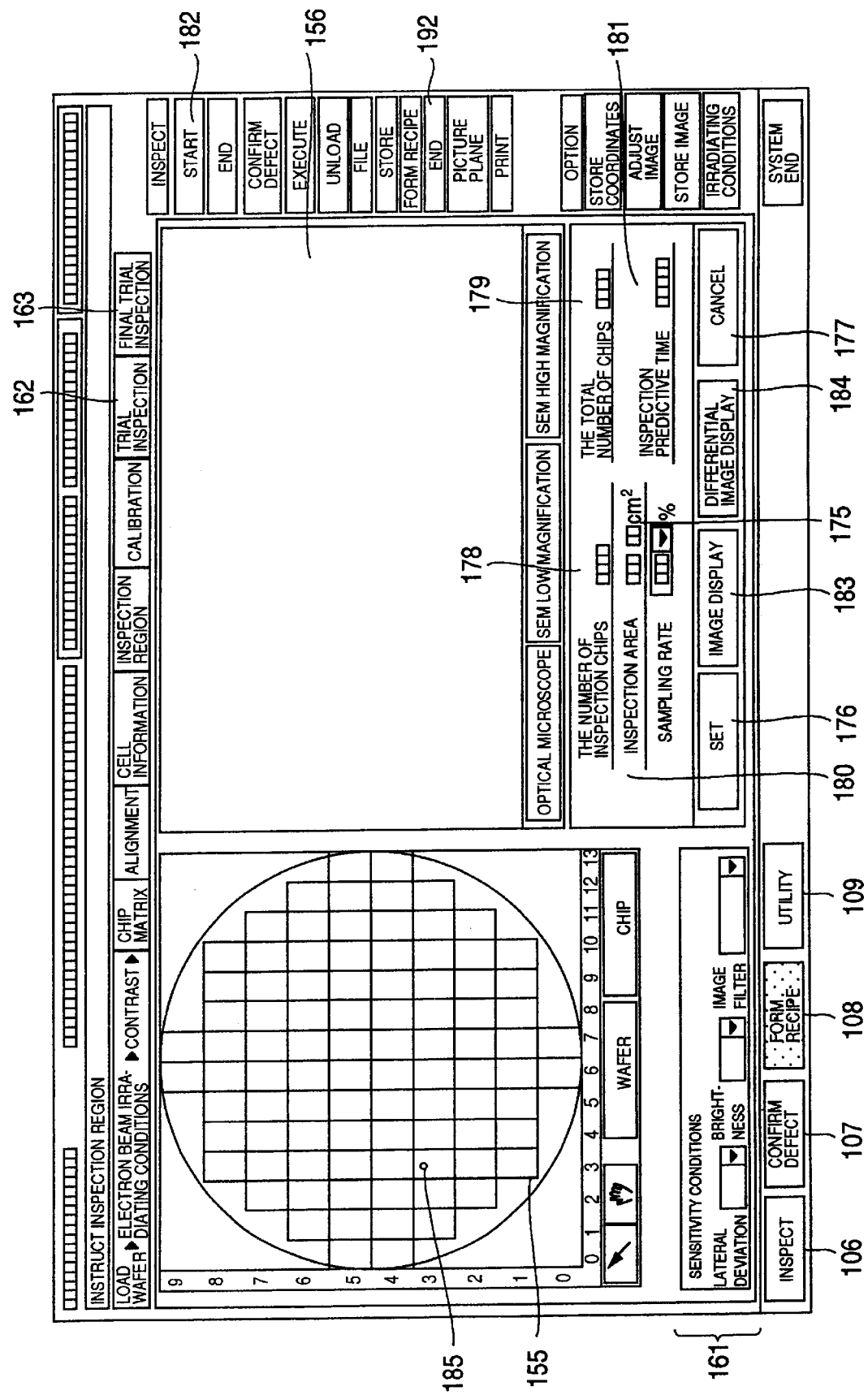
FIG. 25 is a diagram showing a final trial inspection picture plane.

A picture plane shown in FIG. 25 is displayed by clicking a "final trial inspection" tab 163 which was validated after completion of the wafer loading in FIG. 9. FIG. 25 is a diagram of final trial inspection picture plane.

This diagram relates to the set picture planes of the chip for trial inspection and are used to confirm recipe data by performing the same processes as those of the actual inspection on the basis of the formed recipe. In FIG. 25, there are arranged: a wafer map 155; a "sampling rate" setting region 175 to set a sampling rate; a "set" button 176 to validate the inspection target chip and the sampling rate; a "cancel" button 177 to cancel the setting; a "the number of inspection chips" display region 178; a "total number of chips" display region 179; an "inspection area" display region 180; and an "inspection predictive time" display region 181.

The final trial inspection is started by clicking a "start" button 182 of the inspection region at the right edge of the picture plane. When the inspection and the defect confirmation are completed, the screen is returned to this picture plane.

First, a display picture plane is formed and the image is obtained and displayed by the set recipe. The optical microscope image is switched to the SEM image and the image display is started.

In the wafer map operation, the inspection target region is turned on/off by clicking the left button of the mouse or forming a rectangular area by drag on the wafer map 155 in FIG. 25. At the same time, the number of inspection chips and an inspection area are calculated and displayed. Further, an inspection predictive time is roughly calculated and displayed.

The sampling rate is a rate at which the inspection region is thinned out. When the sampling rate is inputted in the "sampling rate" setting region 175, the inspection area and an inspection predictive time are calculated and displayed again. As default values of the sampling rate, 100%, 50%, 25%, 12.5%, 6.25%, and 3.175% are prepared.

Figure 24A:
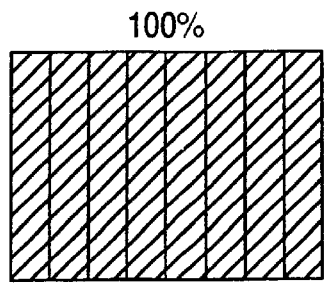
FIGS. 24A to 24C are diagrams showing inspection regions each showing the number of scans of an electron beam.
Figure 24B:
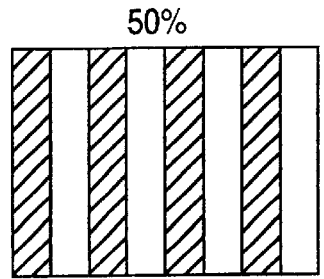
Figure 24C:
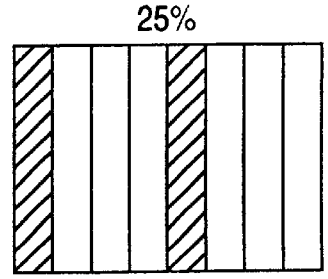

FIGS. 24A to 24C are inspection region diagrams each showing the number of beam scanning lines. The sampling rate and the ratio of the number of beam scanning lines in the inspecting range are made correspond to each other. FIG.

24A shows a case where 100% is designated and the whole inspection region is scanned by the beam. FIG. 24B shows a case where 50% is designated and the beam scanning stripes in the inspection region are scanned every other stripe. FIG. 24C shows a case where 25% is designated and the beam scanning stripes in the inspection region are scanned every fourth stripe. As mentioned above, when it is determined that even in the inspection region, if there is no need to judge the presence or absence of the defect and obtain the image and scan the beam, the inspection time can be reduced by thinning out the inspection region.

By clicking a "set" button 159 in FIG. 22, a calibration is executed and the screen is switched to the trial inspection picture plane of FIG. 25. By clicking the "set" button 159, the set data is stored. By clicking a "cancel" button 160, the set data is abandoned and set to the initial state.

The trial inspection picture plane and the final trial inspection picture plane are also the picture plane shown in FIG. 25 and can be distinguished by displaying either a "trial inspection" tab 162 or the "final trial inspection" tab 163 in a different color. The same processes as those in the actual inspection are performed on the basis of the recipe formed by the foregoing method and whether the recipe data is good or not is confirmed.

In the initial state, the set inspection target chip and the set sampling rate are displayed in the wafer map 155 and "sampling rate" setting region 175, respectively. Values which are determined by the inspection target chip and the sampling rate are displayed in the "the number of inspection chips" display region 178, "total number of chips" display region 179; an "inspection area" display region 180; and "inspection predictive time" display region 181. The operator inverts "valid/invalid" of the inspection target chip by dragging the region on the wafer map 155 by the mouse or the like and changes the sampling rate by selecting again the sampling rate display in the "sampling rate" setting region 175 from the candidates. By clicking the "set" button 176 after the change, the change is validated. By clicking the "cancel" button 177, the change is cancelled and the picture plane is returned to the initial state. By clicking the "inspect" button 106 after the setting or cancellation, the stripe inspection in the inspecting mode is started. By clicking the "confirm defect" button 107, the defect confirmation is started. The operator confirms the validity of the inspecting conditions on a picture plane for defect confirmation, which will be explained hereinlater. After the confirmation, the screen is returned to the final trial inspection picture plane of FIG. 25.

The whole wafer and the present position of the stage are displayed in the wafer map 155. The image of the optical microscope is displayed in the image display portion 156. The position of the stage is changed by clicking by the mouse or the like in order to select the position to set the conditions on the wafer map 155. The image of the one-stripe inspection is obtained by clicking the "obtain image" button 157.

Subsequently, by setting the conditions in the "sensitivity conditions" setting region 161, an "image display" button 183 to instruct the display of the obtained image and a "differential image display" button 184 to instruct the display of a differential image of a result on the halfway of the image processes are displayed on the picture plane. An image as a result on the halfway of the image processes such as a differential image can be displayed in the image display portion 156 on the right side of the diagram.

For example, by clicking an arbitrary chip on the wafer map 155, displaying the instruction point 185 at that time by a circle, and clicking the "image display" button 183, the obtained image at the instruction point 185 is displayed in the image display portion 156. By clicking the "differential image display" button 184, the result on the halfway of the image processes is displayed in the image display portion 156. When the conditions in the "sensitivity conditions" setting region 161 to set the image processing conditions are changed while the result on the halfway of the image processes is displayed in the image display portion 156, the image is processed again and the result on the halfway is displayed again. Thus, since the sensitivity conditions of the image processes are changed and the image is displayed, the defect to be inherently detected can be detected and, moreover, the operator can discriminate whether the surplus defects are not detected or not. Although the case of displaying the result on the halfway of the image processes has been described, image processes equivalent to them can be performed or image processes which are advantageous for decision of the image processing conditions can be performed and processing results can be displayed. The inspecting conditions can be determined on the basis of the image in the region other than the defective portion in this manner and the conditions can be set at a location without a defect.

Figure 26:
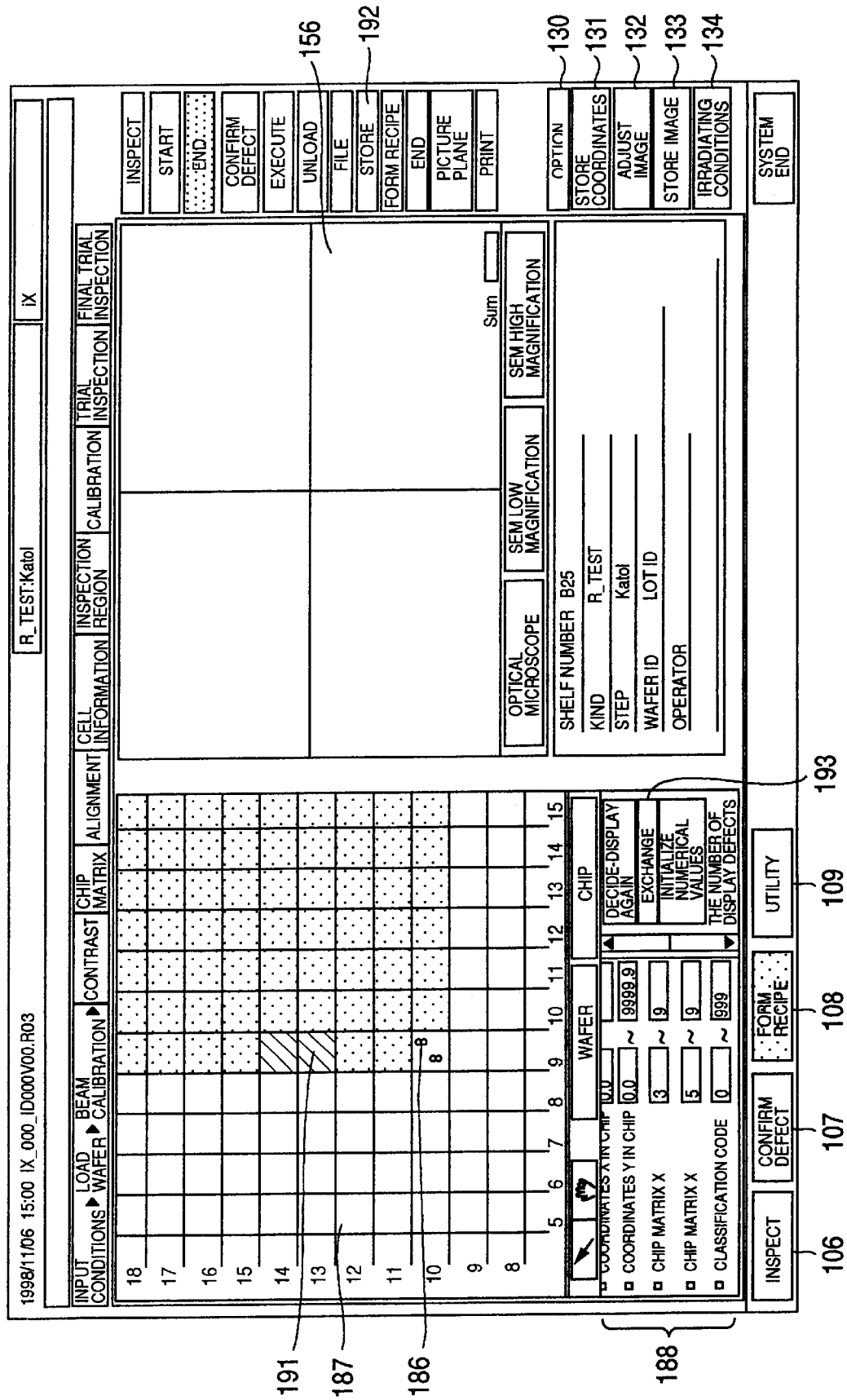
FIG. 26 is a diagram showing a picture plane when a defect is confirmed.

FIG. 26 is a diagram of a picture plane at the time of the defect confirmation in the final trial inspection. On the picture plane, a defect map 187 which enables the position of a defect 186 to be easily confirmed by enlargedly displaying the wafer is displayed on the left side, and the image display portion 156 to display an image of the defect 186 is displayed on the right side. On the picture plane, there are also arranged: a defective filer instructing region 188 for instructing the operation of a defective filter to select the defect 186 displayed on the defect map 187 or exchange the displaying order on the basis of a feature of the defect or a feature of the position distribution; the "adjust image" button 132 for changing an adjusting state of the image displayed in the image display portion 156; the "store image" button 133 for storing the image displayed in the image display portion 156 into a storing device; and a "store" button 192 for storing the result of the trial inspection during the recipe formation.

On the defect map 187, a fact that the defective data could not be hardware processed or software processed can be known by an overflow display 191 in different color or the like.

In the defective filer instructing region 188, a defect information display region 195 shown in FIG. 32, which will be explained hereinlater, and the display can be exchanged by clicking an "exchange" button 193.

In the defective filer instructing region 188, the defects 186 displayed on the defect map 187 can be reduced to the necessary defects by instructing filtering conditions of the defects. In the defect information display region 195 shown in FIG. 32, which will be explained hereinlater, the order of the defects which are displayed can be exchanged and the defects can be sorted in order of high significance. The image corresponding to the designated position of the defect is displayed in the image display portion 156. By clicking the "adjust image" button 132 in the option region 130 as necessary, image processes such as contrast adjustment of the image, signal amount adjustment, flattening of a histogram, focal position adjustment, astigmatic point adjustment, differentiation, and the like or a change of the detecting conditions can be performed. By such an improvement of a picture quality, an image which is displayed can be changed to an image from which necessary information can be easily obtained. Besides the picture quality improvement, it is possible to perform a display of an image histogram, a display of a waveform of the designated portion, a display of an image gradation value, an overlap display of a result of the defect extracting process for the display image, an instruction of the defect position, and a display of image information such as a differential image of a result on the halfway of the defect extracting process or the like.

By clicking the "irradiating conditions" button 134 in the option region 130, the irradiating conditions of the electron beam of the SEM image described in FIG. 15 and the signal obtaining method can be set and the detailed observation of the defect can be executed.

Generally, although the inspection result is not stored during the recipe formation, the inspection result can be stored by clicking the "store" button 192 of the inspection result by the mouse or the like. The stored inspection result can be outputted via a storing device or network to an analyzing apparatus for analyzing compositions of the defect, a reviewing apparatus for observing the defect, or the like. By clicking the "store image" button 133, the image displayed in the image display portion 156 is stored into the storing device together with the inspection result information.

Information which is displayed on the defect map 187 is the defects 186, information of the chip, inspection region, memory cell region, scale showing the size of map at the present stage position, and overflow display 191. The overflow display 191 is displayed in the case where a large quantity of defects or large defects are generated due to a reason such that a flaw or a large foreign matter is deposited on the wafer or the like, so that the hardware processes or software processes cannot be performed. By this display, the operator can know that the defects of the number that is equal to or larger than the number of defects which can be displayed or the defects of a special size exist. He can make a necessary judgment for those defects without being confused by an apparent defect distribution.

The above functions can be applied to not only the defect confirmation in the final trial inspection as one of the steps of the recipe formation or the defect confirmation after the inspection in the inspecting sequence but also all of the inspecting procedures.

The results of the final trial inspection can be stored. This storage can be instructed by clicking the "store" button 192.

The fifth embodiment according to the invention will now be described hereinbelow.

When the recipe is decided as a result of the foregoing final trial inspection, the actual inspection is executed.

Figure 27:
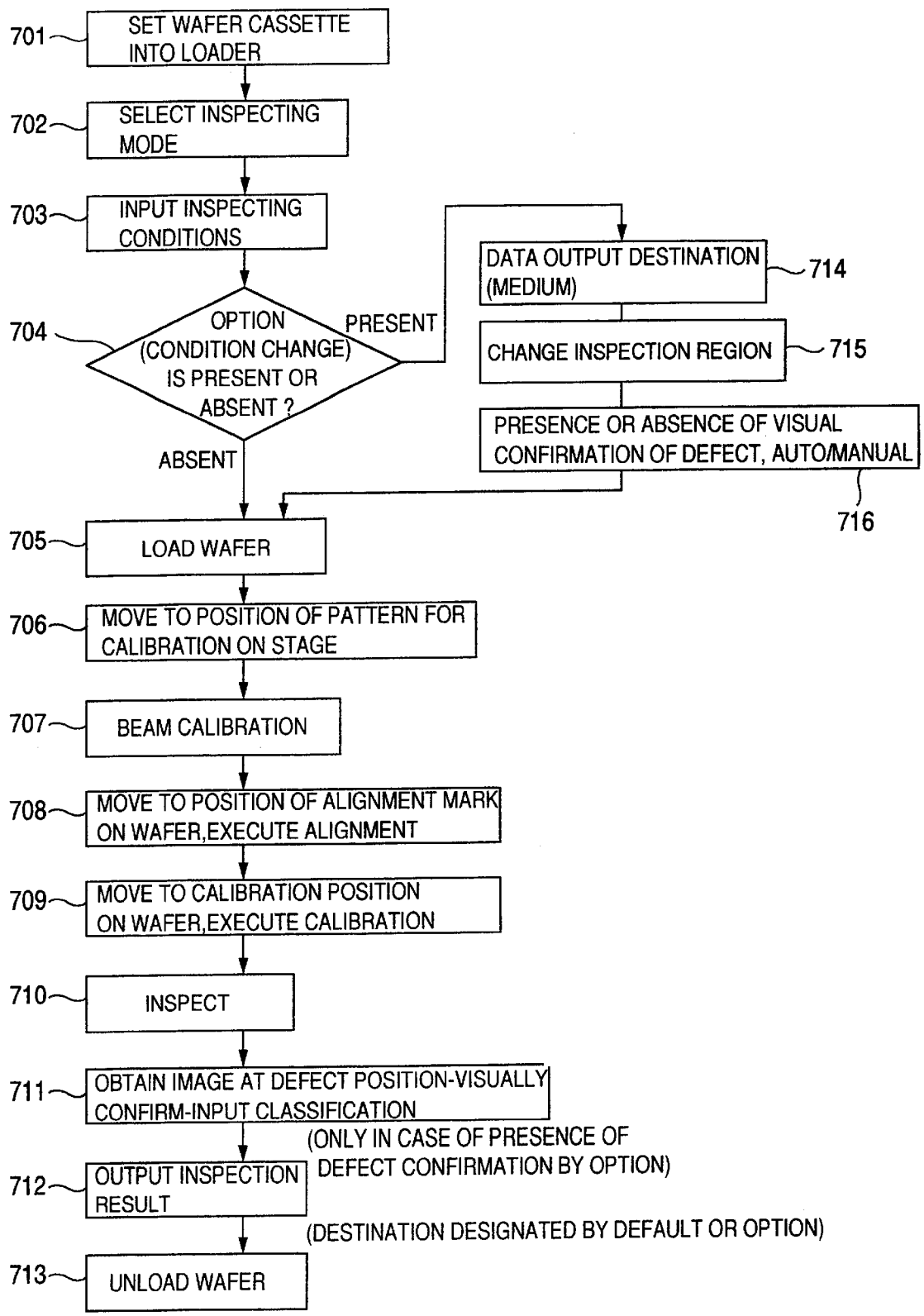
FIG. 27 is a flowchart showing an inspecting procedure.
Figure 28:
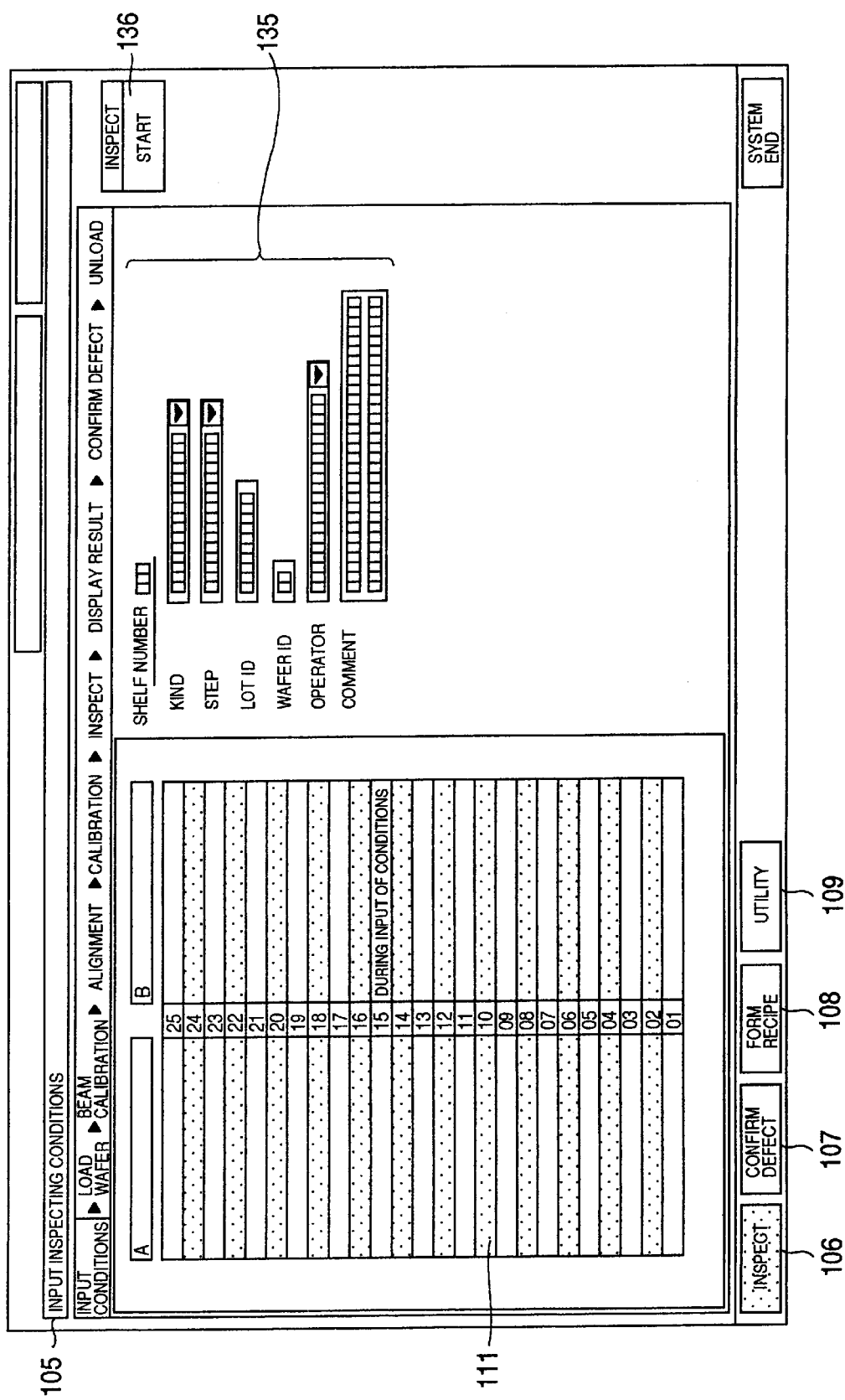
FIG. 28 is a diagram showing a picture plane in an inspecting mode.

FIG. 27 is a flowchart showing the inspecting procedure. FIG. 28 is a diagram of a picture plane in the inspecting mode.

The inspecting mode is designated by clicking the "inspect" button 106 in FIG. 6 and the inspection is started. When the inspection is started, the screen is changed to a picture plane to input inspecting conditions as shown in FIG. 28. In FIG. 28, a message to promote the operator to input the inspecting conditions is outputted in the message region 105 and the cassette display region 111 to display the substrate mounted in the apparatus is displayed. The operator selects one of the cassettes as inspection targets and inputs the inspecting conditions of the substrate corresponding to the selected cassette in an inspecting condition setting region 135. By selecting a "start" button 136 of the inspection after completion of the above operations, the information of the kind file and step file designated by the inspecting conditions is read out, the inspecting conditions are set on the basis of the information, and the wafer is loaded onto the stage.

After completion of the loading, an alignment to measure the position of the pattern and a calibration to measure a detected light quantity are performed on the basis of the pattern information on the substrate.

In FIG. 28, a whole flow of the inspecting sequence, namely, processing items are displayed in processing order in the lower region of the message region 105 in the picture plane. The processing items are classified into nine items such as condition input, wafer loading, beam calibration, alignment, calibration, inspection, result display, defect confirmation, and unloading and they are arranged in order. When the inspecting process progresses, a background of the portion corresponding to the present processing item is displayed in a color different from the background color of the other items. Further, with respect to the further detailed processes in the item name of the item which is being processed, the detailed contents under processing are successively displayed in the message region 105. By those displays, the operator can visually monitor and grasp the progress of the present process at a glance. A fact that there is no generation of an error, namely, the process is progressing without a problem can be confirmed during the process. In the conventional apparatus, since main items are merely displayed by guidance, it is difficult to grasp the whole inspecting flow and grasp to which step the processing routine advances. Since the contents of the guidance are rough, it is difficult to detect a problem even if it occurred in the halfway. Inconveniences on the operations can be solved by the operation picture plane of the invention.

A shelf number list to display the information of the cassette in which the inspection-subject wafer is mounted is displayed in the cassette display region 111 on the left side of the picture plane of FIG. 28 and the relevant shelf number is selected from the shelf number list. Although not shown, the selected shelf number is displayed in a manner different from that of the others in order to show that the conditions are being inputted.

For example, characters of "under condition input" are displayed or the selected shelf number can be displayed in a color different from the background color of the other shelf numbers.

Moreover, the inspecting condition setting region 135 to input the kind and steps of the wafer, operator's name, and the like selected from the shelf number list is displayed on the right side of the picture plane and the inspecting conditions can be inputted.

If there is the inspecting condition information which has already been inputted with respect to the selected shelf number, by selecting this shelf number, the contents of this shelf are automatically displayed.

In this manner, the location of the inspection-subject wafer is clarified, the conditions for inspection can be easily inputted, and the preparation until the start of the inspection can be performed in a short time.

Figure 29:
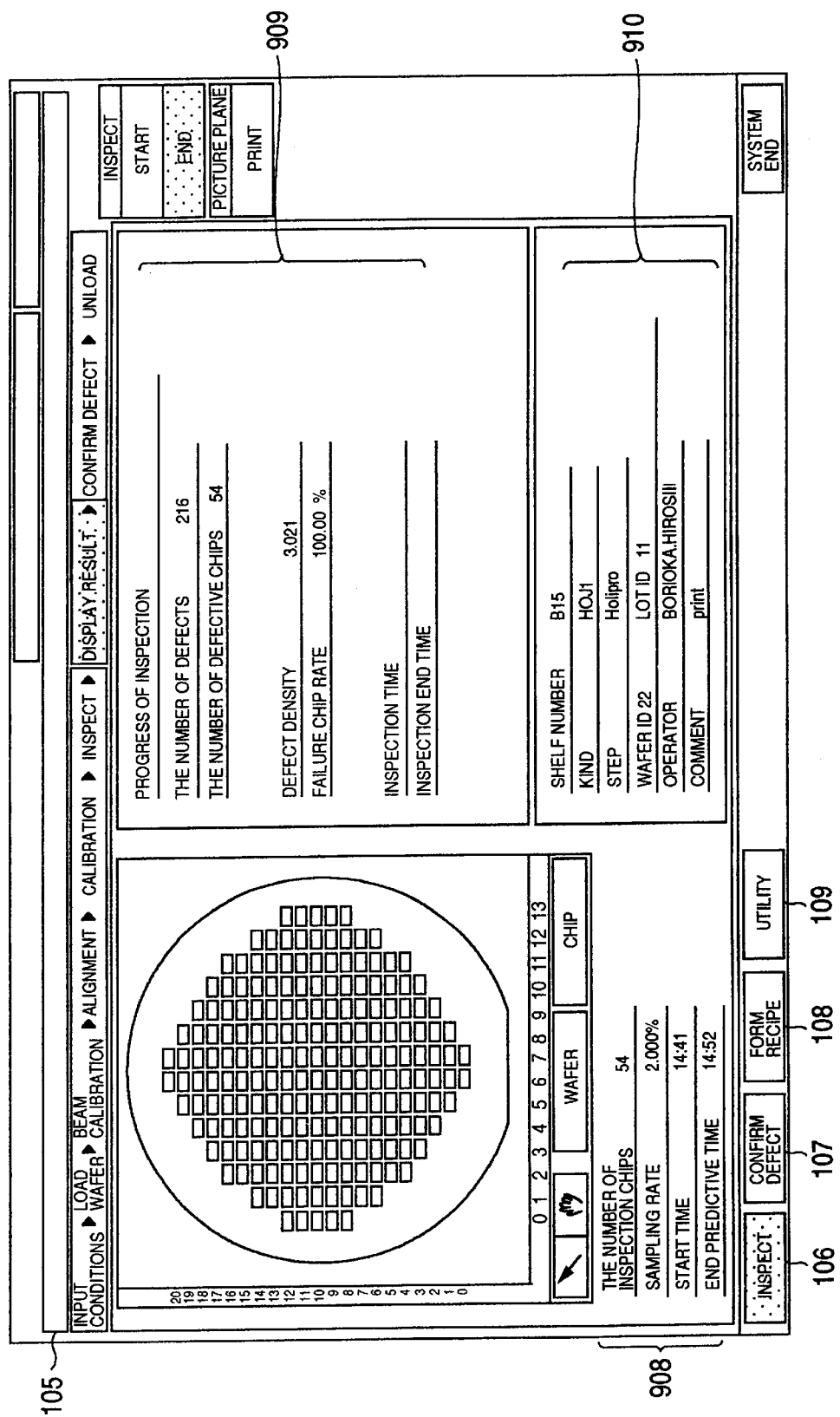
FIG. 29 is a diagram showing a picture plane in an inspecting mode.

FIG. 29 is a diagram of the picture plane in the inspecting mode. In the diagram, set information before the inspection, a start time from the wafer loading, and an end time on the calculation are displayed in an inspection progressing situation display region 908. The number and density of defects extracted as a result of the inspection are displayed in an inspection progress display region 909. When the inspection is finished, an inspection time and an end time are displayed in the region 909. A recipe display region 910 to display the contents of the recipe inputted at the time of the recipe formation is arranged under the region 909.

The number of cassettes to be inspected and the name of the cassette which is at present being inspected are displayed in the message region 105. A degree showing a current progressing situation of the inspection is displayed by a percentage (%) and an icon.

Since the inspection progressing situation displayed in the message region 105 and the inspection information in the inspection progress display region 909 are displayed on the same picture plane as mentioned above, whether the inspection should be finished on the halfway without inspecting all of the inserted cassettes can be discriminated in accordance with a situation of the inspection result. In the case where it is unnecessary to wait until the end of the inspection, the inspection time can be saved.

In the flowchart shown in FIG. 27, when the input of the inspecting conditions, information of the wafer, and the like (step 703) is completed, the wafer passes through a spare chamber for conveyance and is loaded into an inspection chamber which was vacuum evacuated (step 705). Upon completion of the loading, a retarding voltage is applied to the sample stage and the sample. The applying voltage is set in accordance with the parameters determined when the irradiating energy to the wafer is set in the formation of the recipe.

The stage is automatically moved so that the position of an electron beam calibrating pattern adhered on the sample stage reaches just below the electron beam irradiation optical system (step 706). The electron beam is irradiated to the pattern for calibration.

If the electron beam is continuously irradiated to the wafer or the calibrating pattern, a charging state of the wafer surface changes, so that when a signal is detected as an image, the contrast is fluctuated due to an influence of the charging and a contamination is deposited. To suppress it, for a period of time other than the case of obtaining or inspecting the SEM image, the electron beam is irradiated onto a blanking plate arranged on the way of the electronic optical system by a blanking electrode and is not irradiated to the wafer. The image of the calibrating pattern is obtained, a magnification, a distortion, and the like of the image are calculated, and correcting conditions of the electron beam are obtained.

The stage is subsequently moved to another pattern for calibration and a focal point and an astigmatic point are adjusted by an encoder or the like on an operation panel while looking at the image of the calibrating pattern (step 707). When the adjustment is finished, the processing routine advances to the next step. An alignment is now performed to correct the direction of the pattern on the wafer set on the sample stage and the scanning direction and rotational deviation of the electron beam (step 708).

As already described in the items of the recipe formation, the optical microscope image and SEM image at the position which has previously been designated as an alignment target are registered in the storing device. The image name and the coordinates of the designated alignment target have been registered in the step file.

When the alignment (step 708) is finished, the processing routine advances to a calibrating step (step 709) of automatically adjusting the signal amount of the wafer. The position where the calibration is executed and the set value of the proper brightness have previously been registered in the step file in the recipe formation. In the calibration, the SEM image of the registered coordinates is automatically obtained, a brightness histogram is obtained from the image data, and a gain value and the like of the brightness are adjusted so as to be equal to those of a preset histogram. Thus, even if the signal level from the wafer fluctuates or the sensitivity of the apparatus slightly fluctuates, the brightness is always adjusted to substantially the same brightness every inspection, so that the substantial sensitivity conditions are equalized.

When the calibration (step 709) is completed, the inspection (step 710) is started. The inspection region on the wafer, the region where the repetitive pattern exists, and data such as a repetitive pitch in the repetitive pattern, namely, a comparing unit and the like have previously been registered in the kind file. The movement of the stage and the scan of the electron beam are executed by commands from the control portion on the basis of the data.

In the flowchart of FIG. 27, whether the image at the defect position is obtained again and visually confirmed after the end of the inspection or not can be designated (step 716).

Figure 30:
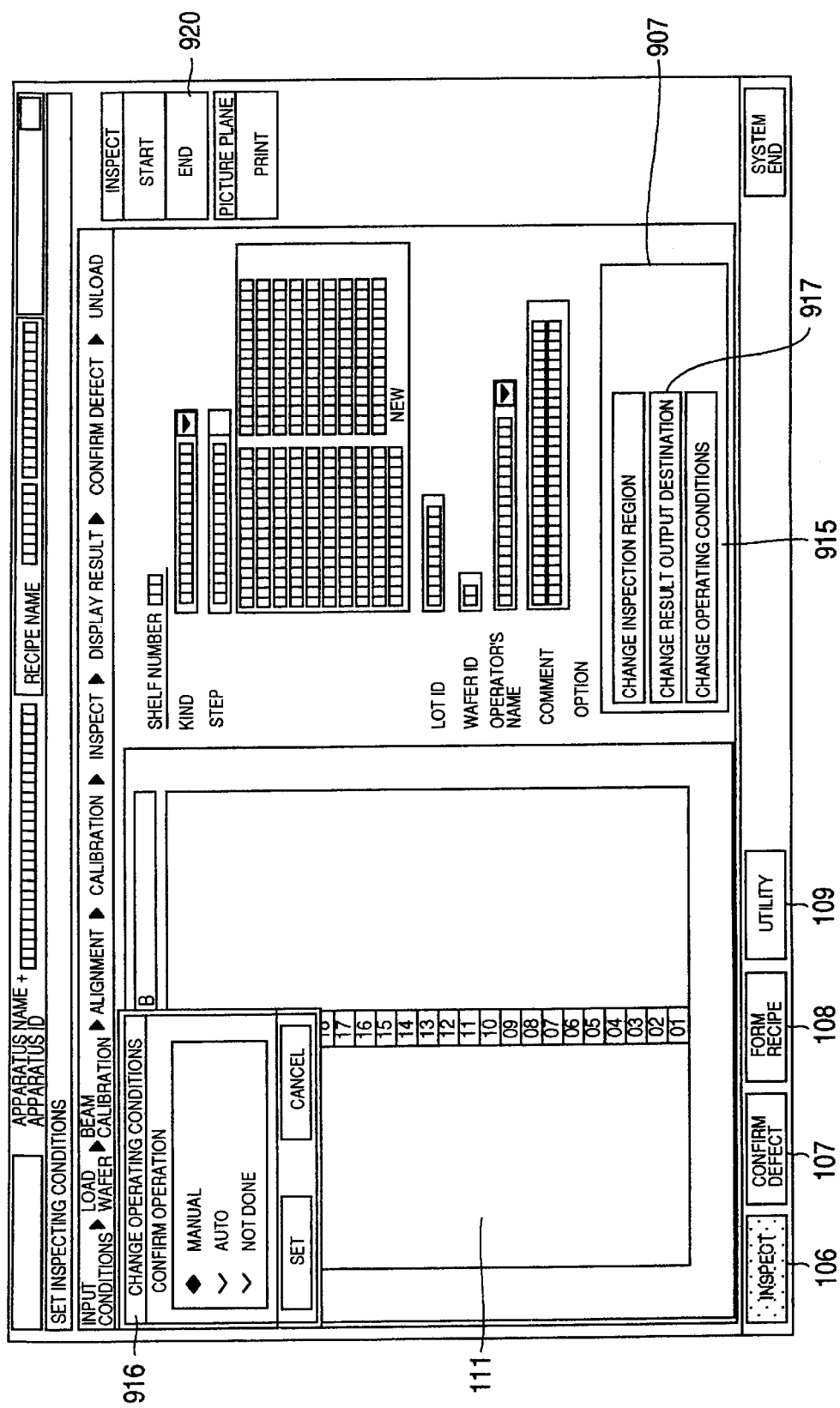
FIG. 30 is a diagram showing a picture plane in an inspecting mode.

FIG. 30 is a diagram of a picture plane in the inspecting mode and shows a picture plane to select whether the visual confirmation is performed or not. As shown in FIG. 30, an option display region 907 is provided, thereby enabling the inspection region, an output destination of the result, and the operating conditions to be changed. A "change operating conditions" setting region 916 is displayed by clicking a "change operating conditions" button 915 in the option display region 907.

The "manual" mode in the "change operating conditions" setting region 916 is a mode to manually confirm the defect after the end of the inspection. When the inspection is finished, the apparatus enters a waiting state of an instruction from the operator and its message is displayed. An "automatic" mode is a mode in which the apparatus automatically confirms the defect after the end of the inspection. The image of the defect portion which was automatically selected is automatically obtained. A "not-done" mode is a mode in which the defect confirmation is not performed after the end of the inspection. The "not-done" mode is designated in the case where the inspection result is stored and the defect confirmation is manually performed later or the like.

When the "automatic" mode is set, the stage is moved to the coordinates of the first one of the detected defects on the basis of the designation of this mode after the end of the inspection. After the stop, the electron beam is scanned to coordinates (X, Y) in a state where the stage stops, an image is obtained, and the image is displayed on the picture plane. This is because in the automatic inspection, although the coordinates and size of the detected defect are stored, since the image data of the defect portion is not stored, the operation to obtain the image again is necessary to obtain the image. In the embodiment, the operator classifies the contents on the basis of the displayed image of the defect and various information of the defect and inputs a classification code, so that the data can be outputted or stored into the outside in a state where the information of the defect classification has been added in the defect data file.

As shown in the flowchart of FIG. 27, when the data of the map of the detected defects, the coordinates of the defects, and the like is printed or outputted by means such as an external communication or the like (step 712), the output contents and output destination can be previously designated at the start of the inspection.

Figure 31:
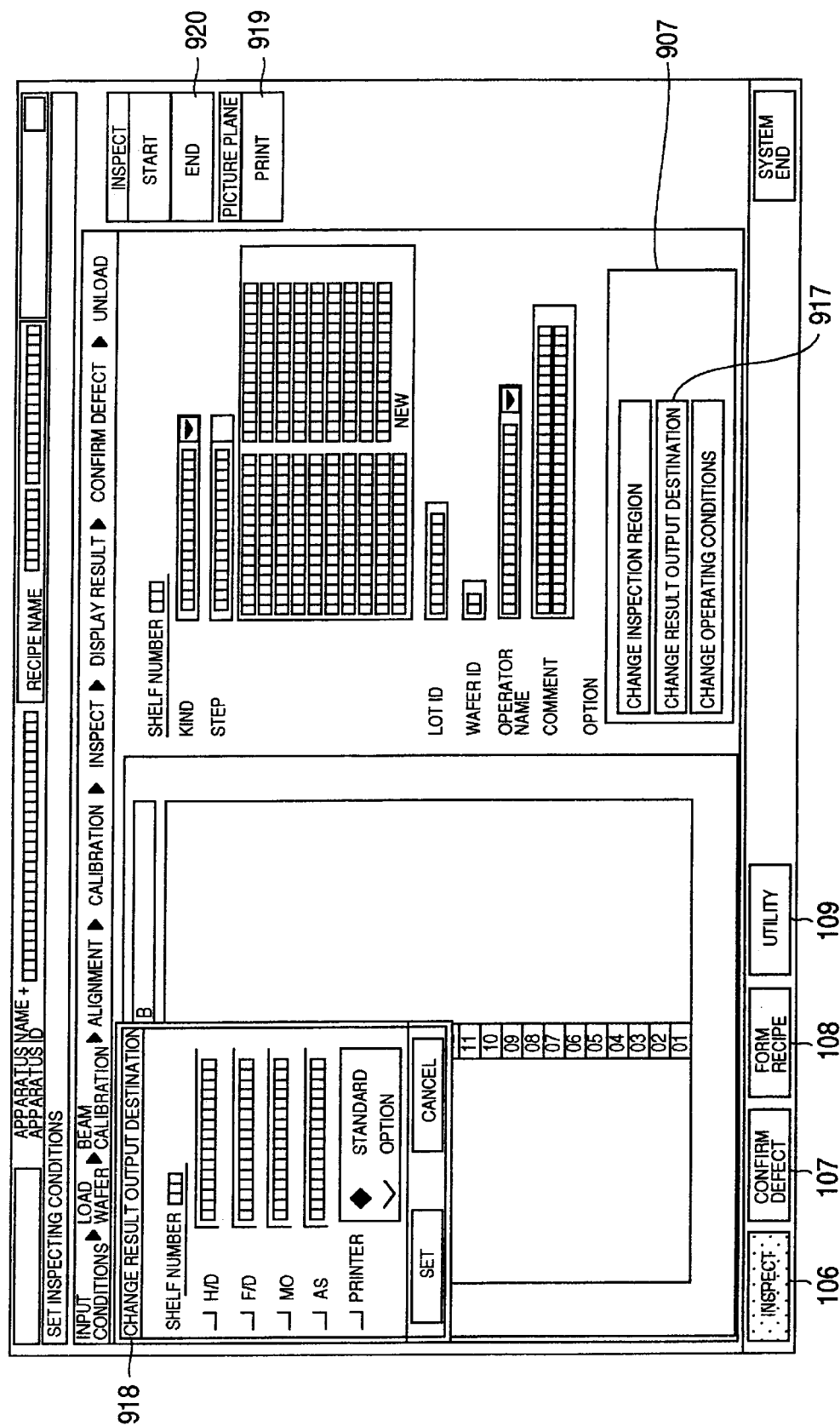
FIG. 31 is a diagram showing a picture plane in an inspecting mode.

FIG. 31 is a diagram of a picture plane in the inspecting mode and shows a picture plane to designate the output destination. When a "change result output destination" button 917 in the option display region 907 shown in FIG. 31 is clicked, a "change result output destination" setting region 918 is displayed. An output destination of the result can be designated in this region. As an output destination, there is an electronic medium such as magnetic disk, optical disk, or the like, printing to a paper or the like, or a communication to the outside. Any of them or a plurality of destinations among them can be designated. The printing or communication is instructed by clicking a "print" button 919 shown in the diagram.

The embodiment of the invention has a function for converting the contents or a format of the data to be outputted into a desired format in any output. Therefore, the data can be outputted to an upper data collecting system. Similarly, data can be received in a desired format from an upper system. Thus, the data of the defect inspected by the inspection apparatus of the embodiment can be collated with a result or the like inspected by the other inspection apparatus or a part of the inspecting conditions can be downloaded. For example, the data of the shot and chip matrix on the wafer described in the paragraphs of the recipe formation mentioned above can be downloaded from a kind file of the other inspection apparatus which has already been set.

The sixth embodiment of the invention will now be described.

Figure 32:
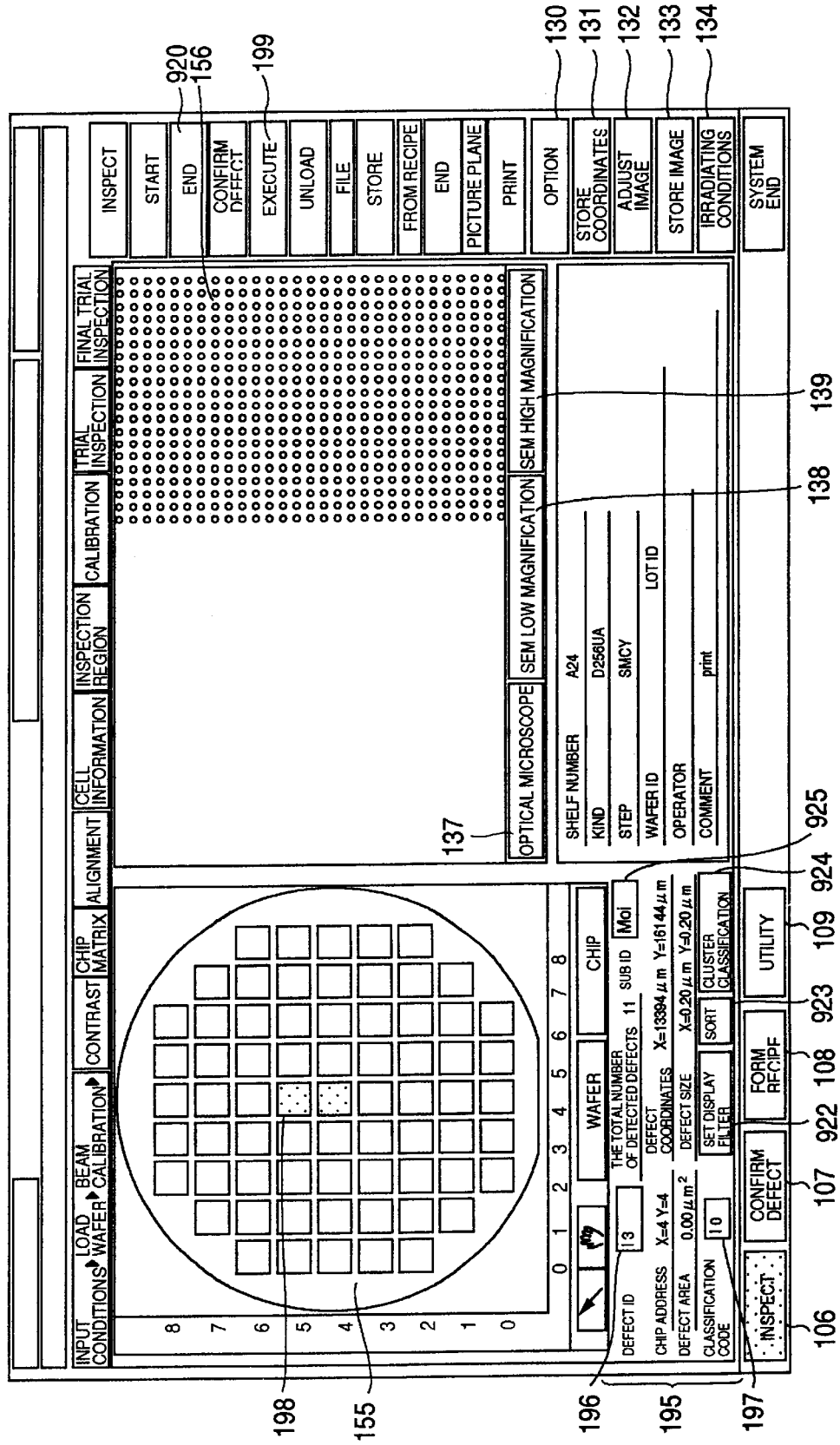
FIG. 32 is a diagram showing a picture plane in a defect confirming mode.

FIG. 32 is a diagram showing a picture plane in the defect confirming mode.

If the automatic confirmation of the defect was set in the "change operating conditions" setting region 916 shown in FIG. 30, the picture plane in the defect confirming mode is automatically displayed after the display of the result. In the defect confirming mode picture plane, the defect information as much as the maximum number of defects is taken out from the defect data and displayed while sequentially displaying the image of the relevant defect. The obtained image and information are outputted to the file as data for upper system.

In FIG. 32, the "confirm defect" button 107 is displayed in a color different from that of the other buttons. The defect information display region 195 is arranged under the wafer map 155. A "defect ID" display region 196 to display the defect ID and a "classification code" display region 197 to display the classification code of the defect are provided. In the diagram, by clicking the mark of the defect displayed in a different color on the wafer map 155 by the mouse or by inputting the defect ID into the "defect ID" display region 196, the SEM high magnification image of the relevant portion is displayed in the image display portion 156 on the right side. The information of the relevant defect is displayed in the defect information display region 195 under the wafer map 155.

As for the defect confirming picture plane, either the image photographed by the optical microscope or the SEM image can be selectively displayed. In case of the optical microscope, the "optical microscope" button 137 is clicked. In case of the low magnification of the SEM image, the "SEM low magnification" button 138 is clicked. In case of the high magnification of the SEM image, the "SEM high magnification" button 139 is clicked.

Consequently, since the defect image is simultaneously displayed on the side adjacent to the information of the defect region of the wafer which is being inspected, causes of the generation of the defect can be easily predicted.

The display of the wafer map 155 is interlocked with the "defect ID" display region 196 and the ID of the defect designated on the wafer map 155 is automatically displayed in the "defect ID" display region 196. Contrarily, if the defect ID is inputted in the "defect ID" display region 196, the relevant position on the wafer map 155 is displayed in a marking state.

An arbitrary ID can be allocated separately from the defect ID which is automatically allocated to the extracted defect. The arbitrary ID is inputted in a "sub ID" display region 925.

If the classification code of the relevant defect is known, it is inputted into the "classification code" display region.

By clicking a "set display filter" button 922, the display screen is switched to the defective filter instructing region 188 shown in FIG. 26 and a limitation can be added to the display of the defect. For example, a range of the coordinates in the chip can be designated or limited by the classification code. When a "sort" button 923 is clicked, for example, the defects can be rearranged in order of the size or area from the large value and sub IDs can be allocated in accordance with the same order as the arranging order. When a "cluster classification" button 924 is clicked, the defects can be classified by cluster and a result of the classification can be displayed and stored.

In a manner similar to the case of FIG. 26, by clicking the "adjust image" button 132 or "irradiating conditions" button 134 in the option region 130, the SEM image can be adjusted and the defect can be observed.

Figure 33:
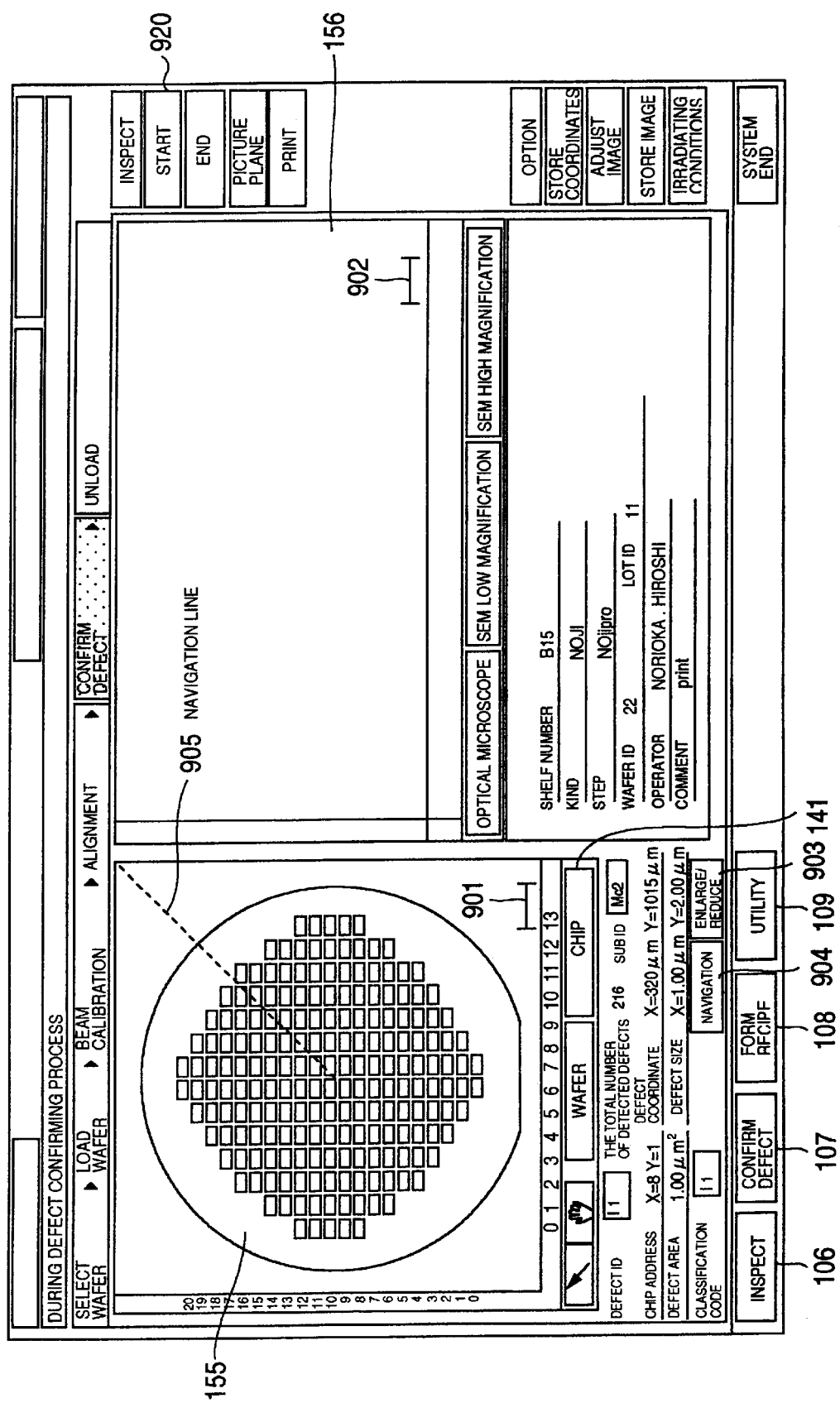
FIG. 33 is a diagram showing a picture plane in a defect confirming mode.

FIG. 33 is likewise a diagram showing a picture plane for defect confirmation. By clicking an "execute" button 199 for defect confirmation shown at the right edge in FIG. 32, the picture plane shown in FIG. 33 is displayed and the defect confirming process after the inspection is performed. By this picture plane, the defect position displayed at present can be further emphasized or the data of the defects on the wafer map 155 can be successively seen without waiting for the display of the SEM image which is displayed in the image display portion 156 on the right side, and the defect information can be rapidly obtained.

Scales 901 and 902 are displayed on the display picture plane of the wafer map 155 and the display picture plane of the image display portion 156 in which the SEM image is displayed, thereby enabling the size of defect to be certainly grasped without a mistake even if the image is enlarged.

An enlarging function of the wafer map 155 and a navigating function of the displayed defect are shown. In FIG. 33, the chip or an area in the chip can be arbitrarily enlarged by clicking an "enlarge/reduce" button 903. Thus, the defect position which is displayed on the wafer map 155 can be displayed without an overlap.

Upon designation of the chip or defect at this time, a front edge of a navigation line 905 is positioned at the defect position by clicking a "navigation" button 904. Since the color of the defect position is changed, the defect position displayed at present is further emphasized, thereby enabling it to be easily recognized. By the enlarging/reducing function, the operator can successively see the defect information on the wafer map 155 and promptly confirm the defect information without waiting for the display of the SEM image which is displayed in the image display portion 156 on the right side.

When a chip display is set by clicking the "chip" button 141, the number of chips having defects is displayed.

In the flowchart of FIG. 27, after completion of the confirmation of the defect (step 711) and the output of the defect (step 712), the wafer is automatically unloaded (step 713) by pressing an "end" button 920 shown in FIG. 32 or 33. The inspection is finished.

By clicking the "cluster classification" button 924, the defects are cluster classified and a result of the classification is displayed. With respect to the displayed defect, the classification is performed on the basis of a defect discrimination for comparing the values of the position (X coordinate, Y coordinate), size, brightness, shape, and the other defect characteristics with the values of the preset attributes. Although the details of the above discrimination and confirmation are omitted, they can be automatically or manually performed. If the defects can be classified in accordance with the predetermined classification as mentioned above, in other words, when the classification is matched with the predetermined classification, the SEM image is automatically obtained and displayed again. Subsequently, the inspection result is outputted. When it is not matched with the classification or in case of manually obtaining and displaying again the SEM image as mentioned above, the inspection result is outputted at this stage. When the output of the inspection result is finished, the wafer is unloaded in the next step.

By this function, a specific defect can be extracted. The SEM image obtained upon inspection has been stored in the file. The defect can be confirmed again by displaying the filed SEM image again due to the judgment of the operator.

Figure 34:
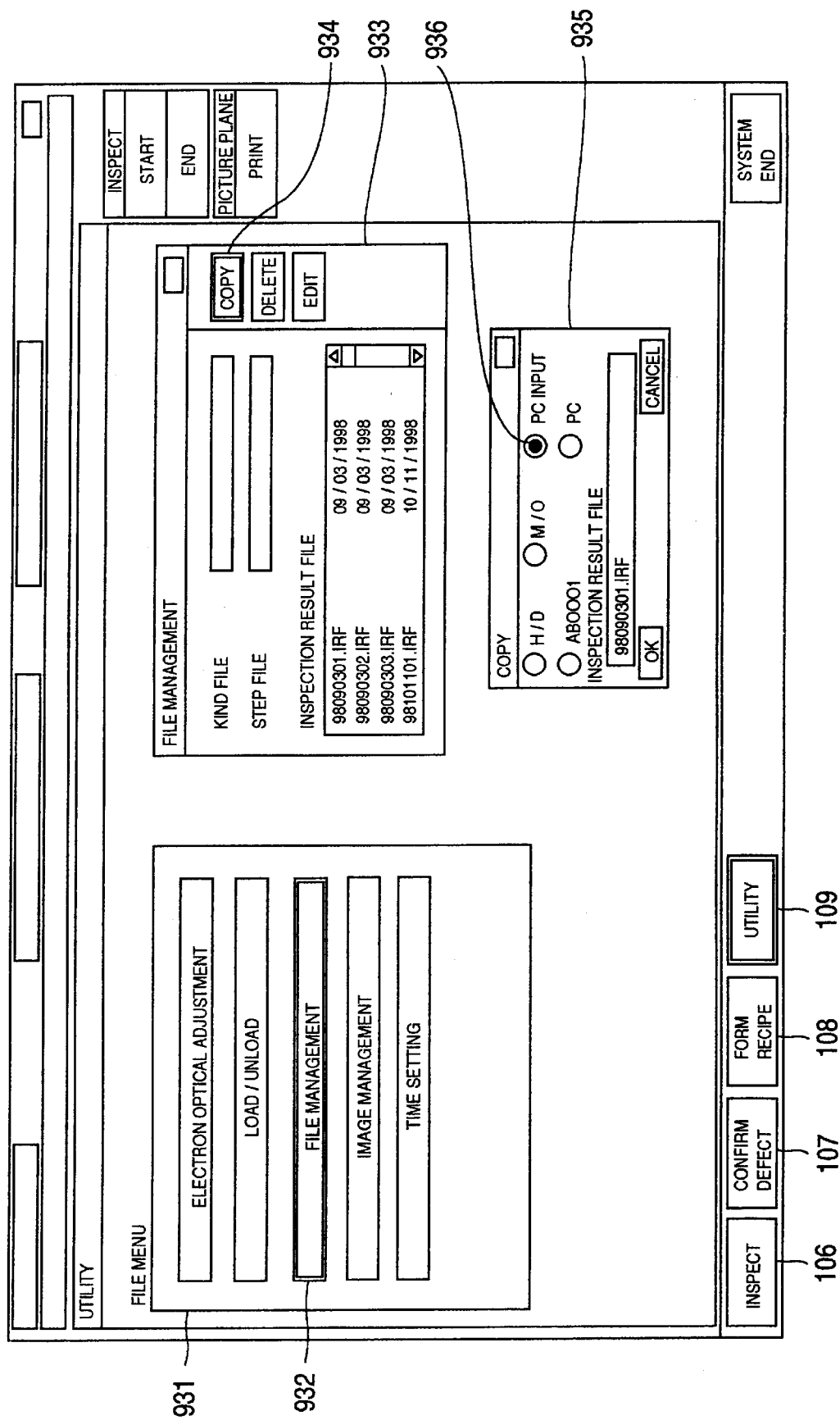
FIG. 34 is a diagram showing a picture plane in a utility mode.

The seventh embodiment of the invention will now be described. FIG. 34 is a diagram of a picture plane in the utility mode. The picture plane shown in FIG. 34 is displayed by clicking the "utility" button 109 in FIG. 33.

A file menu of the electronic optical adjustment, loading/unloading, file management, image management, time setting, and the like is prepared as a function of the utility in a file menu display region 931. For example, a file management display region 933 is displayed by clicking a "file management" button 932. Besides the display of the kind file and step file, a name is allocated to an image file of the stored inspection result and the named image file is displayed in the file management display region 933. When the image showing the inspection result is clicked and a "copy" button 934 is clicked, a copy display region 935 is displayed. In the copy display region 935, a sending destination of the designated image file can be designated. When a "PC input" mark 936 is designated, an image file from an external PC can be downloaded.

As mentioned above, in the embodiment according to the invention, since the items to decide the inspecting conditions are displayed in the picture plane layers displayed in parallel, the efficiency of the grasping of the whole flow and the progressing situation and the efficiency of the inputting procedure can be raised.

Since the display and progressing situation of the inspecting flow are visualized in the picture plane upon inspection, the present situation can be grasped in more detail and the operability in the inspecting operation and the recipe forming operation is remarkably improved.

The chip inspection, wafer extracting frequency inspection, and defect inspection can be promptly performed while looking at the picture plane. The defects in the whole product and the defects in a specific region can be promptly detected. The fluctuation in processing conditions is certainly detected and fed back to the processes and can be fed back to the adjustment of changing process steps or the adjustment of the payment budget.

The inspection defects in a fine pattern forming step after the resist development, a fine pattern forming step after the etching, and a hole pattern forming step after the cleaning can be promptly detected by displaying the picture plane.

By applying the inspection apparatus according to the invention to a manufacturing process of a semiconductor device, a rapid defect detection of high precision which cannot be performed in the conventional technique can be realized. That is, since an abnormality of the product, conditions, or the like can be found out early at high precision by referring to the picture plane formed by picture plane forming and displaying means such as a monitor, an abnormality countermeasure process can be performed early to the substrate manufacturing process. Thus, a fraction defective of the semiconductor device or the other substrate is reduced, the generation of a large quantity of failure can be prevented, and the productivity can be raised.

Further, since the generation of the failure itself can be reduced, the reliability of the product such as a semiconductor device or the like can be raised. A developing efficiency of a new product or the like is also improved and the manufacturing costs can be reduced.

The eighth embodiment of the invention will now be described. An example of a system for collecting inspection data detected by the inspection apparatus of the invention and analyzing them will now be described hereinbelow.

Figure 35:
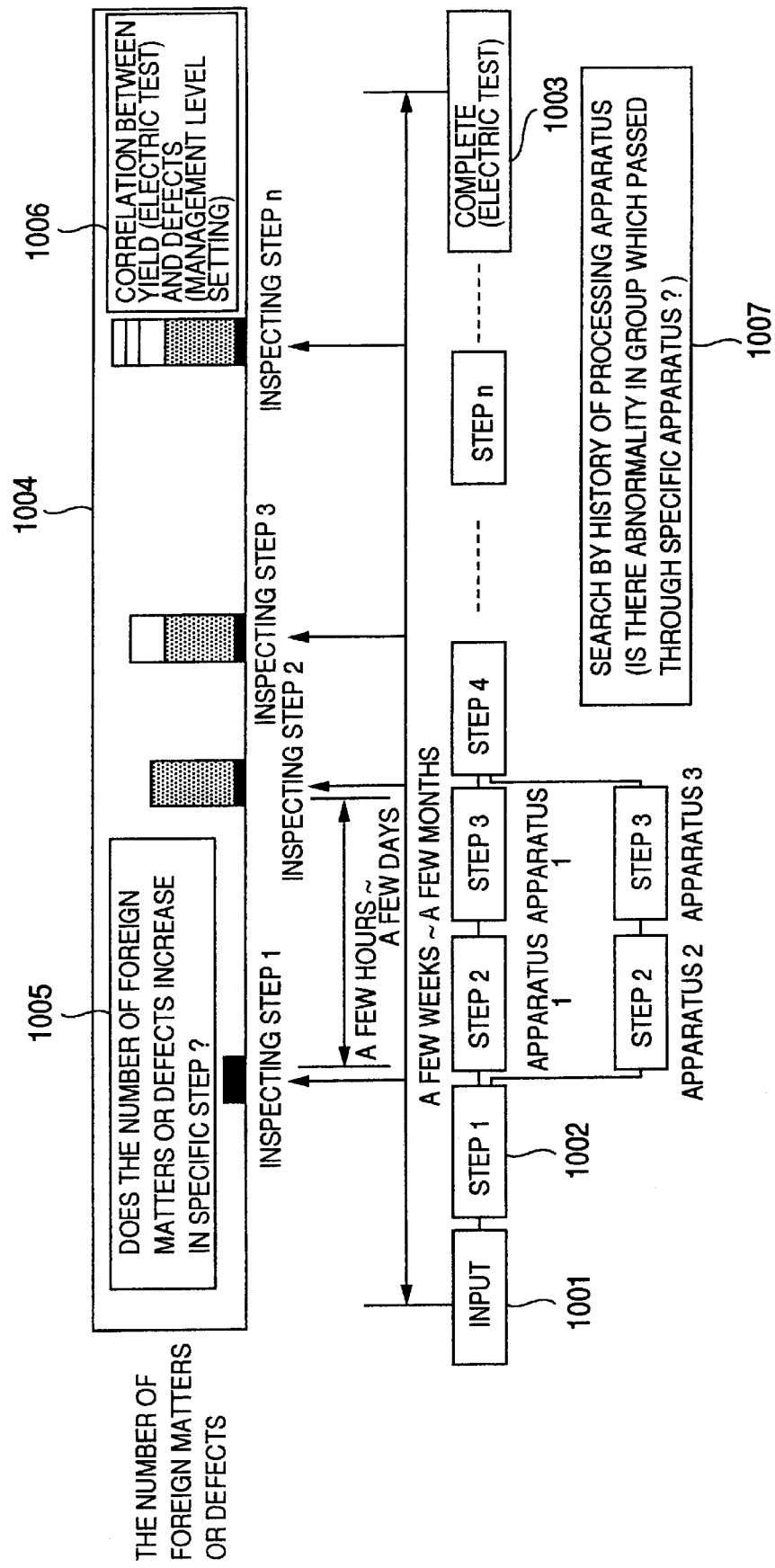
FIG. 35 is a step diagram of an inspection system.

FIG. 35 is a step diagram of an inspection system. The steps in case of forming a semiconductor circuit pattern, an inspecting step in association with it, and an object of the inspection are shown. In the diagram, to form a semiconductor pattern, the following steps are presumed: namely, "input" 1001; "step 1" 1002; "step 2"; . . . ; "step n"; . . . , and "complete (electric test)" 1003. In this case, in "step 2" or "step 3", it is presumed that a specific "device 2" or "device 3" is used in addition to a "device 1". An "inspect" 1004 is executed for those steps. In the "inspect" 1004, an "inspecting step 1", an "inspecting step 2", an "inspecting step 3", . . . , and an "inspecting step n" are presumed for each step. By those inspections, with respect to the number of foreign matters or defects, a "discrimination about whether the number of foreign matters or defects is not increased in the specific step or not" 1005 is executed, an "arithmetic operation of a correlation (setting of a managing level) between a yield (electric test) and the defects" 1006 to arithmetically operate a correlation between a yield ratio which is obtained by an electric conductivity test as a final step and an increase ratio of the number of foreign matters or defects is executed, and a "search (whether there is an abnormality in a group which passed through a specific device or not) by the history of the processing apparatus" 1007 for classifying the foreign matters or defects on the basis of a result of the arithmetic operation and a history of each processing apparatus in each manufacturing step and specifying a processing apparatus corresponding to the cause is executed.

Figure 36:
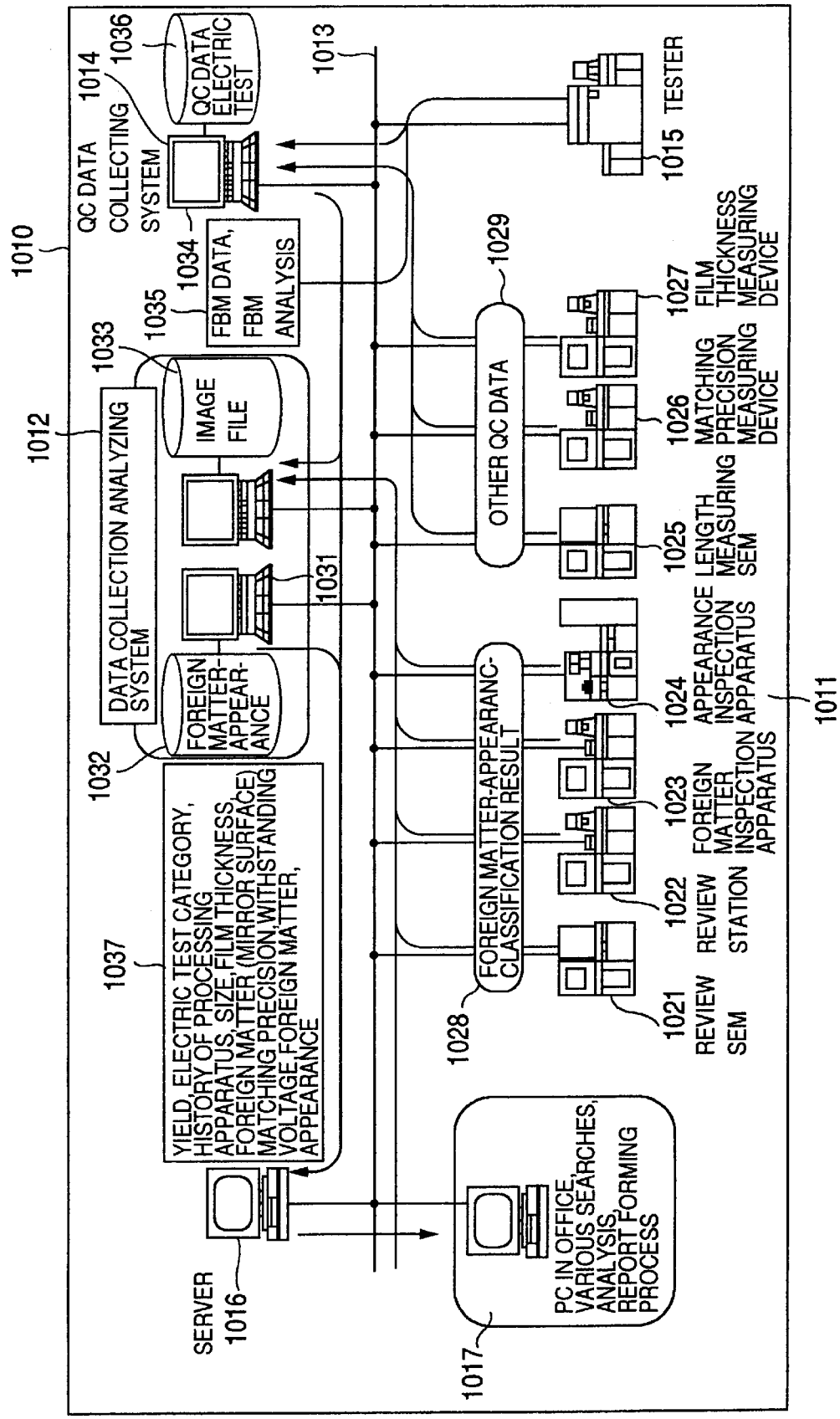
FIG. 36 is a constructional diagram of the inspection system.

FIG. 36 is a constructional diagram of an inspection system comprising various measuring devices, a data collection analyzing system, and a data transmitting and storing apparatus. A whole system 1010 surrounded by a frame is fundamentally constructed by: a measuring device group 1011; a data collection analyzing system 1012; a bus 1013 as a communication line; a QC data collecting system 1014; a tester 1015 for electrically inspecting the semiconductor device; a server 1016; and a personal computer (PC) 1017 in an office.

For example, the measuring device group 1011 comprises: a review SEM 1021; a review station 1022; a foreign matter inspection apparatus 1023; an appearance inspection apparatus 1024; a length measuring SEM 1025; a matching precision measuring device 1026; a film thickness measuring device 1027; and the like.

A foreign matter—appearance—classification result 1028 is outputted from the review SEM 1021, review station 1022, foreign matter inspection apparatus 1023, and appearance inspection apparatus 1024 and inputted to the data collection analyzing system 1012 through the bus 1013. Other QC data 1029 is outputted from the length measuring SEM 1025, matching precision measuring device 1026, and film thickness measuring device 1027 and inputted to the QC data collecting system 1014 through the bus 1013 together with a result of a test from the tester 1015.

The data collection analyzing system 1012 comprises: a computer 1031; a foreign matter—appearance storage file 1032 associated therefore; and an image file 1033. An output data of the data collection analyzing system 1012 is stored into the server 1016. The server 1016 stores the data for a predetermined period. The QC data collecting system 1014 comprises: a computer 1034; an FBM data FBM analysis file 1035; and a QC data electric test file 1036 regarding an electric test.

The server 1016 stores data 1037 of "yield, electric test category, history of processing apparatus, size, film thickness, foreign matter (mirror surface), matching precision, withstanding voltage, foreign matter—appearance". The personal computer 1017 in an office fetches the data from the server 1016 and uses it for various searches, analysis, and report forming process.

FIG. 37 is a constructional diagram of an inspection system showing the details of a part of FIG. 36. When there is no inspection apparatus in the manufacturing steps of a semiconductor device, electrical characteristics are inspected by the tester 1015 at a point when the semiconductor device is completed. When there is an abnormality, causes of the abnormality are examined by devices for high-resolution SEM, AES analysis, and TEM observation of a system 1041. Since the abnormality is found for the first time at a point when the semiconductor device is completed and, thereafter, causes of the abnormality are examined, it takes a long period of time of one to two months until the causes are investigated and its countermeasure is taken. On the other hand, since a proper inspection is performed between the respective steps and an abnormality is found out early every step and its countermeasure is taken, there is a large effect in improvement of a manufacturing yield of the semiconductor device.

As a foreign matter—appearance inspection result 1028a, the measuring conditions, the number of foreign matters, the number of defects, size, coordinates, and the like are inputted to the data collection analyzing system 1012. The yield and FBM coordinates are inputted from the QC data collecting system 1014 to the data collection analyzing system 1012.

For example, the positions of the foreign matters or defects, namely, coordinates as foreign matter—appearance—classification result 1028 detected by the appearance inspection apparatus 1024 shown in FIG. 36 are very useful in case of searching the foreign matter or defect by the review SEM 1021 shown in FIG. 37 or in case of working an FIB cross section in order to observe by an SIM/SEM observing apparatus 1038. If there are common coordinates between both apparatuses or there is a compatibility of the coordinates, the position of the foreign matter or defect can be easily searched. If a marking indicative of the position of the foreign matter or defect is written by the appearance inspection apparatus 1024 to a near location or the like where the position of the foreign matter or defect can be easily found, it is also useful to search the position in case of searching in reviewing the defect by the review SEM 1021 or working a cross section by an FIB.

When it is determined that the cutting-out of the observing portion and analyzing portion is necessary as a result of using the review SEM 1021, results in the high resolution SEM, AES analysis, and TEM observation of the system 1041 are inputted into the data collection analyzing system 1012 as "image—classification result—analysis result" together with the coordinates of the foreign matter or defect. The collected and analyzed data is fed back and used for the foregoing discrimination regarding the necessity of the cutting-out of the observing portion and analyzing portion.

Figure 1:
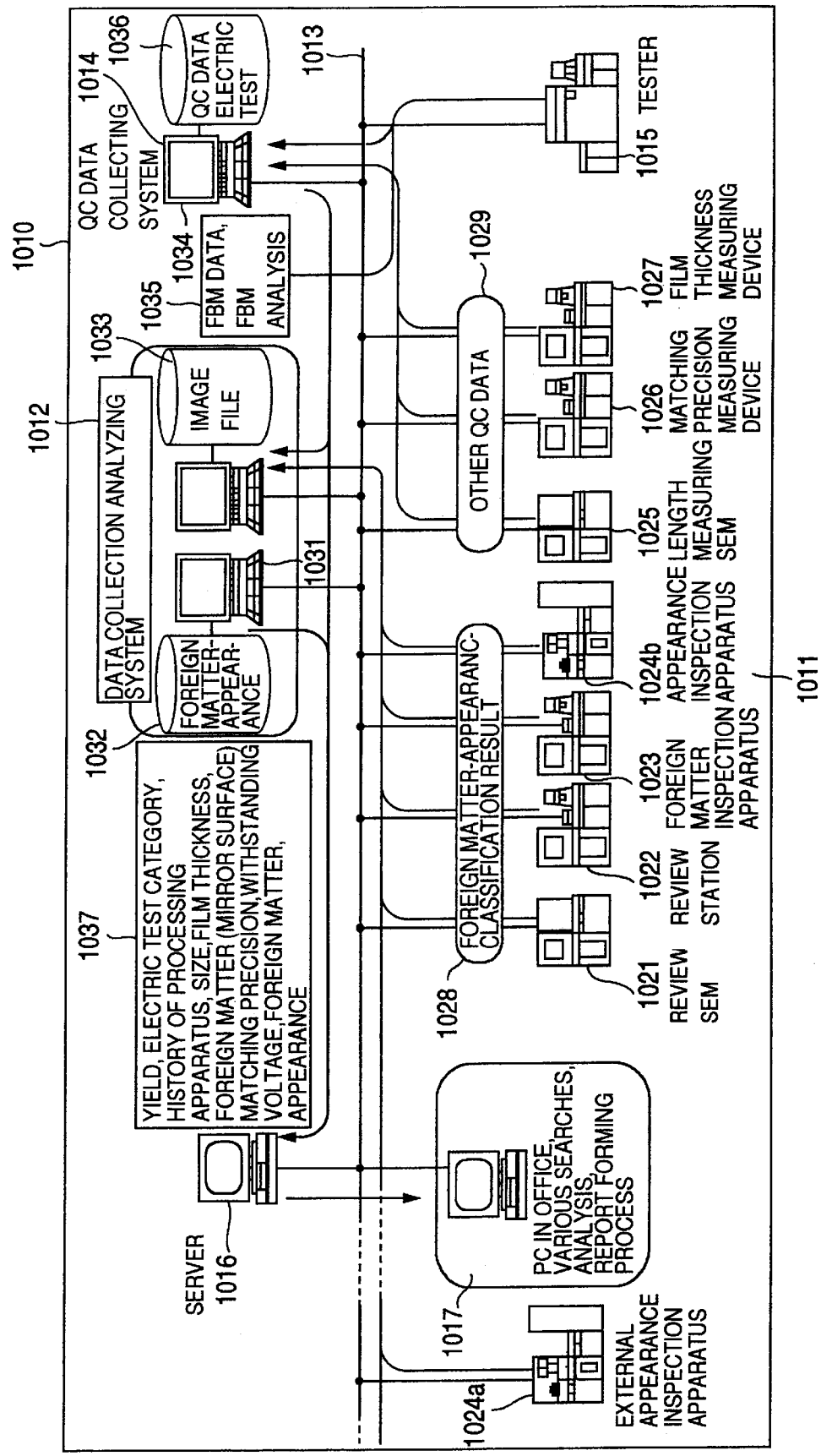
FIG. 1 is a constructional diagram of an inspection system.

FIG. 1 is a constructional diagram of an inspection system similar to FIG. 36. The appearance inspection apparatus 1024 is divided into an external apparatus 1024a such as an optical inspection apparatus and an SEM type inspection apparatus 1024b which is used in the invention. With this construction, information from the external inspection apparatus 1024a and information from the upper system can be inputted to the SEM type inspection apparatus 1024b and both the obtained external information and a result of the SEM type inspection apparatus 1024b can be compared on the picture plane. Thus, defect information which could not be discriminated by only the external apparatus 1024a such as an optical inspection apparatus or defect information which could not be discriminated by only the SEM type inspection apparatus 1024b is displayed on the picture plane or the defect information obtained from both of the apparatuses is overlappingly displayed on the picture plane, and the inspection of a circuit pattern of higher precision can be expected. In such a case, if the system is constructed so that the defect information obtained by which one of the apparatuses can be easily visually recognized by displaying both defect information in different colors or different manners, they can be further easily discriminated.

In this example as well, if the system is constructed in a manner such that the coordinates of the external apparatus 1024a such as an optical inspection apparatus or the SEM type inspection apparatus 1024b which is used in the invention and the coordinates of the review SEM 1021 are made common or easy to be converted, the position of the defect such as foreign matter, pattern defect, or the like can be easily searched by the review SEM 1021. Or, by marking in a manner such that the position of the defect such as foreign matter, pattern defect, or the like can be known by the external apparatus 1024a such as an optical inspection apparatus or the SEM type inspection apparatus 1024b which is used in the invention, the position of the defect such as foreign matter, pattern defect, or the like can be easily searched by the review SEM 1021.

According to the embodiment mentioned above, by applying the inspection apparatus according to the invention to the manufacturing process of the semiconductor device, the defect which could not be detected by the conventional technique, namely, the abnormality in the product device, conditions, or the like can be found out early at high precision with reference to the picture plane formed by the picture plane forming and displaying means. Since it is possible to analyze in the upper system by using a proper device, a countermeasure process against the abnormality can be promptly performed for the manufacturing process of the semiconductor device. Thus, a fraction defective of the semiconductor device can be reduced and the productivity can be raised. Since the occurrence of an abnormality can be rapidly detected, the generation of many failures can be prevented. Further, since the generation of the failure itself can be consequently reduced, the reliability of the semiconductor device or the like can be raised. Therefore, a developing efficiency of a new product or the like is improved and the manufacturing costs can be reduced.

According to the inspection apparatus described so far, in the inspection apparatus in which the electron beam image is compared and inspected and a microdefect generated on the fine circuit pattern is detected, the inspection and the operation to decide the inspecting conditions can be efficiently performed. Thus, when the inspecting conditions of a number of semiconductor products in a number of processing steps are set, the inspecting conditions can be immediately set and registered in a short time without delaying the inspection. Therefore, the time which is required for the operator to inspect can be saved. The waiting time for the product which is required until the causes of the defect in the manufacturing process are investigated can be fairly reduced. The time which is required to detect the generation of a failure can be also remarkably reduced.

By applying the inspection apparatus according to the invention to the manufacturing process of the semiconductor device such as a semiconductor element or the like, not only a defect can be detected at a high sensitivity but also a setting efficiency in case of setting an inspection applying step and setting the inspecting conditions by using the wafer in such a step can be improved. Thus, the waiting time for the wafer in the inspecting step is eliminated and the generation of the serious abnormality can be detected early. A countermeasure process against the abnormality can be performed early in the failure generating step and the working conditions can be optimized so as not to generate the failures.

For example, in the circuit pattern inspecting step after the developing step, if a defect or breaking of a photoresist pattern is detected, a situation such that exposing conditions or focusing conditions of an exposing apparatus in the sensitizing step before the developing step are not optimum is presumed. Therefore, a countermeasure such as an adjustment of the focusing conditions or an exposure amount or the like can be rapidly taken.

Whether the detected defects have occurred in common among the shots or not is discriminated from the defect distribution, thereby enabling a defect of a photomask or reticle which is used for the pattern formation to be presumed. Thus, the inspection or exchange of the photomask or reticle can be rapidly executed.

As mentioned above, by applying the inspection method and inspection apparatus for the circuit pattern according to the invention to the manufacturing process of the substrate of the semiconductor device or the like and executing the inspecting step in the halfway of the manufacturing process, various defects can be detected. Causes of the abnormality in each manufacturing step can be rapidly presumed in accordance with the contents of the detected defect.

As an example of the application of the above inspection, the inspection can be applied by a method, which will be explained hereinbelow, in the wafer manufacturing line.

First, as for the inspection region, in the inspection of a memory product, since an area occupied by a memory cell in the wafer is relatively large, it is considered to selectively use only the memory cell in accordance with the step or purpose in a manner such that only the memory cell is set to the inspection region, the memory cell and its peripheral circuit are inspected or the whole chip is inspected. On the other hand, as for a logic product, since there is a product in which an occupied area of a memory portion in the chip is small or a product in which no memory portion exists, the whole chip is inspected in many cases. However, only a specific pattern region in the chip is inspected or, contrarily, a region excluding the specific pattern is inspected as necessary.

In a semiconductor product in which the memory portion and the logic portion are mixed, it is considered that an inspection of a high sensitivity is executed on a repetitive unit basis of the memory cell in the memory cell portion and a comparison inspection of the chips is executed in the other portions. Subsequently, as for the setting of the inspection-subject chip in the wafer, if the operator wants to grasp a distribution of the whole wafer and a detailed level of each chip, the whole wafer (100%) is set to the inspection region.

In the inspection of the whole wafer, however, since a time in a range from a few hours to tens of hours is required, a number of wafers cannot be inspected. In the grasping of the ordinary level, the processing fluctuation or the abnormality generation can be detected by inspecting the region of 10 to 50% of the whole region in the wafer. As methods of setting the region in the wafer, there are a method of selecting inspection-subject chips at random, a method of selecting a specific chip column or row arranged on the wafer, a method of changing a sampling rate at which the region in the chip is scanned, further, a method of combining the chip selection and the setting of the sampling rate, and the like.

For example, in case of a purpose of grasping the distribution of the whole wafer in the inspection, it is proper to set all chips to inspection-subject chips and change the sampling rate in order to set a desired inspection time. When the operator wants to finish the inspection within one to two hours, it is desirable to set the sampling rate to 25% or less. When the operator wants to specify a chip and grasp a defect level per chip, it is preferable to select a few chips and inspect them at a sampling rate of 100%. In this manner, various inspection regions can be set in accordance with the object of the inspection.

Further, with respect to at which degree of frequency the wafers of a plurality of products and steps which need the inspection are inspected, for example, since a method of optimizing the conditions while changing various processing conditions is considered in the development of the semiconductor products, it is desirable to perform the inspection each time the conditions are changed.

On the other hand, if the processing conditions have been almost determined, it is desirable to inspect about a few wafers per week among the wafers of the products and steps which need the inspection and inspect them when the processing conditions are changed.

Further, in the manufacturing line of the stable process, a fluctuation and a level of the manufacturing process can be grasped by executing the inspection of about "one wafer/week—product—step". However, a wafer extracting inspection other than the above methods can be executed in accordance with the object.

As mentioned above, in the manufacturing process of the semiconductor device, by executing the inspection method and apparatus for the circuit pattern according to the invention in an in-line manner, the fluctuation of various manufacturing conditions and the generation of the abnormality can be detected within the inspection real time, so that the generation of a large quantity of failures can be prevented. By applying the inspection method and apparatus for the circuit pattern according to the invention, the inspecting conditions of the inspection-subject wafer can be efficiently and accurately determined within a short time. Thus, since the inspection of higher precision can be applied, the generation of failure can be detected at a high sensitivity. Since the time that is required to decide the inspecting conditions can be remarkably reduced, the waiting time of the product and the occupying time of the operator can be reduced. Since the failure can be detected earlier than the conventional inspecting method and apparatus, the productivity of the semiconductor device can be raised.

In the circuit pattern inspection apparatus according to the invention, the inspection result can be collated or a correlation evaluation can be embodied as necessary, and data can be searched from each terminal (personal computer or the like). Further, when a defect is detected, information at the defect generating position is searched, various analyses are executed by a failure analyzing apparatus, and results of the analyses can be further stored.

The inspection apparatuses and analyzing apparatuses other than those mentioned in the embodiments can be connected to the data collection analyzing system and it is presumed that the inspection apparatuses mentioned in the embodiments are also connected.

With respect to the construction of the typical apparatus and inspection method for the circuit pattern of the invention, there have been described above the partial embodiments of: the method of irradiating the electron beam and obtaining the electron beam image at a high speed and comparing and inspecting; the flow of the specific inspection and the flow for deciding the operation and inspecting conditions of each portion; the operation picture plane and operating methods for the inspection and the setting of the inspecting conditions; the layers of the picture plane to set the inspecting conditions; the semiconductor device due to the execution of the inspection of the circuit pattern according to the invention; the method of improving the productivity of the other manufacturing process of the substrate having the circuit pattern; and the like. However, other inspection methods and apparatuses constructed by a combination of a plurality of features mentioned in Claims are possible within the scope of Claims of the invention.

According to the invention as described above, in case of inspecting the fine circuit pattern by using the image formed by irradiating the white light, laser beam, or charged particle beam, the inspection method, apparatus, and system for the circuit pattern, in which when various conditions necessary for inspection are set, its operating efficiency can be improved can be obtained.

The inspection method, apparatus, and system for the circuit pattern having the operation picture plane displaying method or operation picture plane layout to improve the operability upon setting of the inspecting conditions can be obtained.

The inspection method, apparatus, and system for the circuit pattern, in which the inspection time can be reduced and the manufacturing yield can be improved by the early investigation of the causes of failures of the semiconductor device can be obtained.

What is claimed is:

1. An inspection apparatus for a circuit pattern, comprising:

an irradiating apparatus which is constructed by a plurality of lenses and irradiates light, a laser beam, or a charged particle beam onto a surface of a substrate on which a circuit pattern has been formed;

a detector for detecting a signal which is generated from said substrate by said irradiation;

a memory for storing the signal detected by said detector and visualized as an image;

a comparing apparatus for comparing said stored signal with a signal obtained by visualizing a corresponding comparison pattern in another region as an image; and a monitor for displaying a defect on said circuit pattern from a result in said comparing apparatus, wherein said monitor displays in parallel a picture plane to set an inspection target region on said substrate where said light, laser beam, or charged particle beam is irradiated and a forming tool to set said inspection target region.

2. An inspection apparatus for a circuit pattern, comprising:

an irradiating apparatus which is constructed by a plurality of lenses and irradiates light, a laser beam, or a charged particle beam onto a surface of a substrate on which a circuit pattern has been formed;

a detector for detecting a signal which is generated from said substrate by said irradiation;

a memory for storing the signal detected by said detector and visualized as an image;

a comparing apparatus for comparing said stored signal with a signal obtained by visualizing a corresponding comparison pattern in another region as an image; and a monitor for displaying a defect on said circuit pattern from a result in said comparing apparatus, wherein said monitor displays a navigation line whose edge is located at a position of said defect and displays a detected image obtained by irradiating said light, laser beam, or charged particle beam to a region on said substrate where said defect exits.

* * * * *